(12) United States Patent  
Kato et al.

(10) Patent No.: US 8,222,712 B2  
(45) Date of Patent: Jul. 17, 2012

(54) SEMICONDUCTOR INTEGRATED CIRCUIT DEVICE AND A METHOD OF MANUFACTURING THE SAME

(75) Inventors: Kunihiko Kato, Tokyo (JP); Shigeya Toyokawa, Tokyo (JP); Kozo Watanabe, Tokyo (JP); Masatoshi Taya, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 321 days.

(21) Appl. No.: 12/399,957

(22) Filed: Mar. 8, 2009

(65) Prior Publication Data

US 2009/0243027 A1    Oct. 1, 2009

(30) Foreign Application Priority Data

Mar. 27, 2008    (JP) .................................. 2008-082432

(51) Int. Cl.  
*H01L 29/872*    (2006.01)

(52) U.S. Cl. ................. 257/471; 257/476; 257/E29.338; 257/E21.135; 438/510

(58) Field of Classification Search .................... 257/471  
See application file for complete search history.

(56) References Cited

U.S. PATENT DOCUMENTS

| 6,803,644 B2 | 10/2004 | Minami et al. |
| 2006/0125040 A1* | 6/2006 | Levin et al. ................... 257/471 |
| 2006/0244050 A1* | 11/2006 | Sudou ........................... 257/324 |

FOREIGN PATENT DOCUMENTS

| JP | 2001-210839 A | 8/2001 |
| JP | 2006-310555 A | 11/2006 |

* cited by examiner

*Primary Examiner* — Zandra Smith  
*Assistant Examiner* — Lawrence Tynes, Jr.  
(74) *Attorney, Agent, or Firm* — Miles & Stockbridge P.C.

(57) ABSTRACT

To achieve a further reduction in the size of a finished product by reducing the number of externally embedded parts, the embedding of a Schottky barrier diode which is relatively large in the amount of current in a semiconductor integrated circuit device has been pursued. In such a case, it is general practice to densely arrange a large number of contact electrodes in a matrix over a Schottky junction region. It has been widely performed to perform a sputter etching process with respect to the surface of a silicide layer at the bottom of each contact hole before a barrier metal layer is deposited. However, in a structure in which electrodes are thus arranged over a Schottky junction region, a reverse leakage current in a Schottky barrier diode is varied by variations in the amount of sputter etching. The present invention is a semiconductor integrated circuit device having a Schottky barrier diode in which contact electrodes are arranged over a guard ring in contact with a peripheral isolation region.

11 Claims, 83 Drawing Sheets

FIG. 87

| No. | PROCESS STEP | LOW-BREAKDOWN-VOLTAGE PORTION AND INTERMEDIATE-BREAKDOWN-VOLTAGE PORTION | HIGH-BREAKDOWN-VOLTAGE PORTION | DEVICE STRUCTURE 1 | DEVICE STRUCTURE 3 | DEVICE STRUCTURE 2 |
|---|---|---|---|---|---|---|
| 1 | a | FIG. 22 | FIG. 39 | FIG. 53 | THE SAME AS STRUCTURE 1 | THE SAME AS STRUCTURE 1 |
| 2 | b | FIG. 23 | FIG. 40 | FIG. 54 | THE SAME AS STRUCTURE 1 | THE SAME AS STRUCTURE 1 |
| 3 | c | FIG. 24 | FIG. 41 | FIG. 55 | | THE SAME AS STRUCTURE 3 |
| 4 | d | FIG. 25 | FIG. 42 | FIG. 56 | FIG. 66 | FIG. 77 |
| 5 | e | FIG. 26 | FIG. 43 | FIG. 57 | FIG. 67 | FIG. 78 |
| 6 | f | FIG. 27 | | FIG. 58 | FIG. 68 | FIG. 79 |
| 7 | g | FIG. 28 | | FIG. 59 | FIG. 69 | FIG. 80 |
| 8 | h | FIG. 29 | FIG. 44 | FIG. 60 | FIG. 70 | FIG. 81 |
| 9 | i | FIG. 30 | FIG. 45 | FIG. 61 | FIG. 71 | FIG. 82 |
| 10 | j | FIG. 31 | | | FIG. 72 | |
| 11 | k | FIG. 32 | FIG. 46 | FIG. 62 | FIG. 73 | FIG. 83 |
| 12 | l | FIG. 33 | FIG. 47 | FIG. 63 | FIG. 74 | FIG. 84 |
| 13 | m | FIG. 34 | FIG. 48 | FIG. 64 | FIG. 75 | FIG. 85 |
| 14 | o | FIG. 35 | FIG. 49 | FIG. 65 | FIG. 76 | FIG. 86 |
| 15 | p | FIG. 36 | FIG. 50 | THE SAME AS SHOWN LEFT | THE SAME AS SHOWN LEFT | THE SAME AS SHOWN LEFT |
| 16 | q | FIG. 37 | FIG. 51 | THE SAME AS SHOWN LEFT | THE SAME AS SHOWN LEFT | THE SAME AS SHOWN LEFT |
| 17 | r | FIG. 38 | FIG. 52 | THE SAME AS SHOWN LEFT | THE SAME AS SHOWN LEFT | THE SAME AS SHOWN LEFT |

(NOTE) EACH DIAGONALLY LINED SPACE SHOWS OCCURRENCE OF NO SUBSTANTIAL CHANGE IN THAT PORTION

SEMICONDUCTOR INTEGRATED CIRCUIT DEVICE AND A METHOD OF MANUFACTURING THE SAME

CROSS-REFERENCE TO RELATED APPLICATIONS

The disclosure of Japanese Patent Application No. 2008-82432 filed on Mar. 27, 2008 including the specification, drawings and abstract is incorporated herein by reference in its entirety.

BACKGROUND OF THE INVENTION

The present invention relates to a technology which is effective when applied to a technology for embedding a diode in a semiconductor integrated circuit device (or semiconductor device) or a method of manufacturing the semiconductor integrated circuit device (or semiconductor device).

Japanese Unexamined Patent Publication No. 2006-310555 (Patent Document 1) or US Unexamined Patent Publication No. 2006-0244050 (Patent Document 2) discloses a technology which forms electrodes only over a P-type guard ring for a Schottky barrier diode embedded in a semiconductor integrated circuit device. In the publication, to avoid a reduction in breakdown voltage due to a defect in an isolation region, a space is provided between a P-type guard ring and a field insulating film in the isolation region.

Japanese Unexamined Patent Publication No. 2001-210839 (Patent Document 3) or the publication of U.S. Pat. No. 6,803,644 (Patent Document 4) discloses a technology which forms electrodes only over a deep peripheral impurity region, which is other than a region formed with a PN junction, for a Zener diode embedded in a semiconductor integrated circuit device.

[Patent Document 1]
Japanese Unexamined Patent Publication No. 2006-310555
[Patent Document 2]
US Unexamined Patent Publication No. 2006-0244050
[Patent Document 3]
Japanese Unexamined Patent Publication No. 2001-210839
[Patent Document 4]
U.S. Pat. No. 6,803,644

SUMMARY OF THE INVENTION

Development of a liquid crystal display (LCD) which has been widely commercialized as a display device has been pursued for further miniaturization and a longer lifetime. To control the operation of the LCD, a semiconductor device referred to as an LCD driving integrated circuit (LCD driver) is used.

In not only the LDC driver, but also a driving integrated circuit used in a portion close to a power source, a reverse current introduced into a main device by, e.g., voltage inversion at the time of application of a power source voltage may cause a so-called latch-up phenomenon which brings about abnormal heat generation particularly in a parasitic element or the like. As a device for preventing such a latch-up phenomenon, diodes are embedded in various drivers to rectify the reverse currents to the main portions thereof. In particular, to the LCD driver studied by the present inventors, a Schottky barrier diode has been applied.

Conventionally, a circuit for preventing the latch-up has been constructed with a Schottky barrier diode manufactured as a discrete product, and mounted as external circuitry in an LCD driver. According to the study conducted by the present inventors, the recent demand trend for LCDs shows a rapid increase in the number of LCDs mounted in mobile communication terminals and the like. For this or other reasons, LCD drivers have been required to be implemented as small-size chips, and reduced in power consumption so that a technology which embeds a Schottky barrier diode in an LCD driver has been devised. It has been particularly desired to implement a space-saving and low-power-consumption LCD driver at low cost by embedding a Schottky barrier diode in a chip forming the LCD driver.

In such a case, in order to ensure a sufficient amount of current, it has been general practice to densely arrange a large number of contact electrodes (e.g., tungsten plugs each having a barrier metal layer of TiN or the like) in a matrix over a Schottky junction region. It has been widely performed to perform a sputter etching process with respect to the surface of a silicide (e.g., cobalt silicide) layer at the bottom of each contact hole before the barrier metal layer is deposited.

However, as a result of the study conducted by the present inventors, it has been elucidated that, in a structure (referred to as "over-junction-electrode") in which electrodes are thus arranged over a Schottky junction region, a reverse leakage current in a Schottky barrier diode is varied by variations in the amount of sputter etching. The variations caused in device parameter by the variation in such a process parameter which is apparently less relevant present an unignorable problem in terms of managing the characteristics of the device. The present invention has been achieved in order to solve such a problem.

An object of the present invention is to provide a technology for embedding a Schottky barrier diode (hereinafter referred to as "SBD") with reduced characteristic variations in a semiconductor integrated circuit.

The above and other objects and novel features of the present invention will become apparent from the description of the present specification and the accompanying drawings.

As shown below, a brief description will be given of the outline of a representative aspect of the invention disclosed in the present application.

That is, the present invention disclosed in the present application is a semiconductor integrated circuit device having a Schottky barrier diode (hereinafter referred to as an "over-guard-ring-electrode type") in which contact electrodes are arranged over a guard ring in contact with a peripheral isolation region.

The following is a brief description of an effect achievable by the representative aspect of the invention disclosed in the present application.

That is, by collectively arranging the contact electrodes of a Schottky barrier diode of a type embedded in a semiconductor integrated circuit device over a guard ring in contact with a peripheral isolation region, it is possible to reduce the influence of another process parameter on device characteristics.

BRIEF DESCRIPTION OF THE DRAWINGS

FIG. 87 is a correspondence illustrating table which illustrates correlations among the device cross-sectional views 22 to 86 mentioned above.

DETAILED DESCRIPTION OF THE PREFERRED EMBODIMENTS

Outline of Embodiments

Figure 1:
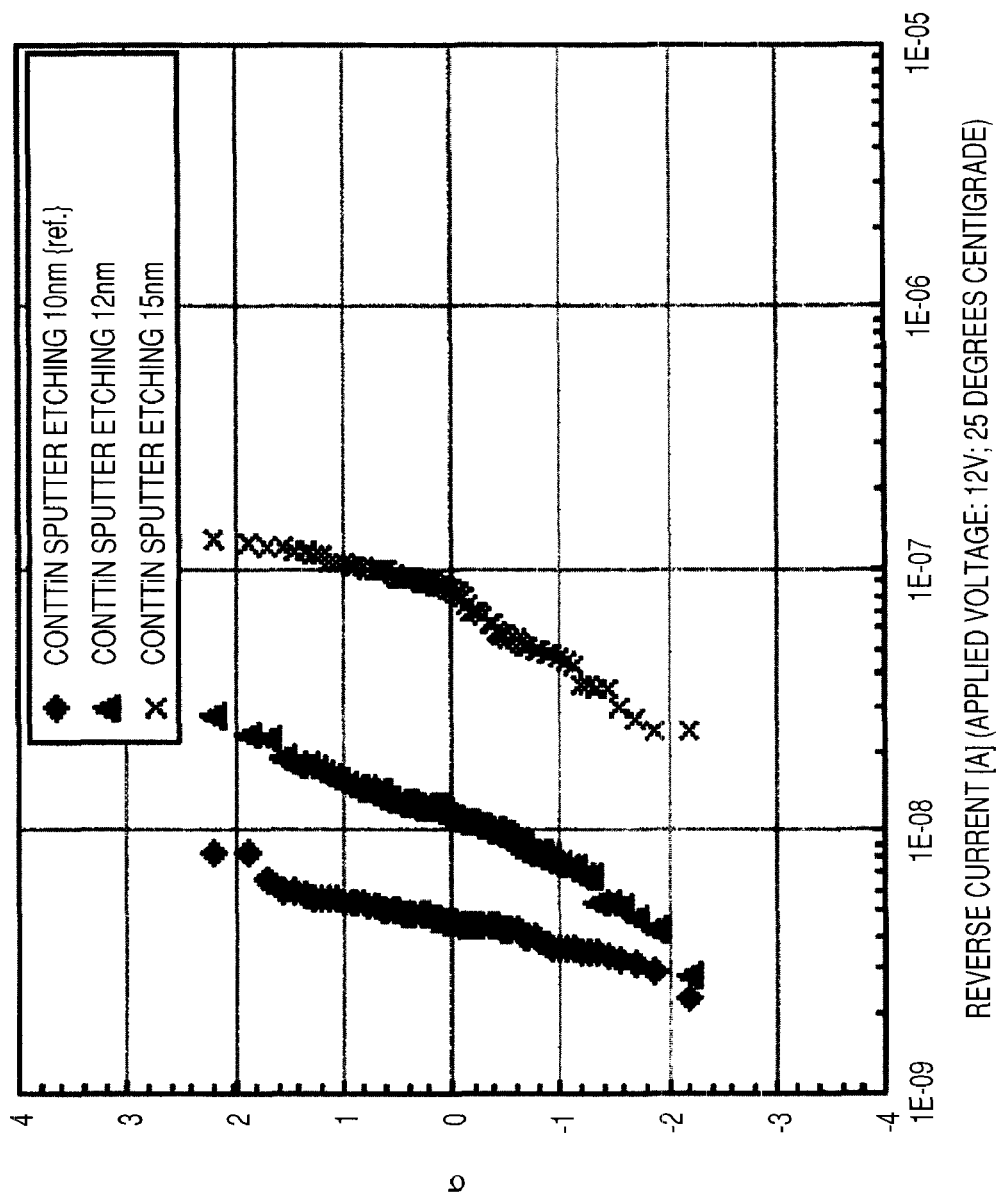
FIG. 1 shows statistic data showing the dependence of a reverse leakage current in an over-junction-electrode Schottky barrier diode on an amount of sputter etching prior to the formation of a contact barrier metal film.

First, a description will be given of the outline of the representative embodiments of the invention disclosed in the present application.

1. A semiconductor integrated circuit device includes: (a) a semiconductor substrate having a first principal surface and a second principal surface; (b) a CMOS integrated circuit portion provided in a first region of the first principal surface of the semiconductor substrate; and (c) a Schottky barrier diode portion provided in a second region of the first principal surface of the semiconductor substrate, wherein the Schottky barrier diode portion includes: (c1) a first N-type semiconductor region provided in the first principal surface in the second region; (c2) a first field insulating film region having an opening and provided in the first principal surface in the first N-type semiconductor region; (c3) a P-type guard ring region provided in the first principal surface in the opening of the first field insulating film region so as to be in contact with and along an inner periphery of the first field insulating film region; (c4) a Schottky junction cathode portion in which the first N-type semiconductor region is exposed at the first principal surface within the P-type guard ring region; (c5) a silicide film provided over the first principal surface over the opening of the first field insulating film region; and (c6) an anode contact electrode provided over the silicide film over the opening of the first field insulating film region, wherein the anode contact electrode is provided primarily over the P-type guard ring region.

2. In the semiconductor integrated circuit device mentioned in the paragraph 1, the anode contact electrode is not provided over the Schottky junction cathode portion.

3. In the semiconductor integrated circuit device mentioned in the paragraph 1 or 2, the P-type guard ring region has an entire outer peripheral portion thereof in contact with the inner periphery of the first field insulating film region.

4. In the semiconductor integrated circuit device mentioned in any one of the paragraphs 1 to 3, the P-type guard ring region is surrounded by a first P-type impurity region which is lower in impurity concentration and deeper than the P-type guard ring region.

5. In the semiconductor integrated circuit device mentioned in any one of the paragraphs 1 to 4, the anode contact region is formed integrally.

6. In the semiconductor integrated circuit device mentioned in any one of the paragraphs 1 to 4, the anode contact electrode is divided into a dotted configuration to form an anode contact electrode row.

7. In the semiconductor integrated circuit device mentioned in any one of the paragraphs 1 to 6, the P-type guard ring region has a two-dimensional multiply coupled shape in which a number of inner openings is not less than 2.

8. In the semiconductor integrated circuit device mentioned in any one of the paragraphs 1 to 6, the P-type guard ring region has a two-dimensional multiply coupled shape in which a number of inner openings is not less than 4.

9. In the semiconductor integrated circuit device mentioned in any one of the paragraphs 1 to 8, the anode contact electrode is formed immediately after an upper surface of the silicide film is sputter etched.

10. In the semiconductor integrated circuit device mentioned in any one of the paragraphs 1 to 4 and 6 to 9, the anode contact electrode is divided into a dotted configuration to form a plurality of anode contact electrode rows which are arranged along the P-type guard ring region.

11. In the semiconductor integrated circuit device mentioned in any one of the paragraphs 1 to 4 and 6 to 10, the anode contact electrode is divided into a dotted configuration to form an anode contact electrode row, and a distance between the anode contact electrode row and an inner periphery of the P-type guard ring region is set larger than a distance between the anode contact electrode row and an outer periphery of the P-type guard ring region.

12. In the semiconductor integrated circuit device mentioned in any one of the paragraphs 1 to 11, a second N-type semiconductor region having a concentration higher than that of the first N-type semiconductor region to allow formation of a Schottky junction, and shallower than the first N-type semiconductor region is provided at a center portion of the Schottky junction cathode portion in spaced-apart relation to the P-type guard ring region.

13. In the semiconductor integrated circuit device mentioned in any one of the paragraphs 1 to 12, the semiconductor substrate is a P-type silicon-based substrate.

14. In the semiconductor integrated circuit device mentioned in any one of the paragraphs 1 to 13, (i) the semiconductor substrate is a P-type silicon-based substrate, (ii) the P-type guard ring region is surrounded by a first P-type impurity region having an impurity concentration lower than that of the P-type guard ring region, and deeper than the P-type guard ring region, and (iii) another P-type impurity region is not interposed between the first N-type semiconductor region and the P-type impurity region intrinsic to the semiconductor substrate.

15. In the semiconductor integrated circuit device mentioned in any one of the paragraphs 1 to 14, (i) the semiconductor substrate is a P-type silicon-based substrate, (ii) a second N-type semiconductor region having a concentration higher than that of the first N-type semiconductor region to allow formation of a Schottky junction, and shallower than the first N-type semiconductor region is provided at a center portion of the Schottky junction cathode portion in spaced-apart relation to the P-type guard ring region, and (iii) another P-type impurity region is not interposed between the first N-type semiconductor region and the P-type impurity region intrinsic to the semiconductor substrate.

16. In the semiconductor integrated circuit device mentioned in any one of the paragraphs 1 to 15, the first N-type semiconductor region of the Schottky barrier diode portion is electrically isolated from the CMOS integrated circuit portion by a ring-shaped P-type isolation region.

17. In the semiconductor integrated circuit device mentioned in any one of the paragraphs 1 to 16, the first principal surface of an outer peripheral portion of the first field insulating film region is such that (i) the first N-type semiconductor region in the Schottky barrier diode portion is electrically isolated from the CMOS integrated circuit portion by a ring-shaped P-type isolation region, and (ii) the first principal surface of the outer peripheral portion of the first field insulating film region is surrounded by a ring-shaped P-type isolation contact region having a concentration higher than that of the P-type isolation region.

18. In the semiconductor integrated circuit device mentioned in any one of the paragraphs 1 to 17, an N-type cathode contact region having a concentration higher than that of the first N-type semiconductor region is provided in an opening different from the opening of the first field insulating film region.

19. In the semiconductor integrated circuit device mentioned in any one of the paragraphs 1 to 18, a thickness of the silicide film at a portion where the anode contact electrode is not provided ranges from 20 nm to 30 nm.

20. In the semiconductor integrated circuit device mentioned in any one of the paragraphs 1 to 19, the silicide film is a film containing cobalt silicide as a main component 21. In the semiconductor integrated circuit device mentioned in any one of the paragraphs 1 to 19, the silicide film is a film containing nickel silicide as a main component 22. A method of manufacturing a semiconductor integrated circuit including: (a) a semiconductor substrate having a first principal surface and a second principal surface; (b) a CMOS integrated circuit portion provided in a first region of the first principal surface of the semiconductor substrate; and (c) a Schottky barrier diode portion provided in a second region of the first principal surface of the semiconductor substrate, wherein the Schottky barrier diode portion includes: (c1) a first N-type semiconductor region provided in the first principal surface in the second region; (c2) a first field insulating film region having an opening and provided in the first principal surface in the first N-type semiconductor region; (c3) a P-type guard ring region provided in the first principal surface in the opening of the first field insulating film region so as to be in contact with and along an inner periphery of the first field insulating film region, the P-type guard ring region being surrounded by a first P-type impurity region which is lower in impurity concentration and deeper than the P-type guard ring region; (c4) a Schottky junction cathode portion in which the first N-type semiconductor region is exposed at the first principal surface within the P-type guard ring region; (c5) a silicide film provided over the first principal surface over the opening of the first field insulating film region; and (c6) an anode contact electrode provided over the silicide film over the opening of the first field insulating film region, wherein the anode contact electrode is provided primarily over the P-type guard ring region, the method of manufacturing the semiconductor integrated circuit device including the step of: (x) introducing a P-type impurity into the first principal surface of the semiconductor substrate to substantially simultaneously form a P-type well region where an N-type MOSFET in the CMOS integrated circuit portion is formed, and the first P-type impurity region in the Schottky barrier diode portion.

(Explanation of Description Form, Basic Terminology, and Use Thereof in Present Invention)

1. In the present invention, if necessary for the sake of convenience, the embodiments will be each divided into a plurality of sections or forms in description. However, they are by no means independent of or distinct from each other unless particularly explicitly described otherwise, and one of the individual parts of a single example is details, variations, and so fourth of part or the whole of the others. In principle, the repetition of like parts will be omitted. Each constituent element in the embodiments is not indispensable unless particularly explicitly described otherwise, unless the constituent element is theoretically limited to a specific number, or unless it is obvious from the context that the constituent element is indispensable.

2. Likewise, even when the wording "X made of A" or the like is used in association with a material, a composition, or the like in the description of the embodiments or the like, it does not exclude a material, a composition, or the like which contains an element other than A as one of main constituent element unless particularly explicitly described otherwise, or unless it is obvious from the context that it excludes such a material, a composition, or the like. For example, when a component is mentioned, the wording means "X containing A as a main component" or the like. It will be easily appreciated that, even when such wording as "silicon-based member", "silicon member", or the like is used, it is not limited to pure silicon, and a member containing a SiGe alloy, another multi-element alloy containing silicon as a main component, another additive, or the like is also included. Likewise, it will also be easily appreciated that, even when the wording "silicon dioxide film" is used, it includes not only relatively pure undoped silicon dioxide, but also a thermal oxide film such as FSG (Fluosilicate Glass), TEOS-based silicon oxide, SiOC (Silicon Oxycarbide), carbon-doped silicon oxide, OSG (Organosilicate Glass), PSG (Phosphorus Silicate Glass), or BPSG (Borophosphosilicate Glass), a CVD oxide film, coated silicon dioxide such as SOG (Spin On Glass) or NCS (Nano-Clustering Silica), a silica-based Low-k insulating film (porous insulating film) obtained by introducing voids into the same member as mentioned above, a composite film with another silicon-based insulating film which contains any of these mentioned above as a main constituent element, and the like.

3. Likewise, it will also be easily appreciated that, although a preferable example is shown in association with a graphical figure, a position, an attribute, or the like, it is not strictly limited thereto unless particularly explicitly described otherwise, or unless it is obvious from the context that the example is strictly limited thereto.

4. Further, when a specific numerical value or numerical amount is mentioned, it may be either more or less than the specific numerical value unless particularly explicitly described otherwise, unless the numerical value is theoretically limited to the number, or unless it is obvious from the context that the numeral value is limited to the number.

5. When the term "wafer" is used, it typically indicates a single-crystal silicon wafer on which a semiconductor integrated circuit device (the same as a semiconductor device or an electronic device) is formed, but it will be easily appreciated that "wafer" also includes a composite wafer of an insulating substrate and a semiconductor layer, such as an epitaxial wafer or a SOI substrate, or the like.

6. The term "MOS" etymologically means "Metal-Oxide-Semiconductor". When a silicon-based semiconductor is taken as a specific example, "MOS" indicates a structure made of polysilicon (a metal electrode of polycide, polymetal, or the like), a silicon dioxide film (a gate oxide film or gate insulating film), a silicon-based semiconductor (GaAs or another semiconductor), or the like. However, since "MOS" is typically used to mean "MIS", i.e., "Metal-Insulator-Semiconductor" in a broad sense, the present invention follows that usage of the term. Accordingly, "MOS" naturally covers the case where a gate insulating film is a silicon nitride film or another Hi-k insulating film.

7. In the present invention, a "ring-shaped region" corresponds to a two-dimensional multiply coupled region having at least one relatively large opening in the inside thereof. That is, the "ring-shaped region" indicates that it is not a two-dimensional singly coupled region (it is assumed herein that an opening having an excessively small diameter compared with the region is not regarded as an opening) which does not substantially have an opening. Therefore, it will be easily appreciated that, even though the term "ring" is used, the outer shape or contour thereof is not limited to a circle or an ellipsoid, and also includes a square, a rectangle, or another shape.

8. In the description of a process, "simultaneously" obviously means "in the same unit step or in a unit set of steps" unless it is obvious from the context that the meaning of "simultaneously" is different from those shown above, and does not mean "strictly at the same time".

9. In the accompanying drawings, so-called diffusion regions (impurity doped regions or impurity regions) are shown typically using the names of masks for ion implantation in a manufacturing process. That is, PSD typically denotes the high-concentration source/drain regions of a P-type MOSFET, PW typically denotes the P-type well region (P-type inner well) directly forming the P-type MOSFET, PV typically denotes the P-type intermediate-concentration region for attenuating an electric field, PiSO typically denotes a P-type isolation region, NSD typically denotes the high-concentration source/drain regions of an N-type MOSFET, NW typically denotes an N-type well region (N-type inner well) directly forming the N-type MOSFET, NV typically denotes an N-type intermediate-concentration region for attenuating an electric field, DNW typically denotes the low-concentration N-well of a double well in a buried N-type region, and so fourth. The overview of the general concentration relationships between the individual diffusion regions is given by PSD>PW>PV>PiSO>P-Sub (the intrinsic P-type impurity concentration of a P-type substrate), and NSD>NW>NV>DNW.

Details of Embodiments

The embodiments will be further described in greater detail. In the individual drawings, the same or like parts are designated by the same or similar symbols or reference numerals, and the description thereof will not be repeated in principle.

Each of the embodiments of the present invention shows, by way of example, the case where a Schottky barrier diode is embedded in the LCD driver mentioned above. That is, the case where the Schottky barrier diode is formed on the same chip as individual integrated circuits (a low-breakdown-voltage MOSFET, an intermediate-breakdown-voltage MOSFET, and a high-breakdown-voltage MOSFET) each for driving a liquid crystal display is shown by way of example. However, the Schottky barrier diode shown by way of example in the present invention is not particularly limited to the one embedded in an LCD driver, and is applicable to another integrated circuit in which a Schottky barrier diode is embedded.

1a. Description of Embedded Schottky Barrier Diode (Device Structure 1a, i.e., "Basic Structure") in Semiconductor Integrated Circuit Device of Embodiment of Present Invention, etc. (Primarily Using FIGS. 1 to 4)

FIG. 1 shows statistic data showing the dependence of a reverse leakage current in an over-junction-electrode Schottky barrier diode on an amount of sputter etching prior to the formation of a contact barrier metal film. That is, the way how the reverse leakage current (with an applied voltage of 12 V, and at a temperature of 25 degrees centigrade) in the Schottky barrier diode is distributed depending on the thickness of the portion of a cobalt silicide film which has been sputter etched is shown through standardization with the standard deviation ($\sigma$) of the reverse leakage currents of individual sample sets (categorized according to the amount of sputter etching). It can be said that, as a regression line is more vertical, variations are smaller. From this, it can be understood that the reverse leakage current significantly varies depending on the amount of sputter etching.

The cause thereof is conceivably that, because a Schottky junction is formed between a silicon substrate (upper N-type portion of the substrate) and a cobalt silicide film, when the cobalt silicide film (anode) is thinned by sputter etching, it directly receives the influence of immediately overlying coupling electrodes.

Figure 2:
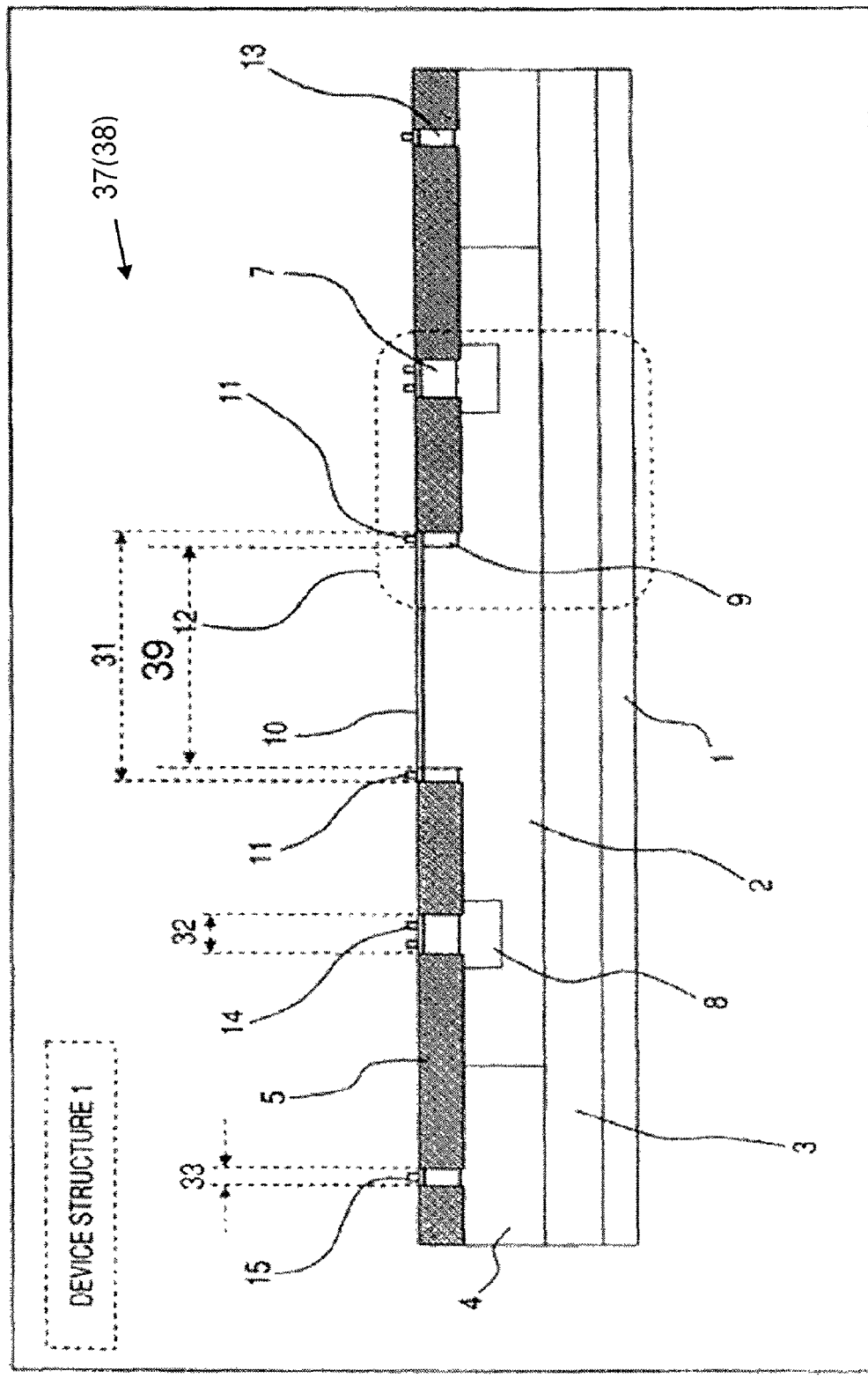
FIG. 2 is a cross-sectional structural view of an embedded Schottky barrier diode (device structure 1) in a semiconductor integrated circuit device according to an embodiment of the present invention.
Figure 3:
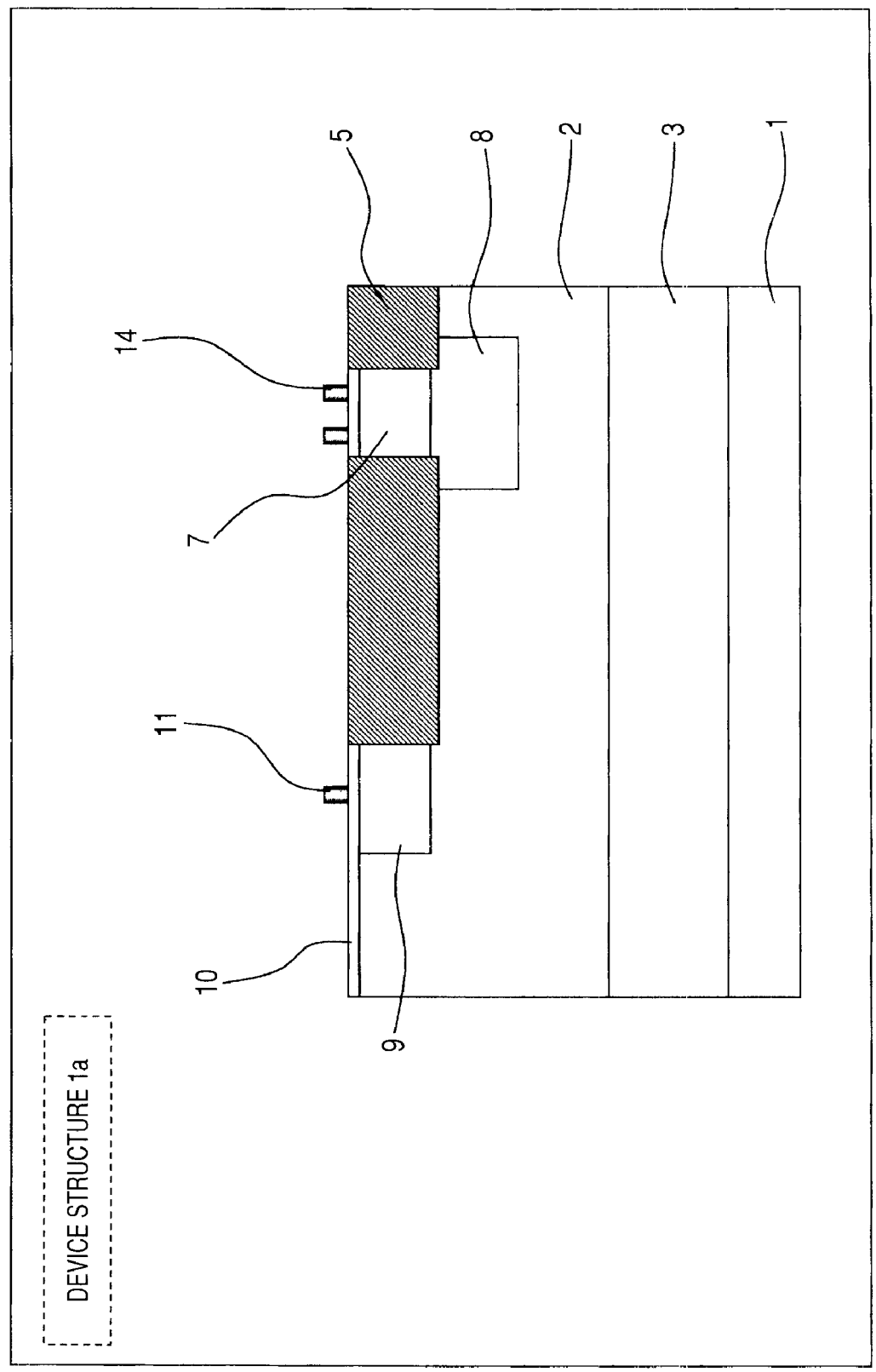
FIG. 3 is an enlarged cross-sectional structural view of a principal region 12 of an embedded Schottky barrier diode (device structure 1a) in the semiconductor integrated circuit device according to an embodiment of the present invention.
Figure 4:
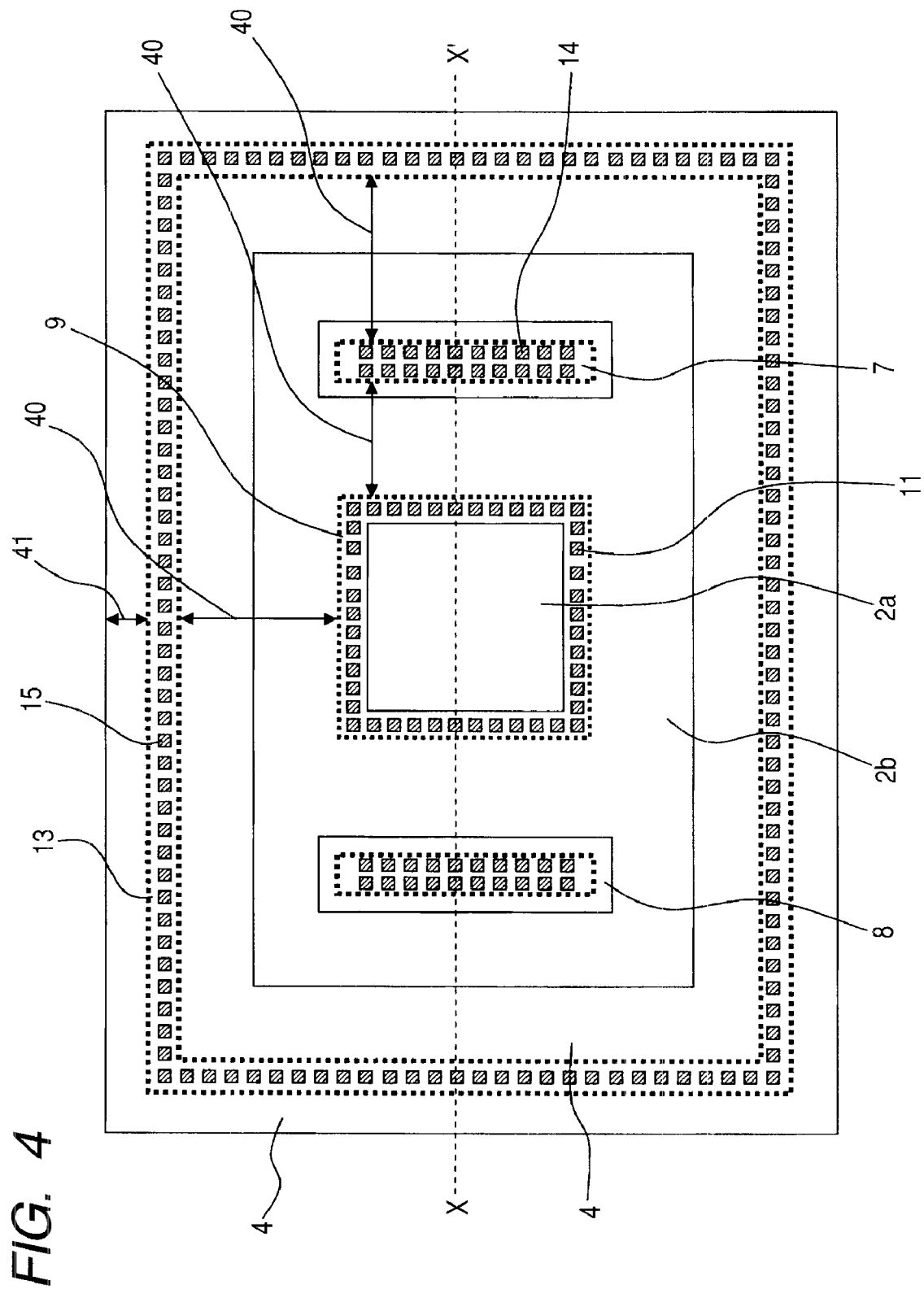
FIG. 4 is a top structural view in which the X-X' cross section of the embedded Schottky barrier diode (device structure 1a) in the semiconductor integrated circuit device according to the embodiment of the present invention corresponds to FIG. 2.

FIG. 2 is a cross-sectional structural view of an over-guard-ring-electrode Schottky barrier diode (device structure 1) embedded in a semiconductor integrated circuit device according to an embodiment of the present invention. FIG. 3 is an enlarged cross-sectional structural view of a principal region 12 of an embedded Schottky barrier diode (device structure 1a) of the semiconductor integrated circuit device according to an embodiment of the present invention. FIG. 4 is a top structural view (Schottky barrier diode portion 37) in which the X-X' cross section of the embedded Schottky barrier diode (device structure 1a) of the semiconductor integrated circuit device according to the embodiment of the present invention corresponds to FIG. 2. In a first region 36 and a second region 38 over the first principal surface if of a semiconductor substrate 1, there are a CMOS integrated circuit portion 35 (first region 36) in which a CMOS device and the like are integrated, and the Schottky barrier diode portion 37 (designated as the second region 38 including a portion where another Schottky barrier diode portion is provided, which will be described hereinbelow) which is described herein. Based on these drawings, the device structure 1 (primarily the device structure 1a) mentioned above will be described.

As shown in FIGS. 2 to 4, the Schottky barrier diode of the present embodiment mentioned above is typically formed in an N-type semiconductor region 2 (cathode) including the upper surface of the P-type silicon single-crystal substrate (P-type silicon-based substrate) (i.e., the first principal surface 1f, while the lower surface thereof is, i.e., a second principal surface 1r) and the vicinity thereof. The N-type semiconductor region 2 is isolated from the other regions by a P-type isolation region 4 surrounding the periphery of the N-type semiconductor region 2 and an underlying P-type buried region 3 (the P-type buried region 3 under a SBD portion can be omitted, or replaced by an N-type buried region DNW or the like as necessary, as will be described hereinbelow). A STI (Shallow-Trench-Isolation) field insulating film 5 having a large number of openings is provided over substantially the entire upper surface of the substrate 1. In FIG. 4, the regions each covered with the field insulating film 5 are indicated by the solid-line arrows (the boundaries thereof are indicated by the thick dotted lines). In addition, the edges of the regions each covered with the field insulating film 5 are clearly shown by the thick dotted lines (in the same manner as in the other top views). In FIG. 4, the region 2b, e.g., is the region covered with the field insulating film 5 over the N-type semiconductor region 2 (first N-type semiconductor region). Of the field insulating film 5, the portion indicated by the arrow 40 is a first field insulating film region 40. On the other hand, the portion thereof indicated by the arrow 41 is a field insulating film region outside the first field insulating film region 40. In the peripheral portion of a square or rectangular opening (which may also has another shape) in the first field insulating film region 40, i.e., Schottky junction opening 31 (corresponding to the main portion of the Schottky diode), a high-concentration P-type guard ring region 9 is provided in contact with the field insulating film 5 (the portion obtained by excluding the P-type guard ring region 9 from the Schottky diode main portion 31 is a Schottky junction cathode portion 39). N-type body contact opening regions 32 are provided outside the P-type guard ring region 9. In the opening regions 32, high-concentration N-type body contact regions 7 (i.e., N-type cathode contact regions) are provided, and N-type semiconductor regions 8 slightly lower in impurity concentration than the N-type body contact regions 7 are provided thereunder as electric-field attenuating regions. Further, an annular P-type body contact opening region 33 (i.e., a P-type isolation contact region) is provided over a P-type isolation region 4 (P-type isolation region) outside the opening regions 32 (the portion of the field insulating film 5 which is located inside the P-type body contact opening region 33 corresponds to the first field insulating film region 40, while the outer field insulating film region 41 is on the opposite side of the P-type body contact opening region 33). In the opening region 33, a high-concentration P-type body contact region 13 is provided. Over the respective semiconductor substrate surface portions in these opening regions 31, 32, and 33, cobalt silicide films 10 are formed. Over the respective cobalt silicide films 10 in the opening regions 31, 32, and 33, contact electrodes 11, 14, and 15 are provided, respectively. In the opening region 31, the anode contact electrodes 11 are not provided in principle over a portion 2a (FIG. 4) where the N-type semiconductor region 2 is exposed at the surface thereof, and the anode contact electrodes 11 are collectively arranged over the portion where the P-type guard ring region 9 is provided. This is for preventing variations in the characteristics of the Schottky barrier diode due to variations in the amount of sputter etching the cobalt silicide film 10 which are caused by providing the anode contact electrodes 11 over the portion where the Schottky junction is formed, as described previously. Preferably, the anode contact electrodes 11 are each positioned at a sufficient distance from the inner edge of the P-type guard ring region 9 so as not to protrude from the P-type guard ring region due to misalignment. In other words, the distance between the anode contact electrode row (more precisely, the inner edge thereof) and the inner periphery of the P-type guard ring region 9 is set larger than the distance between the anode contact electrode row (more precisely, the outer edge thereof) and the outer periphery of the P-type guard ring region 9.

An advantage of the SBD structure is that, because the P-type guard ring region 9 is formed in contact with the outer periphery of the Schottky junction opening 31 of the first field insulating film region 40, i.e., the inner periphery of the first field insulating film region 40, the operation characteristics of the SBD such as breakdown voltage are immune to the influence of the edge of a field. In addition, since the anode contact electrodes 11 are provided as a large number of discrete electrodes in a dotted configuration, the advantage of allowing easy optimization of lithography is offered.

1b. Description of Embedded Schottky Barrier Diode (Device Structure 1b, i.e., "2-Row Arrangement") in Semiconductor Integrated Circuit Device of Embodiment of Present Invention, etc. (Primarily Using FIGS. 3, 5, and 6)

This example is a variation of a plan layout in the example of the section 1a described above so that only different parts will be described.

Figure 5:
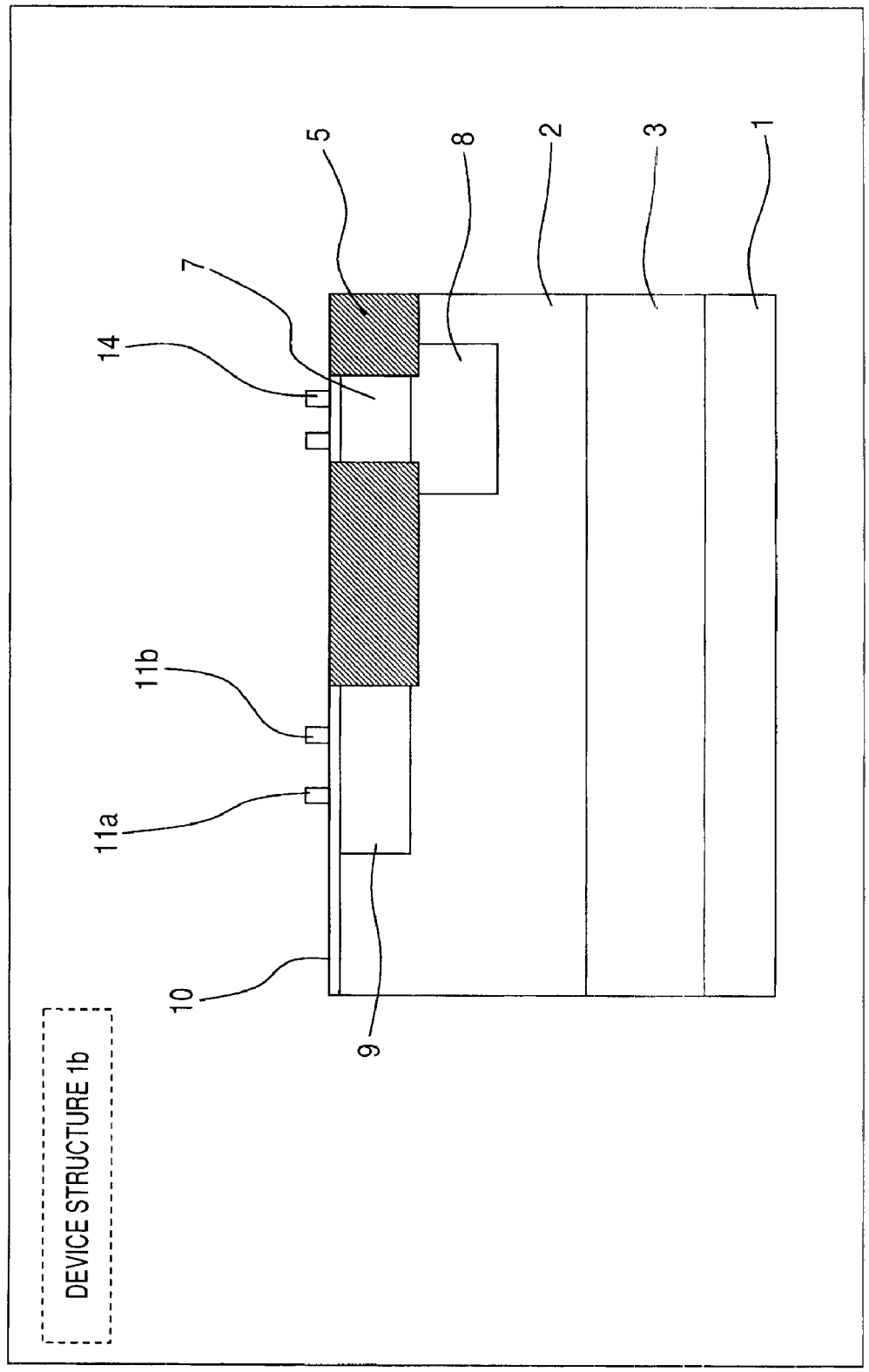
FIG. 5 is an enlarged cross-sectional structural view of the principal region 12 of an embedded Schottky barrier diode (device structure 1b) in the semiconductor integrated circuit device according to an embodiment of the present invention.
Figure 6:
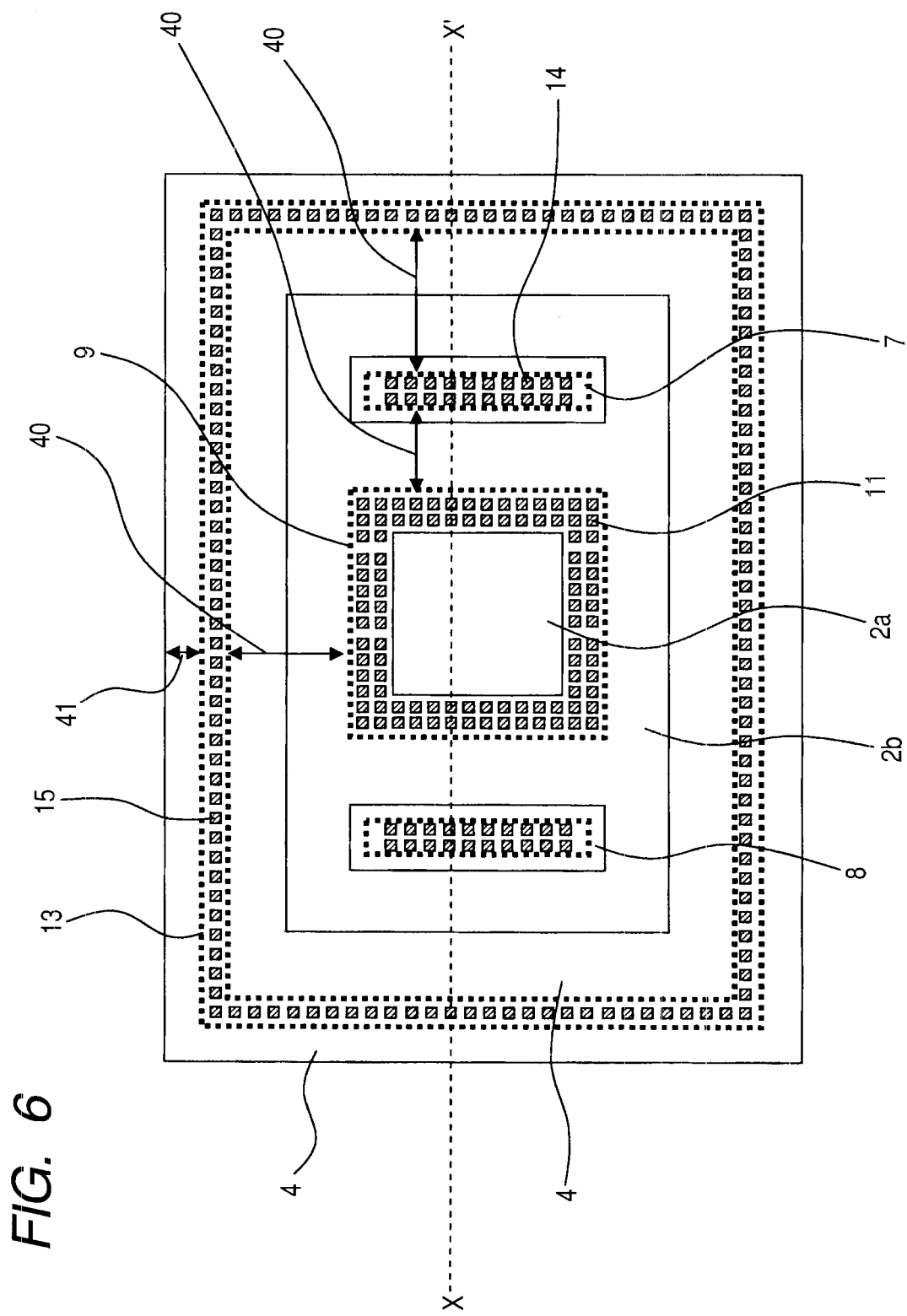
FIG. 6 is a top structural view in which the X-X' cross section of the embedded Schottky barrier diode (device structure 1b) in the semiconductor integrated circuit device according to the embodiment of the present invention corresponds to FIG. 2.

FIG. 5 is an enlarged cross-sectional structural view of the principal region 12 of an embedded Schottky barrier diode (device structure 1b) in the semiconductor integrated circuit device according to an embodiment of the present invention. FIG. 6 is a top structural view in which the X-X' cross section of the embedded Schottky barrier diode (device structure 1b) in the semiconductor integrated circuit device according to the embodiment of the present invention corresponds to FIG. 2. Based on these drawings, the device structure 1b mentioned above will be described.

In this example, as shown in FIGS. 5 and 6, the contact electrodes 11 are arranged in two rows (a plurality of rows) over the P-type guard ring region 9 in order to ensure a sufficient current capacitance.

This SBD structure is characterized in that, since the anode contact electrodes are formed in the plurality of rows, the advantage of allowing a large forward current capacitance to be ensured compared with the case where the anode contact electrodes are formed in one row is offered. Another advantage is that, since the P-type guard ring region 9 is formed in contact with the outer periphery of the Schottky junction opening 31 of the first field insulating film region, i.e., the inner periphery of the first insulating film region 40, the operation characteristics of the SBD such as breakdown voltage are immune to the influence of the edge of the field, in the same manner as described previously. In addition, since the anode contact electrodes 11 are provided as a large number of discrete electrodes in a dotted configuration, the advantage of allowing easy optimization of lithography is offered.

1c. Description of Embedded Schottky Barrier Diode (Device Structure 1c, i.e., "Grid-Like Arrangement") in Semiconductor Integrated Circuit Device of Embodiment of Present Invention, etc. (Primarily Using FIGS. 2, 7, and 8)

This example is another variation of the plan layout in each of the examples of the sections 1a and 1b described above so that only different parts will be described.

Figure 7:
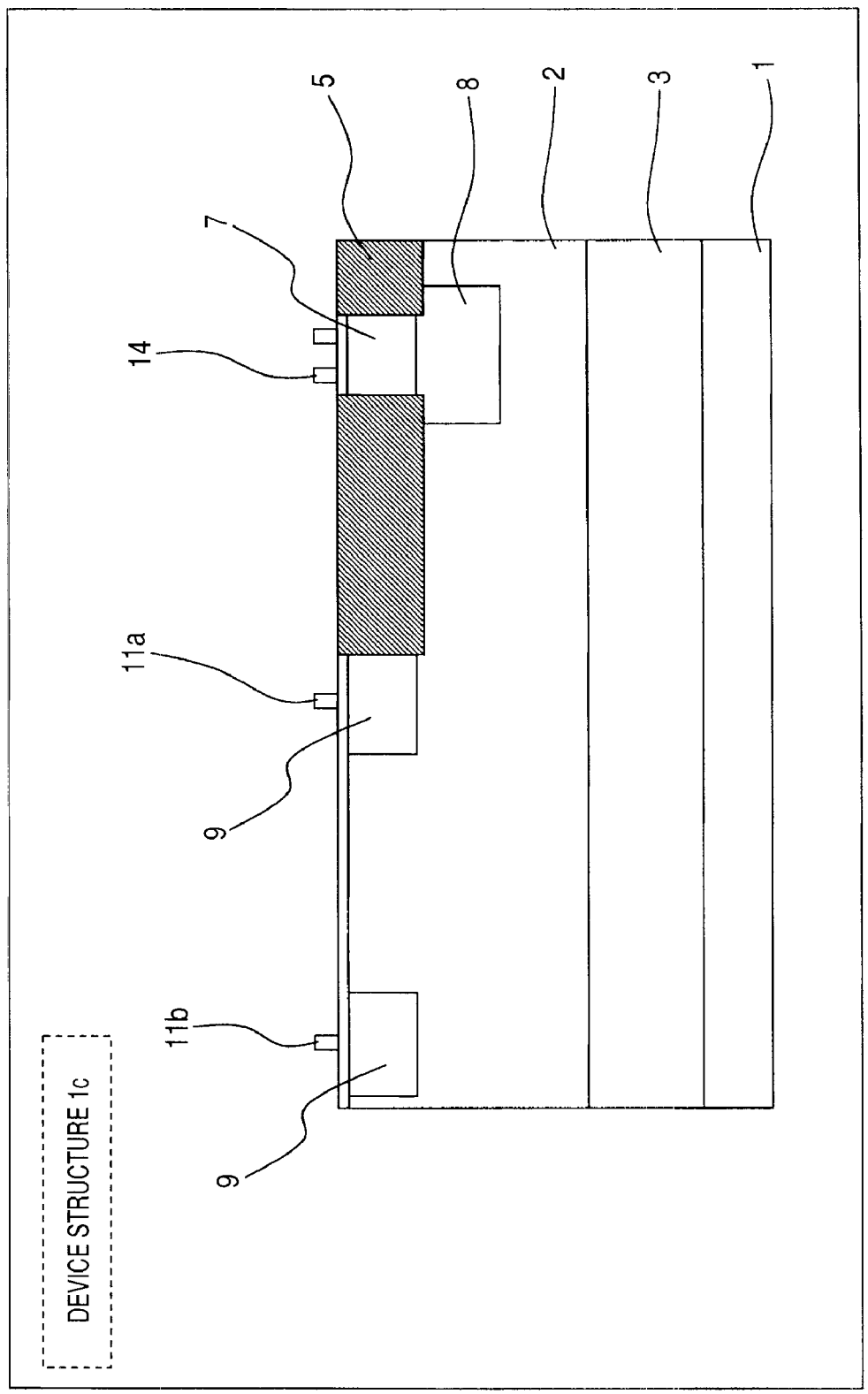
FIG. 7 is an enlarged cross-sectional structural view of the principal region 12 of an embedded Schottky barrier diode (device structure 1c) in the semiconductor integrated circuit device according to an embodiment of the present invention.
Figure 8:
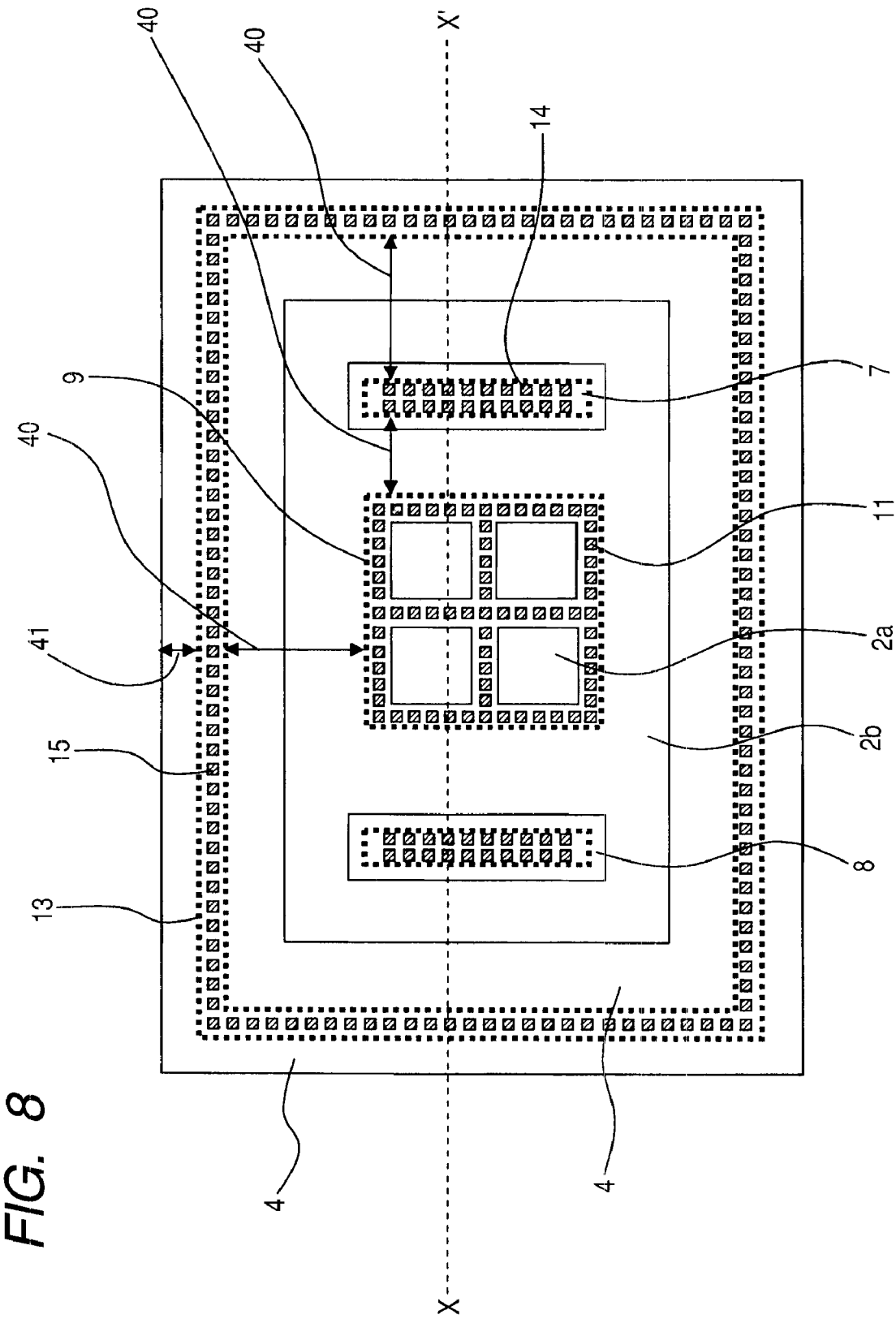
FIG. 8 is a top structural view in which the X-X' cross section of the embedded Schottky barrier diode (device structure 1c) in the semiconductor integrated circuit device according to the embodiment of the present invention corresponds to FIG. 2.

FIG. 7 is an enlarged cross-sectional structural view of the principal region 12 of an embedded Schottky barrier diode (device structure 1c) in the semiconductor integrated circuit device according to an embodiment of the present invention. FIG. 8 is a top structural view in which the X-X' cross section of the embedded Schottky barrier diode (device structure 1c) in the semiconductor integrated circuit device according to the embodiment of the present invention corresponds to FIG. 2. Based on these drawings, the device structure 1c mentioned above will be described.

In this example, as shown in FIG. 8, the P-type guard ring region 9 is formed in a grid-like plan configuration (top configuration) or two-dimensional multiply coupled plan configuration in which the number of inner openings is not less than 2 in order to ensure a sufficient current capacitance, and provide a uniform current distribution within the N-type semiconductor region 2. In this case, it is particularly preferable to set the number of inner openings to a value of not less than 4.

The SBD structure is characterized in that, since the P-type guard ring region 9 has a two-dimensional quintuply coupled configuration (a triply or quadruply coupled configuration is also effective), it is possible to provide a wide current path, and the advantage of allowing a reduction in the parasitic resistance of a cobalt silicide layer is offered. Another advantage is that, since the P-type guard ring region 9 is formed in contact with the outer periphery of the Schottky junction opening 31 of the first field insulating film region 40, i.e., the inner periphery of the first field insulating film region 40, the operation characteristics of the SBD such as breakdown voltage are immune to the influence of the edge of the field, in the same manner as described above. In addition, since the anode contact electrodes 11 are provided as a large number of discrete electrodes in a dotted configuration, the advantage of allowing easy optimization of lithography is offered. Moreover, the advantage of an increase in the area over which the anode contact electrodes 11 can be arranged is also offered. In this case, the same effect is achieved irrespective of whether the electrodes are in the dotted configuration or in an integral configuration 1d. Description of Embedded Schottky Barrier Diode (Device Structure 1d, i.e., "Indiscrete Electrode") in Semiconductor Integrated Circuit Device of Embodiment of Present Invention, etc. (Primarily Using FIGS. 2 and 9)

This example is still another variation of the plan layout in each of the examples of the sections 1a to 1c described above so that only different parts will be described.

Figure 9:
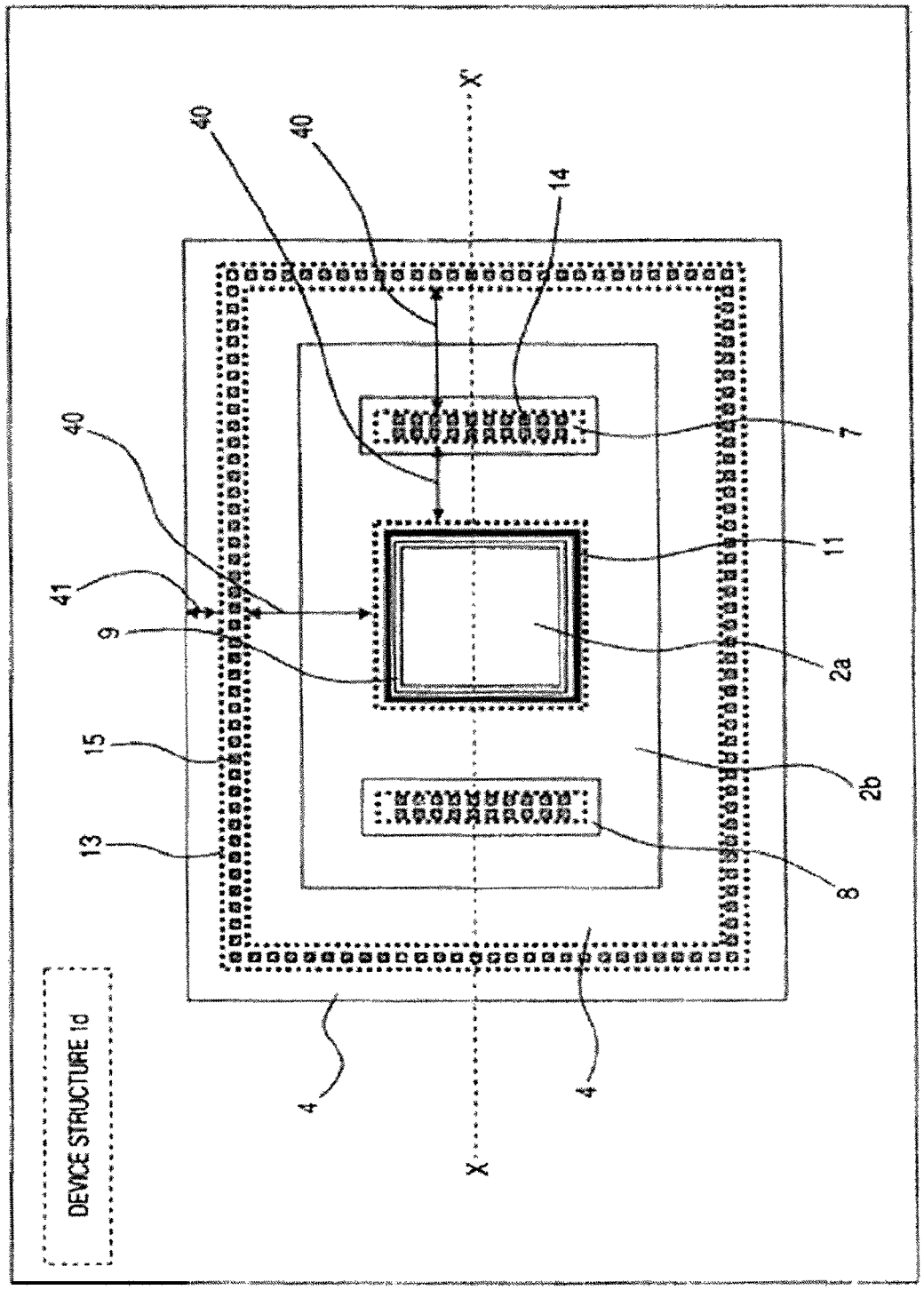
FIG. 9 is a top structural view in which the X-X' cross section of an embedded Schottky barrier diode (device structure 1d) in the semiconductor integrated circuit device according to an embodiment of the present invention corresponds to FIG. 2.

FIG. 9 is a top structural view in which the X-X' cross section of an embedded Schottky barrier diode (device structure 1d) in the semiconductor integrated circuit device according to an embodiment of the present invention corresponds to FIG. 2. Based on the drawings, the device structure 1d mentioned above will be described.

In this example, as shown in FIG. 9, the annular indiscrete contact electrode 11 is disposed over the P-type guard ring region 9. This scheme is effective in ensuring a sufficient contact area, though it presents difficulty in setting photolithographical conditions. In terms of layout, it is preferable to provide a sufficient distance between the contact electrode 11 and the inner edge of the P-type guard ring region 9 to prevent the contact electrode 11 from protruding into the portion 2a where the N-type semiconductor region 2 is exposed at the surface thereof due to misalignment, as described previously. Even when the contact electrode 11 slightly protrudes from the outer edge of the P-type guard ring region 9, a problem associated with characteristics does not occur, though a current capacitance slightly decreases.

This SBD structure is characterized in that, since the anode contact electrode 11 is integrally formed, the advantage of allowing a large current capacitance to be provided despite a relatively small area is offered. Another advantage is that, since the P-type guard ring region 9 is formed in contact with the outer periphery of the Schottky junction opening 31 of the first field insulating film region 40, i.e., the inner periphery of the first field insulating film region 40, the operation characteristics of the SBD such as breakdown voltage are immune to the influence of the edge of the field, in the same manner as described previously.

2a. Description of Embedded Schottky Barrier Diode (Device Structure 2a, i.e., "Center High-Concentration Region") in Semiconductor Integrated Circuit Device of Embodiment of Present Invention, etc. (Primarily Using FIGS. 10 to 12)

This example is a variation of a vertical structure in each of the examples of the sections 1a to 1d described above so that only different parts will be described.

Figure 10:
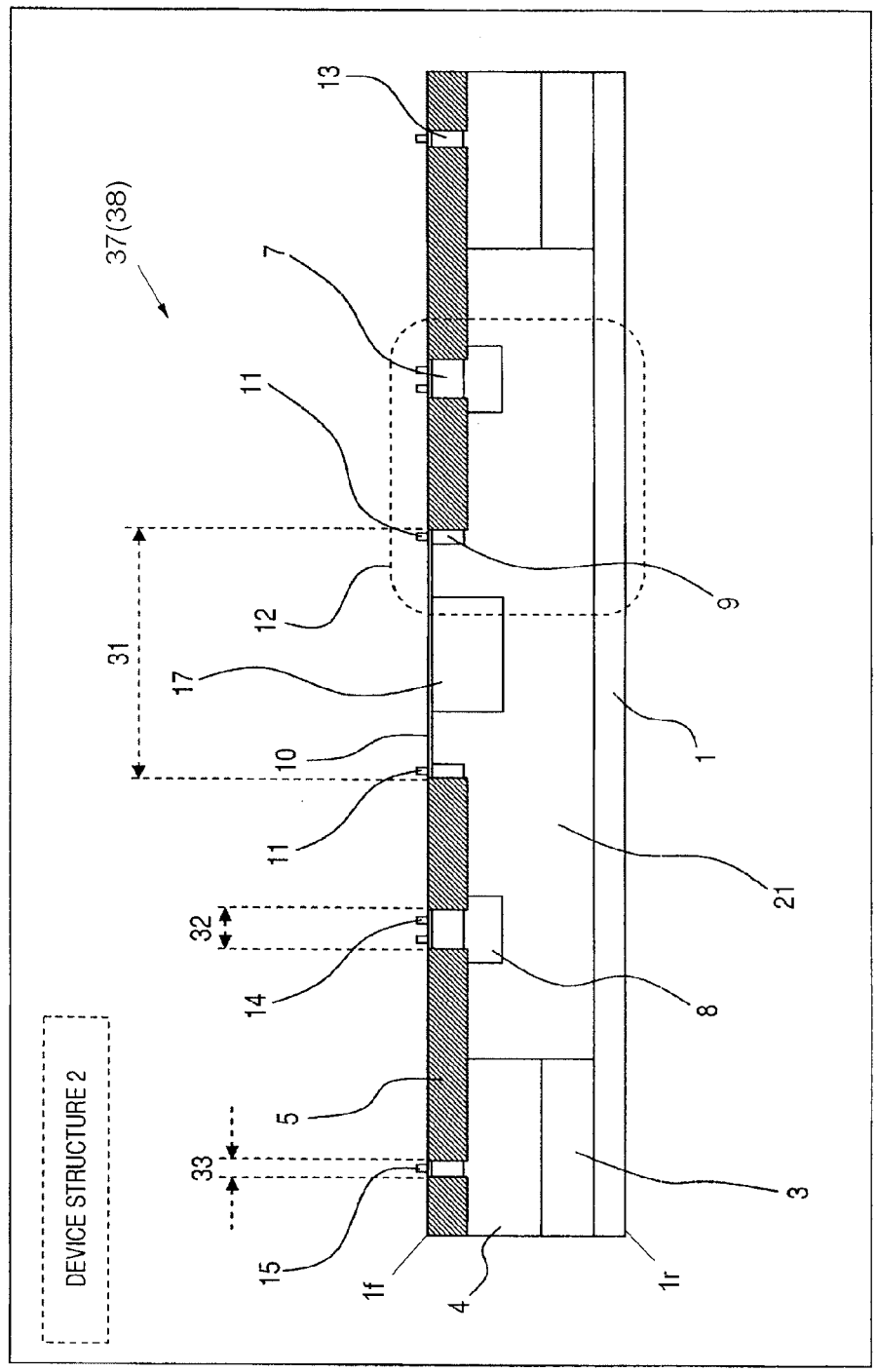
FIG. 10 is a cross-sectional structural view of an embedded Schottky barrier diode (device structure 2) in the semiconductor integrated circuit device according to an embodiment of the present invention.
Figure 11:
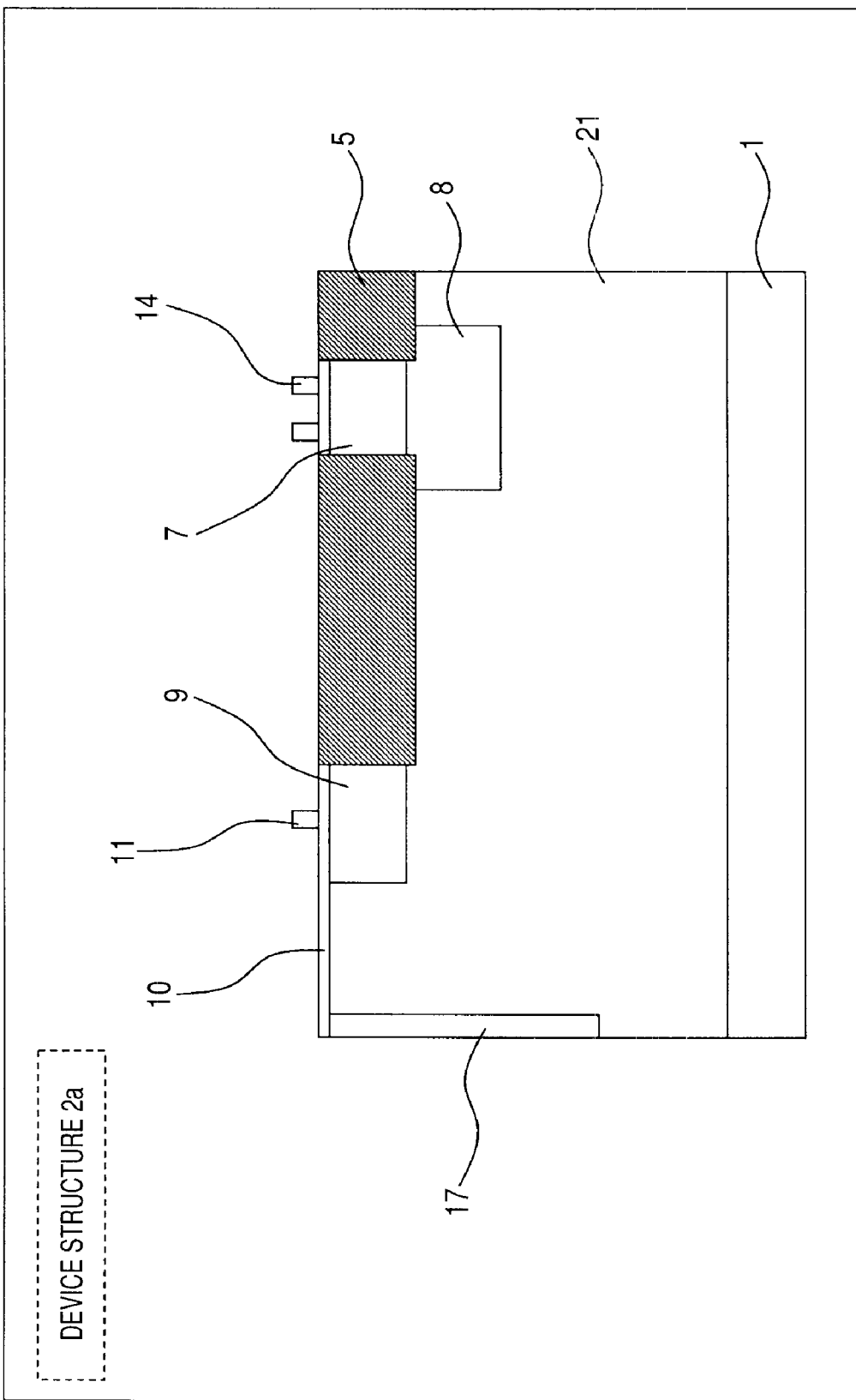
FIG. 11 is an enlarged cross-sectional structural view of the principal region 12 of an embedded Schottky barrier diode (device structure 2a) in the semiconductor integrated circuit device according to an embodiment of the present invention.
Figure 12:
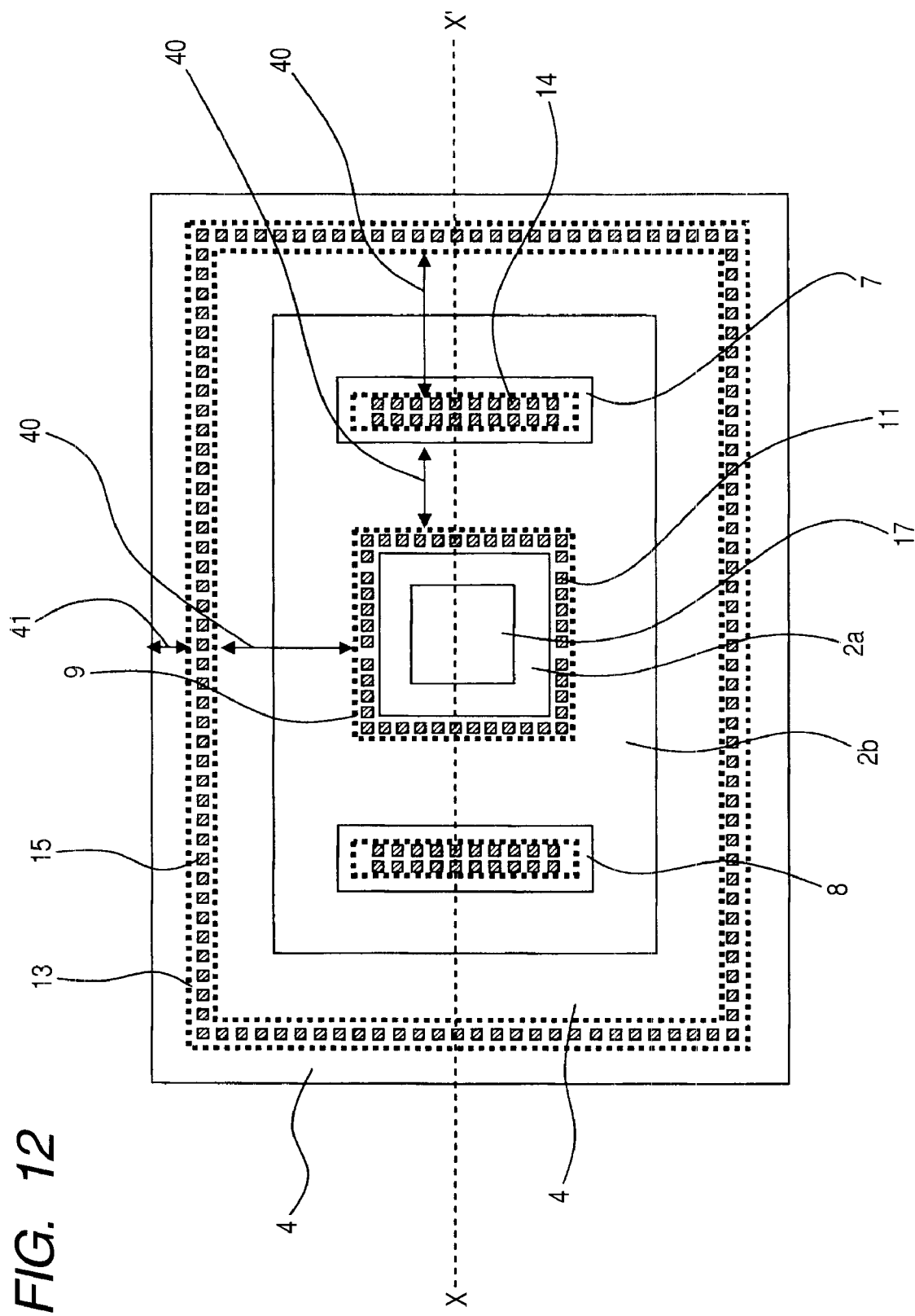
FIG. 12 is a top structural view in which the X-X' cross section of the embedded Schottky barrier diode (device structure 2a) in the semiconductor integrated circuit device according to the embodiment of the present invention corresponds to FIG. 10.

FIG. 10 is a cross-sectional structural view of an embedded Schottky barrier diode (device structure 2) in the semiconductor integrated circuit device according to an embodiment of the present invention. FIG. 11 is an enlarged cross-sectional view of the principal region 12 of an embedded Schottky barrier diode (device structure 2a) in the semiconductor integrated circuit device according to an embodiment of the present invention. FIG. 12 is a top structural view in which the X-X' cross section of the embedded Schottky barrier diode (device structure 2a) in the semiconductor integrated circuit device according to the embodiment of the present invention corresponds to FIG. 10. Based on these drawings, the device structure 2a (primarily the device structure 2a) mentioned above will be described.

In this example, as shown in FIGS. 10 to 12, the concentration of an N-type semiconductor region 21 (corresponding to the first N-type semiconductor region in the example described above) is reduced in order to improve a reverse breakdown voltage. This improves the breakdown voltage, but degrades a forward current characteristic so that an N-type semiconductor region 17 (i.e., a second N-type semiconductor region) higher in impurity concentration than the N-type semiconductor region 21 is provided in the surface of the center portion of the Schottky junction opening 31 to improve the forward current characteristic. In this case, it is desired not to provide the P-type buried region 3 under the N-type semiconductor region 17 for the purpose of preventing punch-through. However, it will be easily appreciated that, when the problem of punch-through does not occur or punch-through hardly presents a problem, the P-type buried region 3 may also be provided appropriately.

2b. Description of Embedded Schottky Barrier Diode (Device Structure 2b, i.e., "Center of High-Concentration Region Plus 2-Row Arrangement") in Semiconductor Integrated Circuit Device of Embodiment of Present Invention, etc. (Primarily Using FIGS. 10, 13, and 14)

This example is a variation of a vertical structure in the example of the section 2a based on the examples of the sections 1a to 1d described above so that only different parts will be described.

Figure 13:
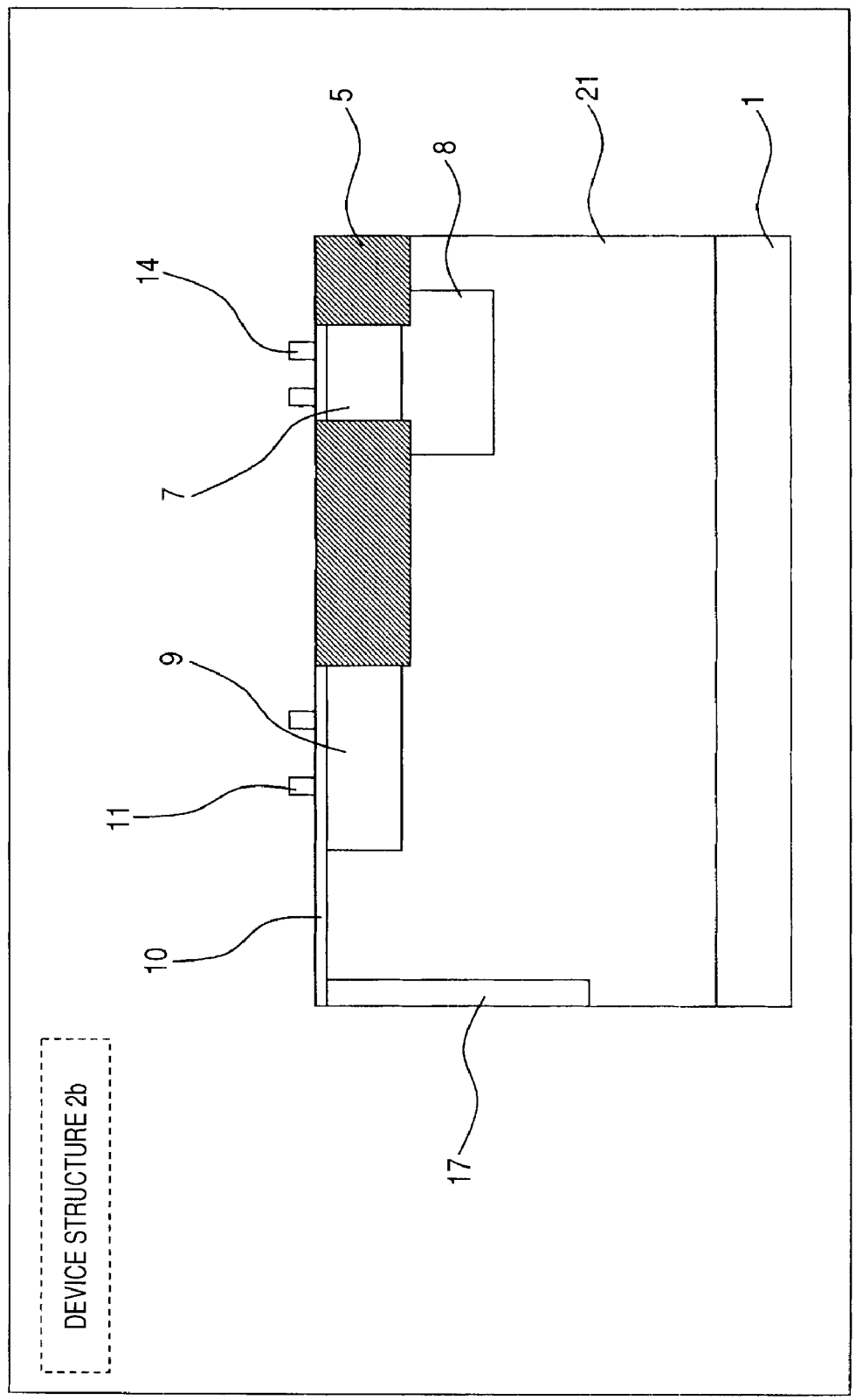
FIG. 13 is an enlarged cross-sectional structural view of the principal region 12 of an embedded Schottky barrier diode (device structure 2b) in the semiconductor integrated circuit device according to an embodiment of the present invention.
Figure 14:
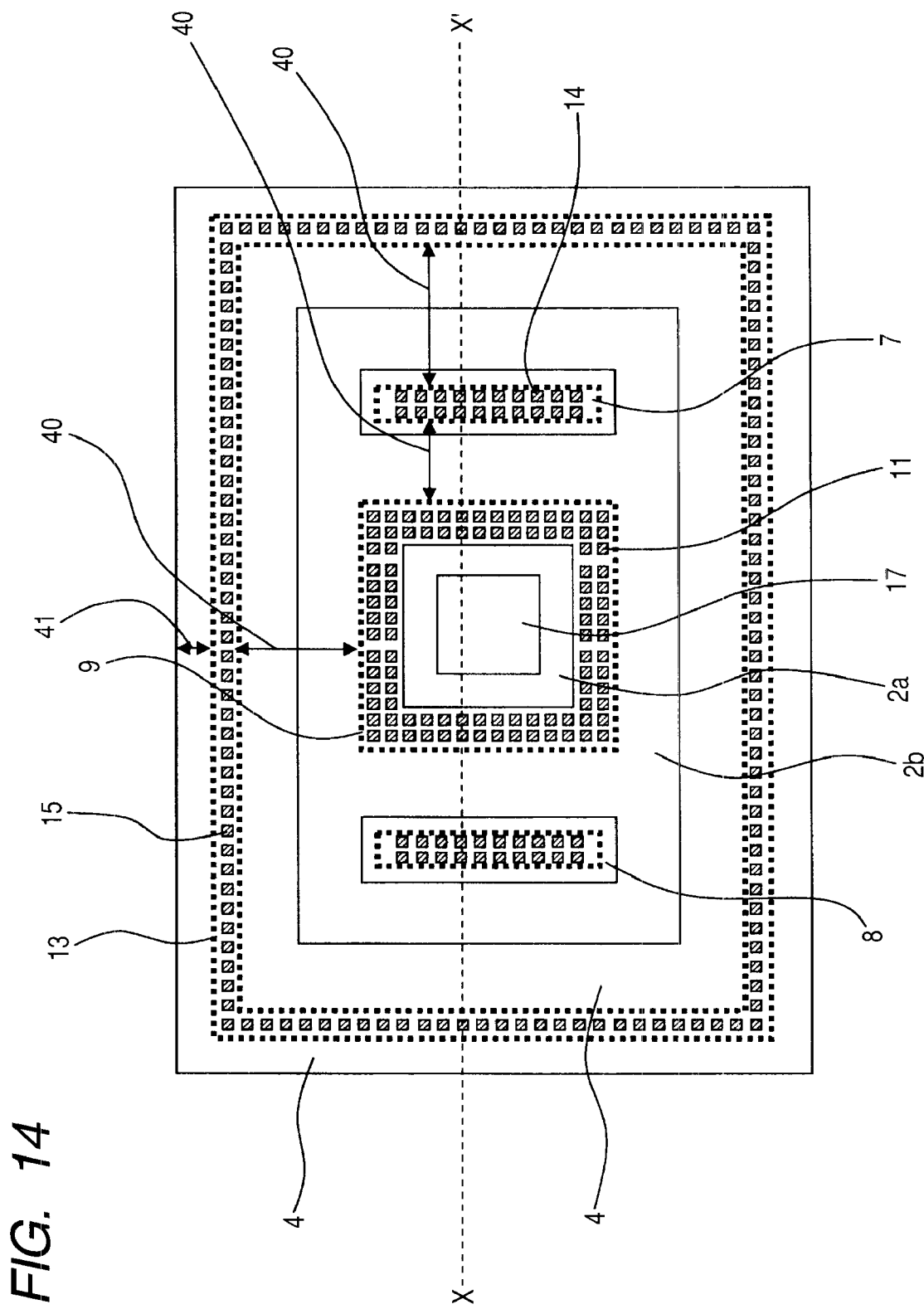
FIG. 14 is a top structural view in which the X-X' cross section of the embedded Schottky barrier diode (device structure 2b) in the semiconductor integrated circuit device according to the embodiment of the present invention corresponds to FIG. 10.

FIG. 13 is an enlarged cross-sectional structural view of the principal region 12 of an embedded Schottky barrier diode (device structure 2b) in the semiconductor integrated circuit device according to an embodiment of the present invention. FIG. 14 is a top structural view in which the X-X' cross section of the embedded Schottky barrier diode (device structure 2b) in the semiconductor integrated circuit device according to the embodiment of the present invention corresponds to FIG. 10. Based on these drawings, the device structure 2b mentioned above will be described.

In this example, as shown in FIGS. 13 and 14, the contact electrodes 11 are arranged in two rows (a plurality of rows) over the P-type guard ring region 9 in response to an increase in forward current, in the same manner as in the section 2.

3a. Description of Embedded Schottky Barrier Diode (Device Structure 3a, i.e., "Guard Ring Attenuating Region") in Semiconductor Integrated Circuit Device of Embodiment of Present Invention, etc. (Primarily Using FIGS. 15 to 17)

This example is another variation of the vertical structure in each of the examples of the sections 2a and 2b based on the examples of the sections 1a to 1d described above so that only different parts will be described.

Figure 15:
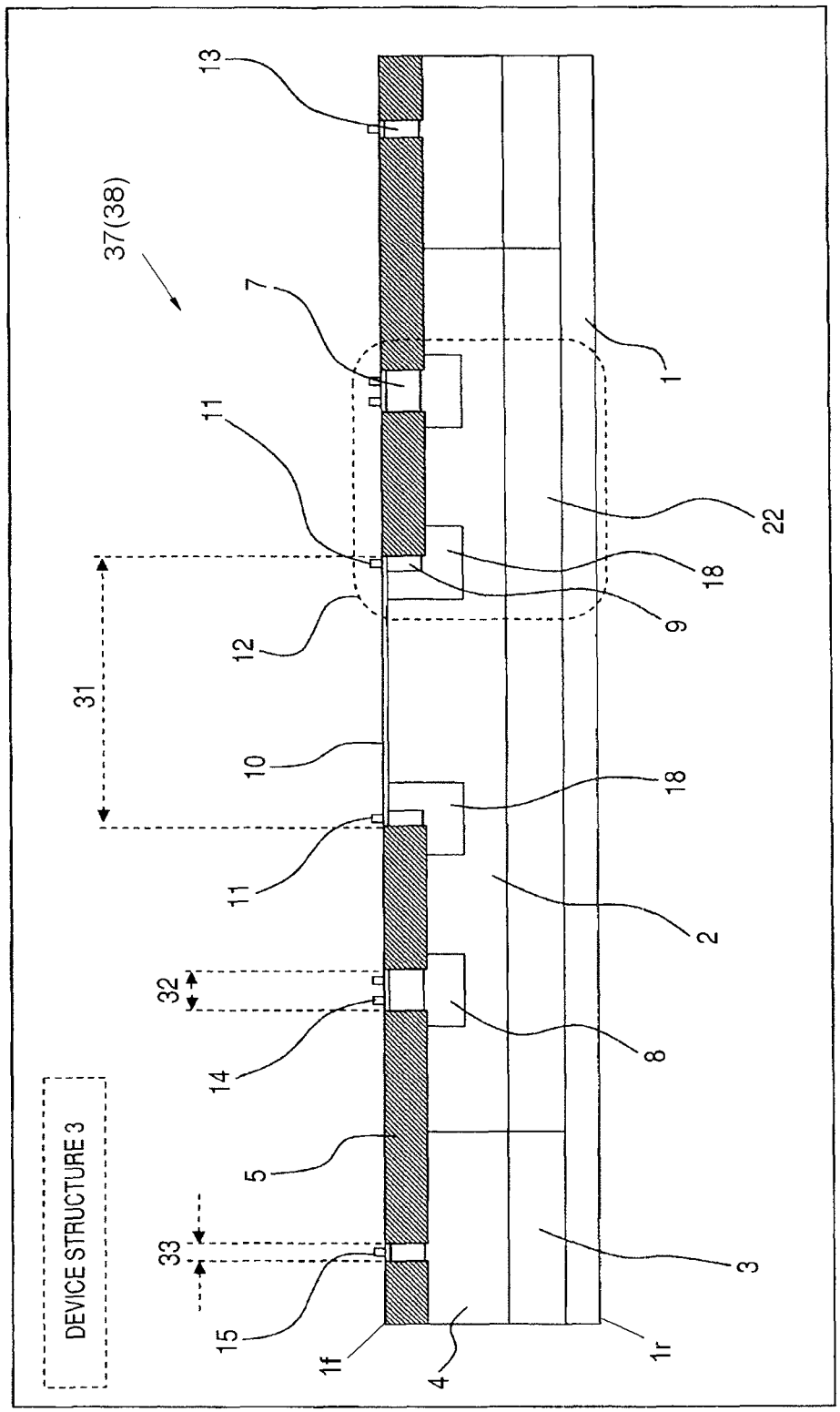
FIG. 15 is a cross-sectional structural view of an embedded Schottky barrier diode (device structure 3) in the semiconductor integrated circuit device according to an embodiment of the present invention.
Figure 16:
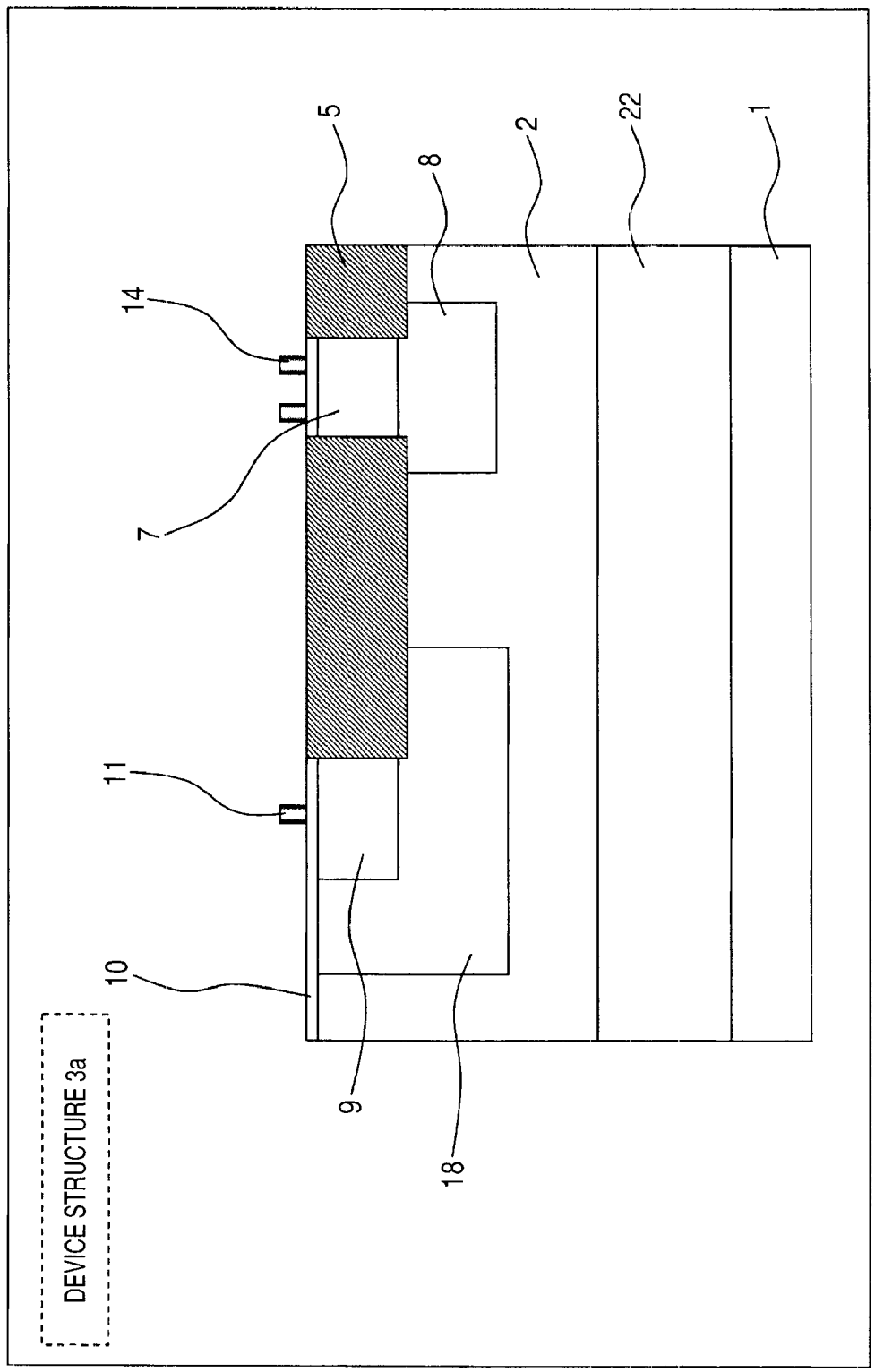
FIG. 16 is an enlarged cross-sectional structural view of the principal region 12 of an embedded Schottky barrier diode (device structure 3a) in the semiconductor integrated circuit device according to an embodiment of the present invention.
Figure 17:
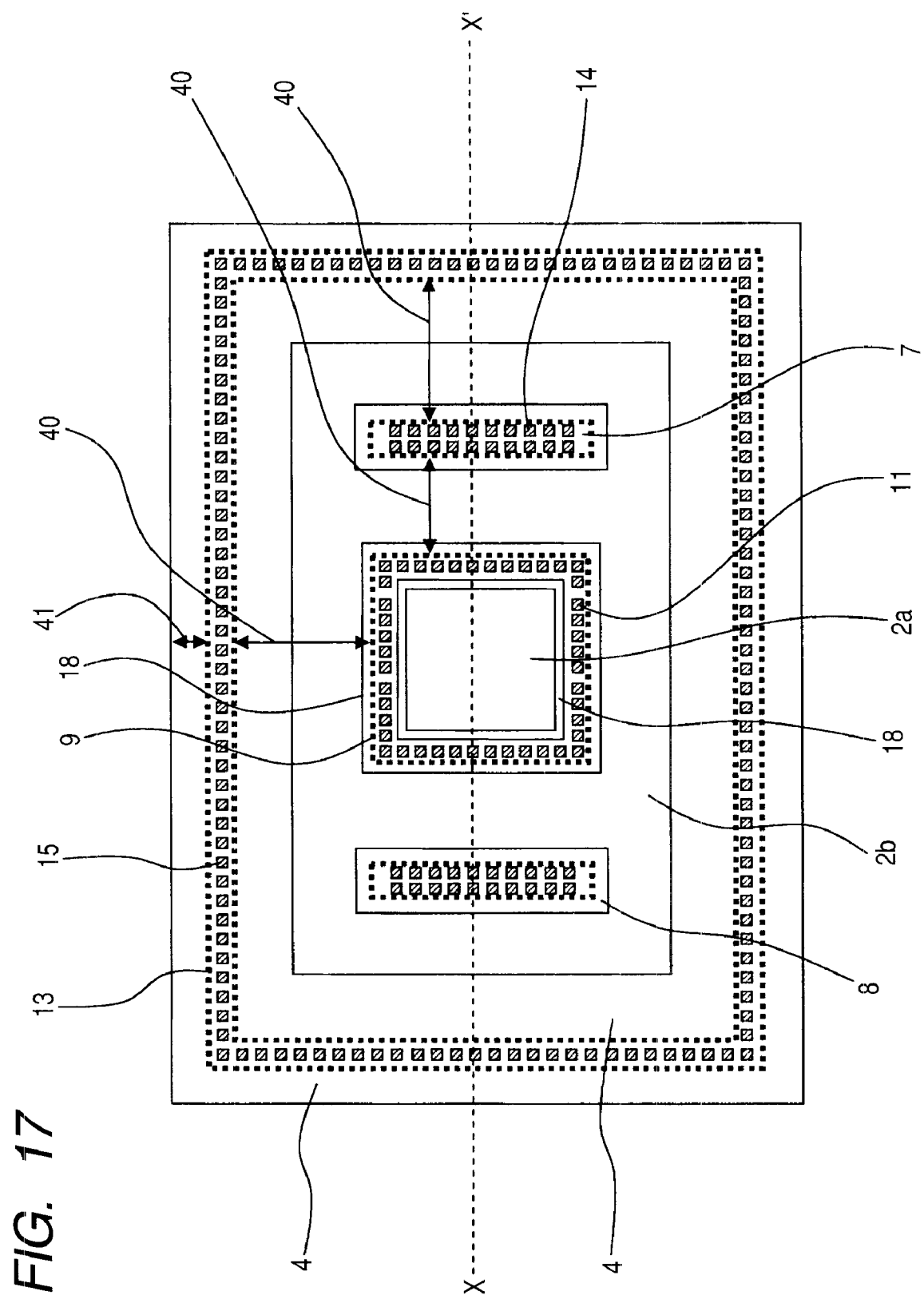
FIG. 17 is a top structural view in which the X-X' cross section of the embedded Schottky barrier diode (device structure 3a) in the semiconductor integrated circuit device according to the embodiment of the present invention corresponds to FIG. 15.

FIG. 15 is a cross-sectional structural view of an embedded Schottky barrier diode (device structure 3a) in the semiconductor integrated circuit device according to an embodiment of the present invention. FIG. 16 is an enlarged cross-sectional view of the principal region 12 of the embedded Schottky barrier diode (device structure 3a) in the semiconductor integrated circuit device according to the embodiment of the present invention. FIG. 17 is a top structural view in which the X-X' cross section of the embedded Schottky barrier diode (device structure 3a) in the semiconductor integrated circuit device according to the embodiment of the present invention corresponds to FIG. 15. Based on these drawings, the device structure 3a mentioned above will be described.

In this example, as shown in FIGS. 15 and 16, a P-type semiconductor region 18 (i.e., a first P-type impurity region) lower in impurity concentration than the high-concentration P-type guard ring region 9 is provided therearound in order to improve the reverse breakdown voltage. When there is the P-type buried region 3 under the N-type semiconductor region 2 as shown in FIG. 2, punch-through is likely to occur so that, e.g., an N-type buried semiconductor region 22 lower in impurity concentration than the N-type semiconductor region 2 is preferably provided instead.

The SBD structure is characterized in that, since the P-type semiconductor region 18 (electric-field attenuating region) lower in impurity concentration than the high-concentration P-type guard ring region 9 is provided therearound, the reverse breakdown voltage can be improved. In addition, since the N-type buried semiconductor region 22 lower in impurity concentration than the N-type semiconductor region 2, not the P-type buried region 3, is provided under the N-type semiconductor region 2, the advantage of allowing a reduction in the resistance of a forward current path is offered.

3b. Description of Embedded Schottky Barrier Diode (Device Structure 3b, i.e., "Guard Ring Attenuating Region Plus 2-Row Arrangement") in Semiconductor Integrated Circuit Device of Embodiment of Present Invention, etc. (Primarily Using FIGS. 15, 18, and 19)

This example is still another variation of the vertical structure in the example of the section 3a based on the examples of the sections 1a to 1d, 2a, and 2b described above so that only different parts will be described.

Figure 18:
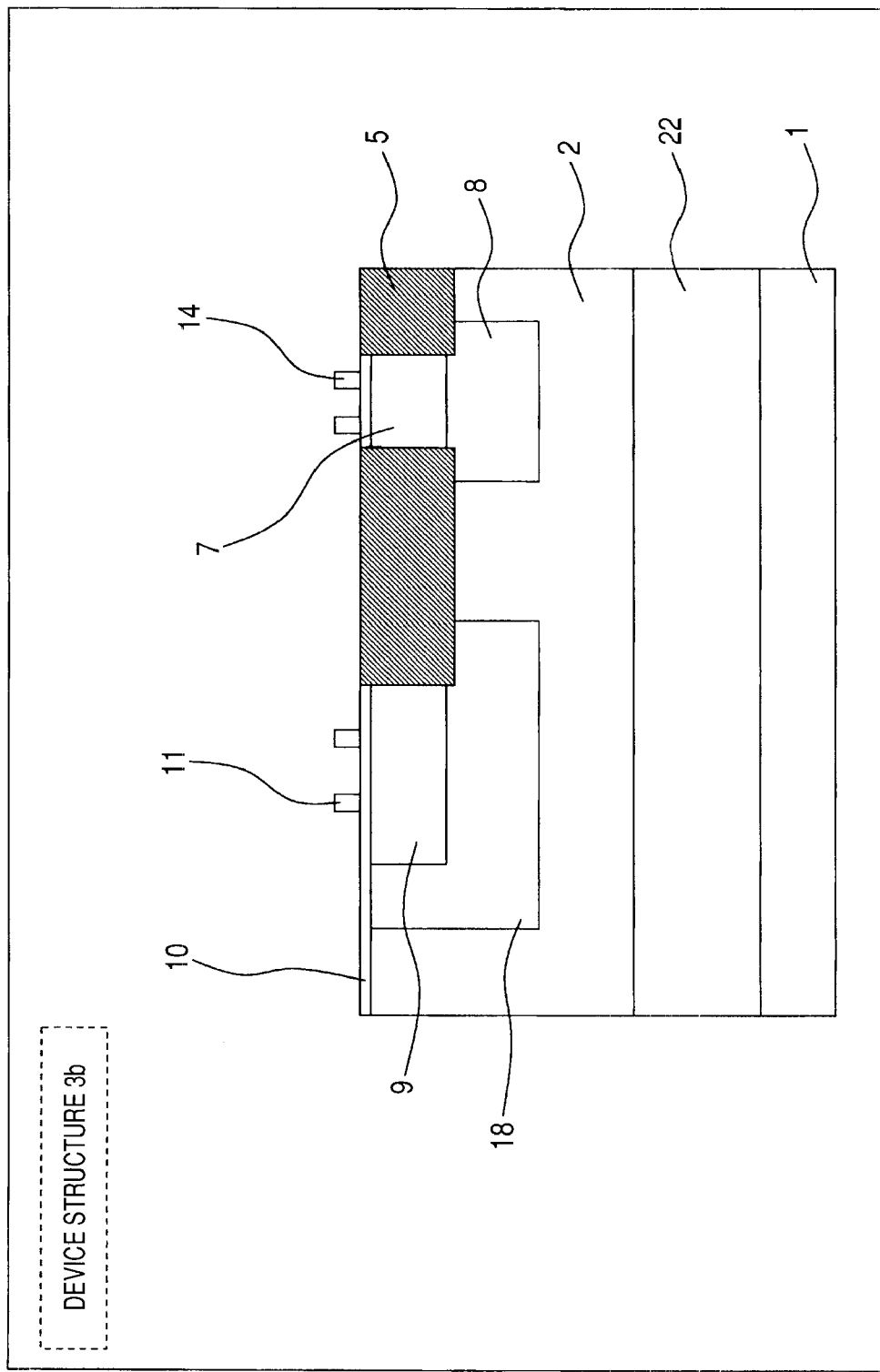
FIG. 18 is an enlarged cross-sectional structural view of the principal region 12 of an embedded Schottky barrier diode (device structure 3b) in the semiconductor integrated circuit device according to an embodiment of the present invention.
Figure 19:
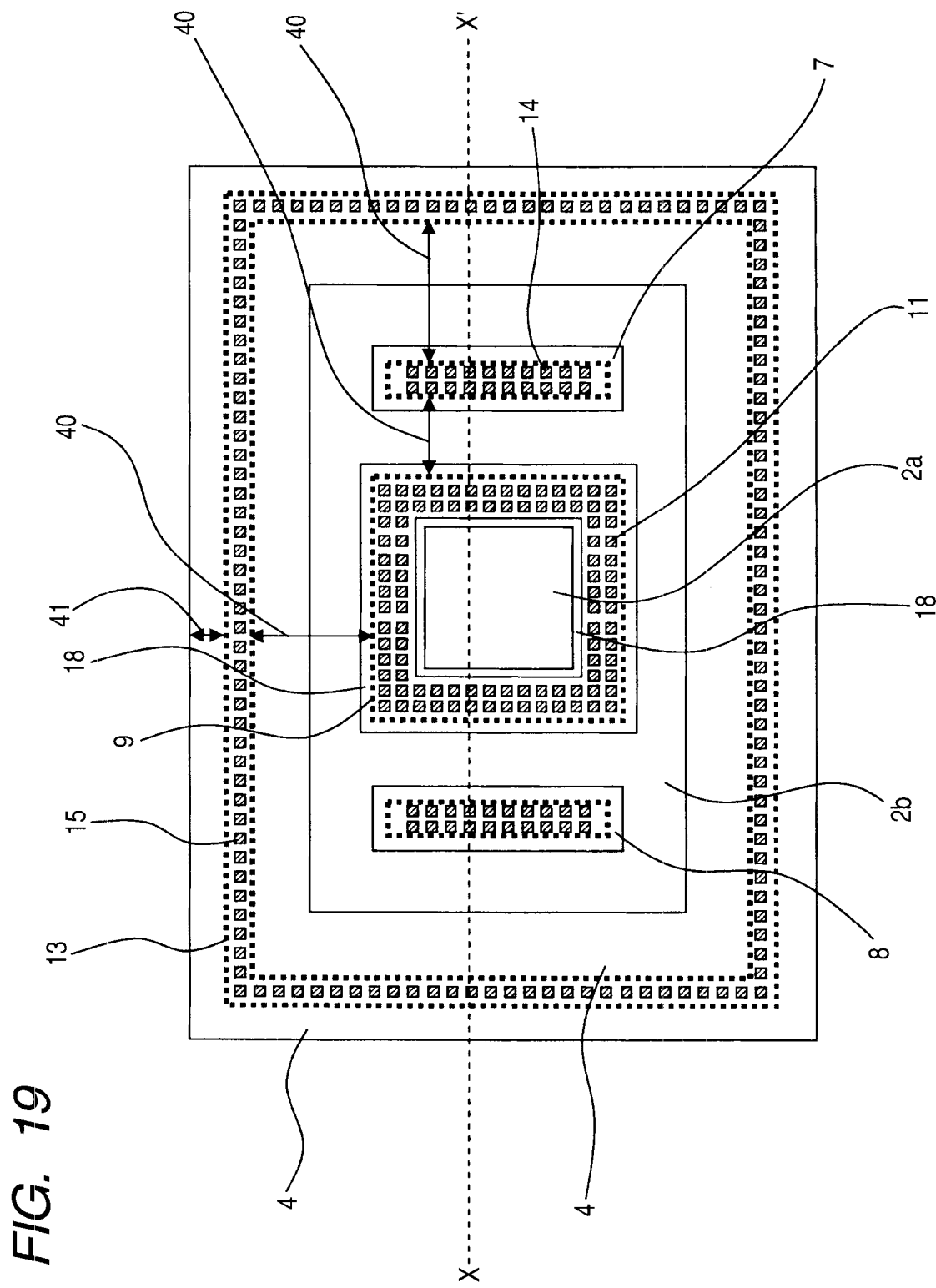
FIG. 19 is a top structural view in which the X-X' cross section of the embedded Schottky barrier diode (device structure 3b) in the semiconductor integrated circuit device according to the embodiment of the present invention corresponds to FIG. 15.

FIG. 18 is an enlarged cross-sectional structural view of the principal region 12 of an embedded Schottky barrier diode (device structure 3b) in the semiconductor integrated circuit device according to an embodiment of the present invention. FIG. 19 is a top structural view in which the X-X' cross section of the embedded Schottky barrier diode (device structure 3b) in the semiconductor integrated circuit device according to the embodiment of the present invention corresponds to FIG. 15.

In this example, as shown in FIGS. 18 and 19, the contact electrodes 11 are arranged in two rows (a plurality of rows) over the P-type guard ring region 9 in order to ensure a sufficient current capacitance, in the same manner as in the example of the section 1b or 2b.

3c. Description of Embedded Schottky Barrier Diode (Device Structure 3c, i.e., "Guard Ring Attenuating Region Plus Grid-Like Arrangement") in Semiconductor Integrated Circuit Device of Embodiment of Present Invention, etc. (Primarily Using FIGS. 15, 20, and 21)

This example is yet another variation of the vertical structure in each of the examples of the sections 3a and 3b based on the examples of the sections 1a to 1d, 2a, and 2b described above so that only different parts will be described.

Figure 20:
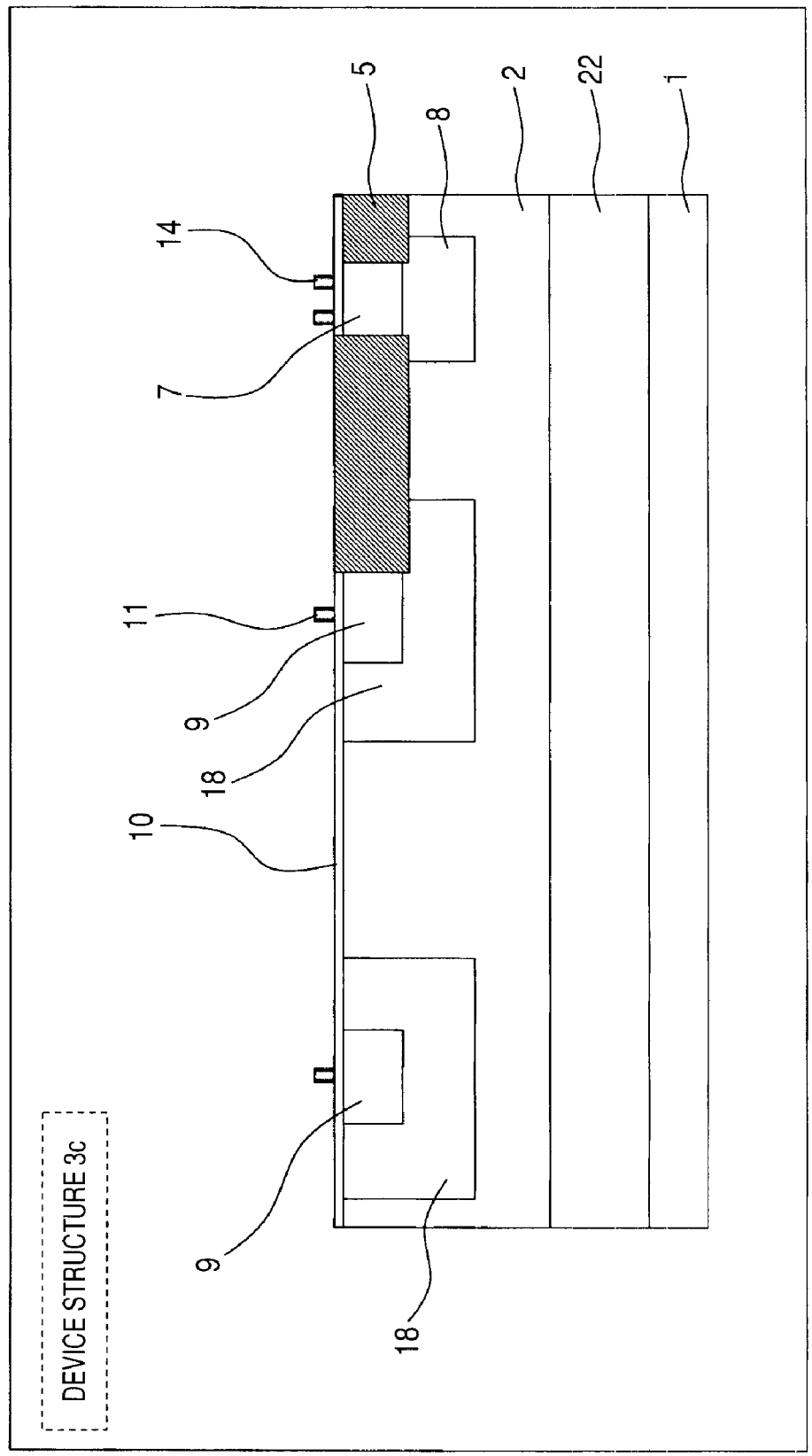
FIG. 20 is an enlarged cross-sectional structural view of the principal region 12 and its vicinity of an embedded Schottky barrier diode (device structure 3c) in the semiconductor integrated circuit device according to an embodiment of the present invention.
Figure 21:
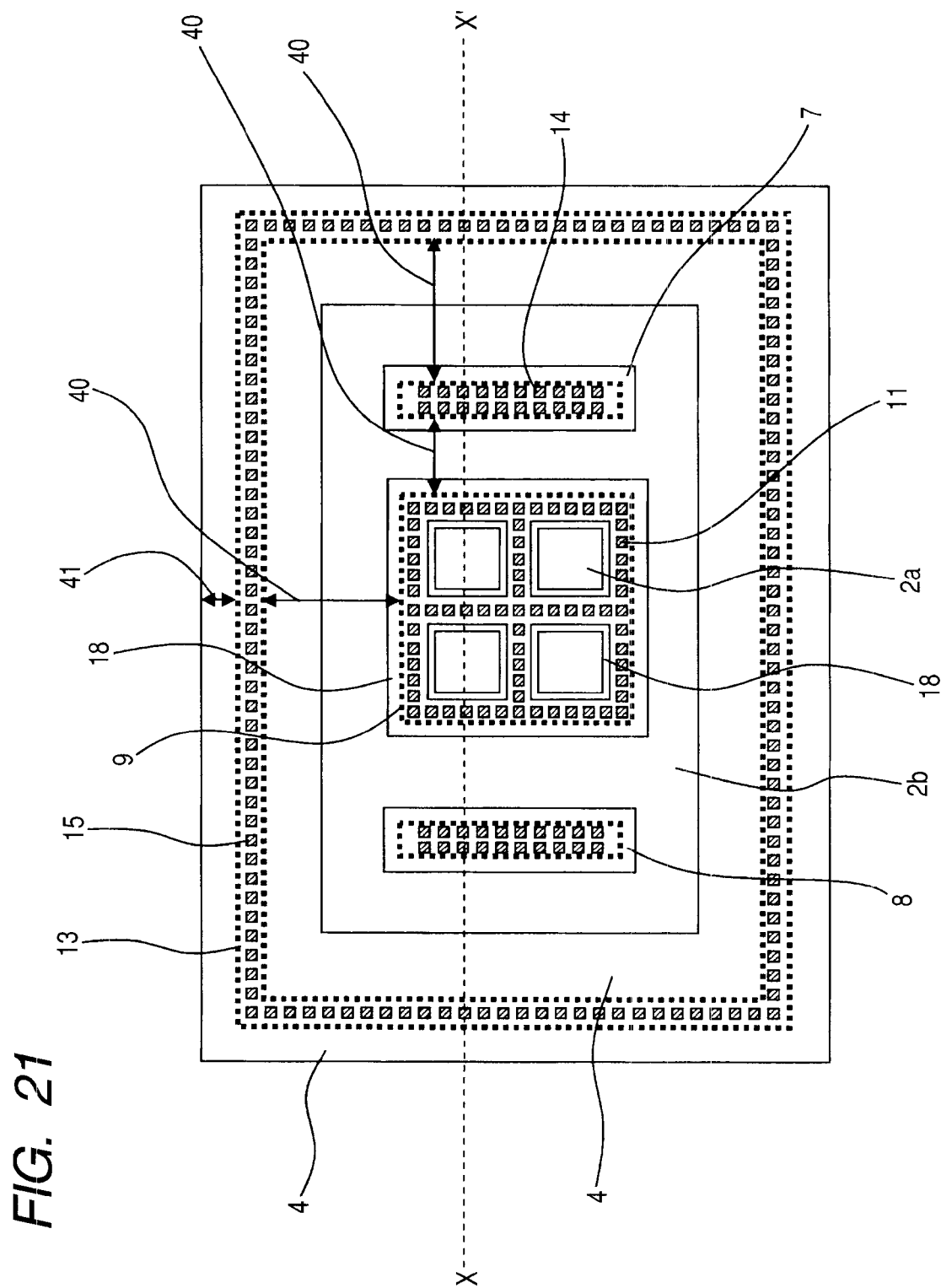
FIG. 21 is a top structural view in which the X-X' cross section of the embedded Schottky barrier diode (device structure 3c) in the semiconductor integrated circuit device according to the embodiment of the present invention corresponds to FIG. 15.

FIG. 20 is an enlarged cross-sectional structural view of the principal region 12 and its vicinity of an embedded Schottky barrier diode (device structure 3c) in the semiconductor integrated circuit device according to an embodiment of the present invention. FIG. 21 is a top structural view in which the X-X' cross section of the embedded Schottky barrier diode (device structure 3c) in the semiconductor integrated circuit device according to the embodiment of the present invention corresponds to FIG. 15.

In this example, as shown in FIGS. 20 and 21, the P-type guard ring region 9 including the attenuating region 18 is formed in a grid-like plan configuration (top configuration) or two-dimensional multiply coupled plan configuration in which the member of inner openings is not less than 2 in order to ensure a sufficient current capacitance, and provide a uniform current distribution within the N-type semiconductor region 2, in the same manner as in the example of the section 1. In this case, it is particularly preferable to set the number of inner openings to a value of not less than 4.

4. Description of Method of Manufacturing Semiconductor Integrated Circuit Device of Embodiment of Present Invention (Primarily Using FIGS. 22 to 38, 39 to 52, 53 to 65, 66 to 76, 77 to 86, and 87.

A method of manufacturing the semiconductor integrated circuit device having the embedded Schottky barrier diode described thus far in each of the foregoing sections will be described using the cases where the device structures 1a, 2, and 3a are provided as examples. FIG. 87 is a correspondence illustrating table which illustrates correlations among device cross-sectional flow charts, which will be described hereinbelow. In this table, the first column (exclusive of the No. column in the same manner as in the following description) shows the unit steps (such as a, b, and c) of a process. Each of the unit steps typically includes a plurality of sub-steps (element steps). The second column shows views illustrating a low-breakdown-voltage CMOS FET portion and an intermediate-breakdown-voltage CMOS FET portion (a PMOS FET portion is shown as an example of the intermediate-breakdown-voltage CMOS FET portion). The third column shows views illustrating a high-breakdown-voltage CMOS FET portion (an NMOS FET portion is shown as an example). The fourth, fifth, and sixth columns show views illustrating the respective SBD portions corresponding to the device structures 1, 2, and 3. The description has been given herein on the assumption that the portions shown in these second to sixth columns are in the same chip region of the same wafer (not all the types of SBDs need necessarily be on the same wafer or in the same chip region). That is, because the process of manufacturing the semiconductor integrated circuit device, especially a wafer process, is basically performed in units of one wafer or one batch including a plurality of wafers, it can be considered that the individual portions over the same wafer are simultaneously processed. For example, exposure to light is typically performed in units of one shot. However, when exposure steps for the wafer are collectively viewed, it can be said that the exposure steps are substantially simultaneously performed in the same process. When the element steps each having the same name are performed for different columns (the second to sixth columns), it is shown that the elements steps are performed substantially simultaneously. The description will be given hereinbelow in the order of steps.

(1) Step a (Formation of Isolation Trench)

Figure 22:
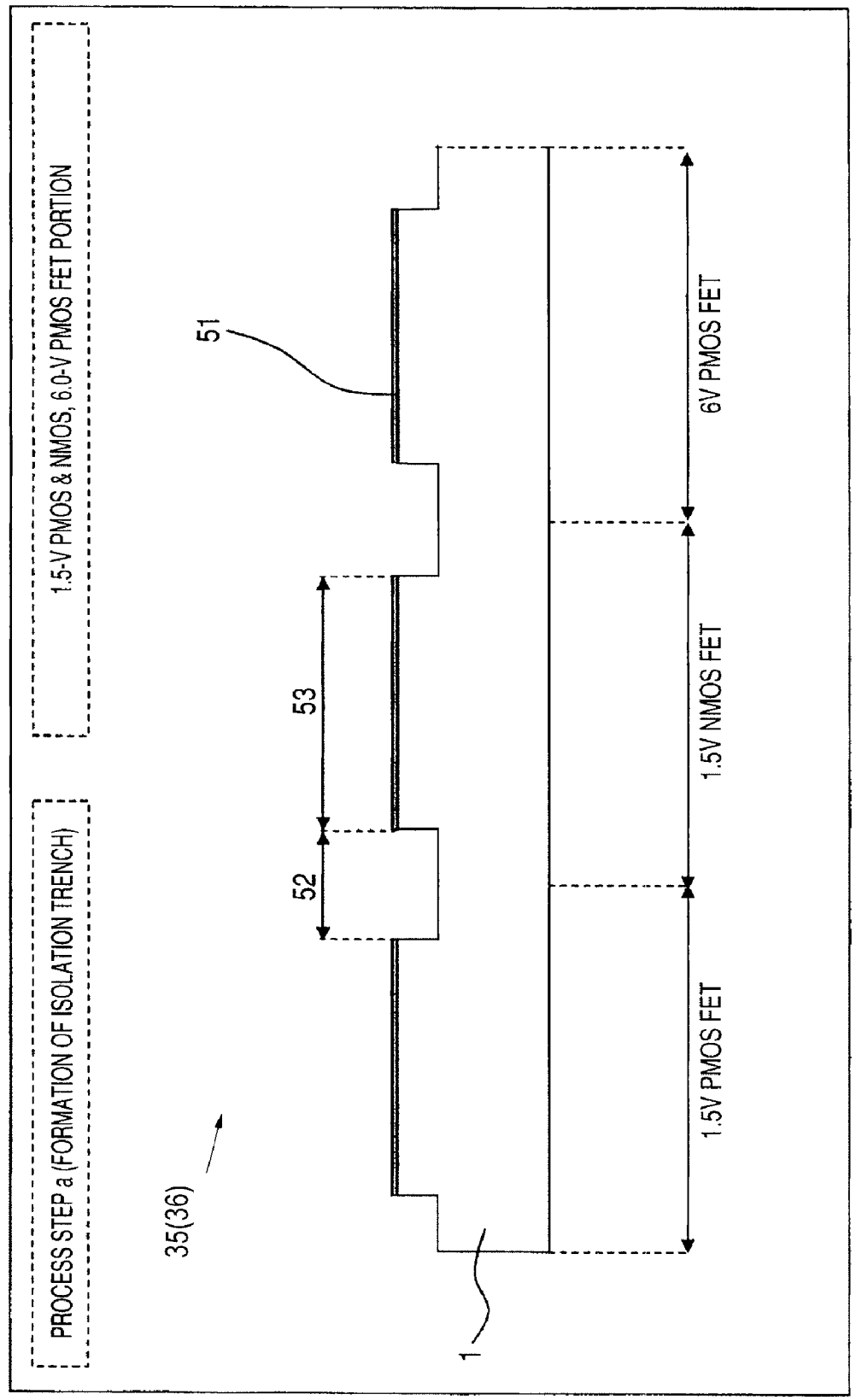
FIG. 22 is a device cross-sectional view (process step a) illustrating a process flow in a method of manufacturing the semiconductor integrated circuit device according to the embodiment of the present invention which is related to a low-breakdown-voltage portion and an intermediate-breakdown-voltage portion (only a PMOS FET portion is shown by way of example in the same manner as in the subsequent drawings)

FIG. 22 is a device cross-sectional view (process step a) illustrating a process flow in the method of manufacturing the semiconductor integrated circuit device according to the embodiment of the present invention which is related to a low-breakdown-voltage portion and an intermediate-breakdown-voltage portion (only the PMOS FET portion is shown by way of example in the same manner as in the subsequent drawings).

As shown in FIG. 22, silicon nitride 51 deposited by CVD is patterned by typical lithography over a thermal oxide film over the device principal surface (first principal surface) of the P-type single-crystal silicon substrate 1 (which is assumed herein to be, e.g., a 300-φ wafer, but may also be a 450-φ wafer or a less-than-300-φ wafer) so as to be left over an active region (where elements are primarily formed). Using the patterned silicon nitride 51 as a mask, a STI isolation trench 52 is formed over the principal surface of the substrate 1 by dry etching.

Next, a high-breakdown-voltage portion will be described. The high-breakdown-voltage portion forms the CMOS integrated circuit portion 35 in conjunction with the low-breakdown-voltage portion and the intermediate-breakdown-voltage portion, each described above. The region of the first principal surface if over which the CMOS integrated circuit portion 35 is provided is a first region 36.

Figure 39:
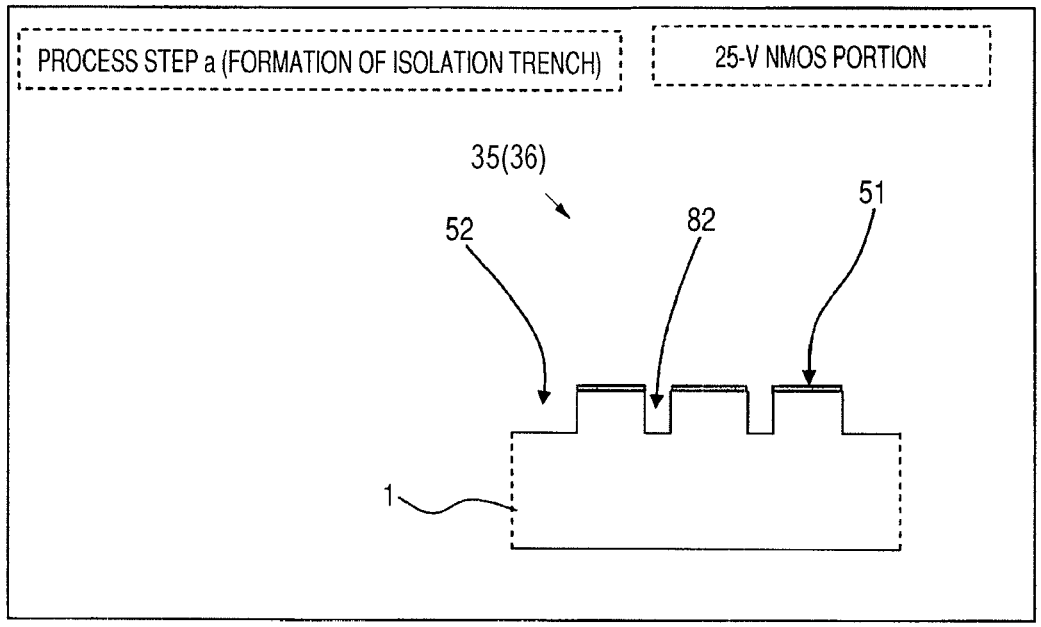
FIG. 39 is a device cross-sectional view (process step a) illustrating a process flow in the method of manufacturing the semiconductor integrated circuit device according to the embodiment of the present invention which is related to a high-breakdown-voltage portion (only an NMOS FET portion is shown by way of example in the same manner as in the subsequent drawings)

FIG. 39 is a device cross-sectional view (process step a) illustrating a process flow in the method of manufacturing the semiconductor integrated circuit device according to the embodiment of the present invention which is related to the high-breakdown-voltage portion (only the NMOS FET portion is shown by way of example in the same manner as in the subsequent drawings).

As shown in FIG. 39, buried gate insulating film trenches 82 are formed simultaneously with the formation of the STI isolation trench 52.

Next, the SBD portion (device structure 1) will be described. This portion (including each of the SBD portions shown below) forms the Schottky barrier diode portion 37. The region of the first principal surface if over which the Schottky barrier diode portion 37 is provided is a second region 38.

Figure 53:
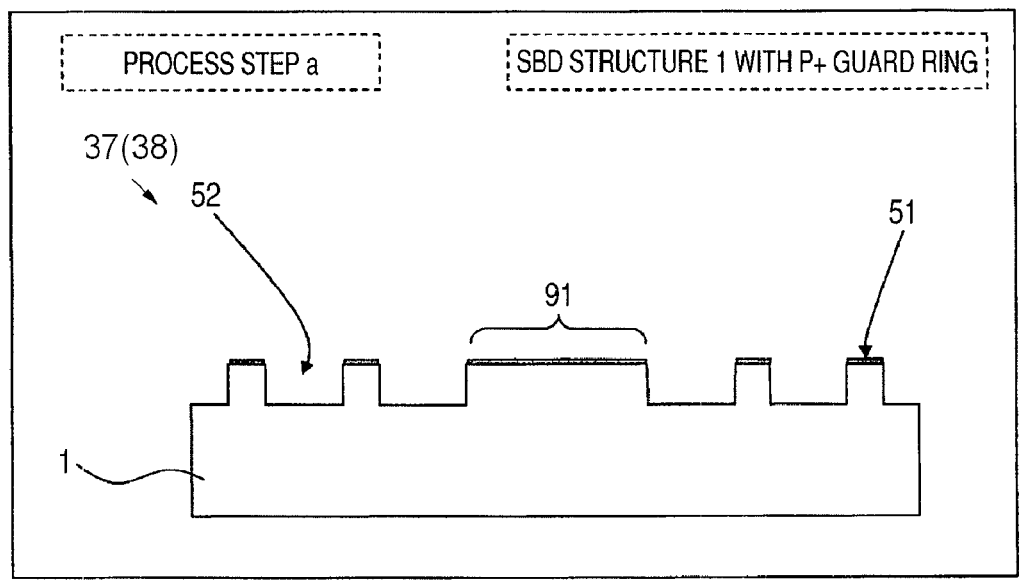
FIG. 53 is a device cross-sectional view (process step a) illustrating a process flow in the method of manufacturing the semiconductor integrated circuit device according to the embodiment of the present invention which is related to a SBD portion (device structure 1)

FIG. 53 is a device cross-sectional view (process step a) illustrating a process flow in the method of manufacturing the semiconductor integrated circuit device according to the embodiment of the present invention which is related to the SBD portion (device structure 1).

As shown in FIG. 53, the STI isolation trench 52 is formed in the peripheral edge of an anode portion 91 in the SBD portion.

As for the SBD portions (device structures 2 and 3), they are substantially the same as the SBD portion (device structure 1) mentioned above so that the description thereof will not be repeated.

(2) Step b (Filling of Isolation Trench)

Figure 23:
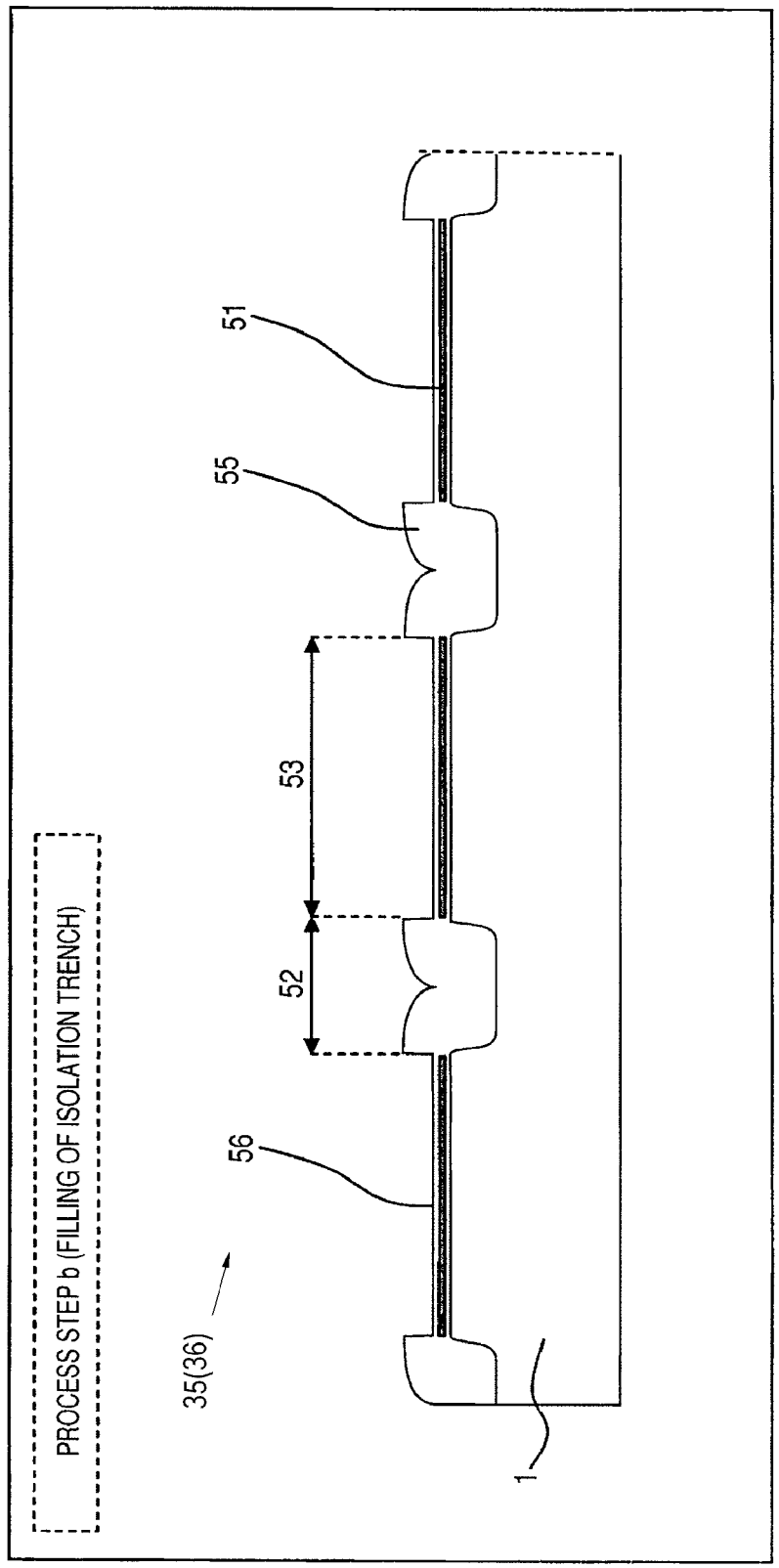
FIG. 23 is a device cross-sectional view (process step b) illustrating the process flow in the method of manufacturing the semiconductor integrated circuit device according to the embodiment of the present invention which is related to the low-breakdown-voltage portion and the intermediate-breakdown-voltage portion.

FIG. 23 is a device cross-sectional view (process step b) illustrating the process flow in the method of manufacturing the semiconductor integrated circuit device according to the embodiment of the present invention which is related to the low-breakdown-voltage portion and the intermediate-breakdown-voltage portion.

As shown in FIG. 23, after a CVD silicon dioxide film 55 is formed over the entire surface, reverse pattern etching for subsequent CMP is performed using the entire surface, reverse pattern etching for subsequent CMP is performed using a black-and-white inversion resist pattern for STI trench etching. A thin thermal oxide film 56 remains over the silicon nitride 51.

Figure 40:
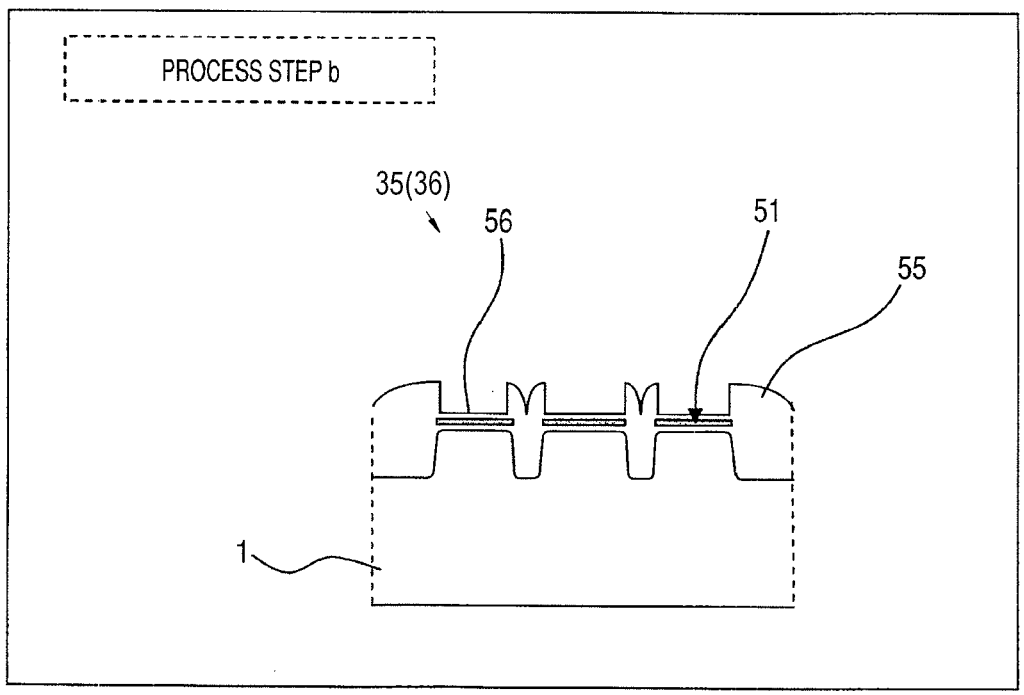
FIG. 40 is a device cross-sectional view (process step b) illustrating the process flow in the method of manufacturing the semiconductor integrated circuit device according to the embodiment of the present invention which is related to the high-breakdown-voltage portion.

Next, the high-breakdown-voltage portion will be described. FIG. 40 is a device cross-sectional view (process step b) illustrating the process flow in the method of manufacturing the semiconductor integrated circuit device according to the embodiment of the present invention which is related to the high-breakdown-voltage portion.

As shown in FIG. 40, reverse pattern etching is also similarly performed with respect to this portion.

Figure 54:
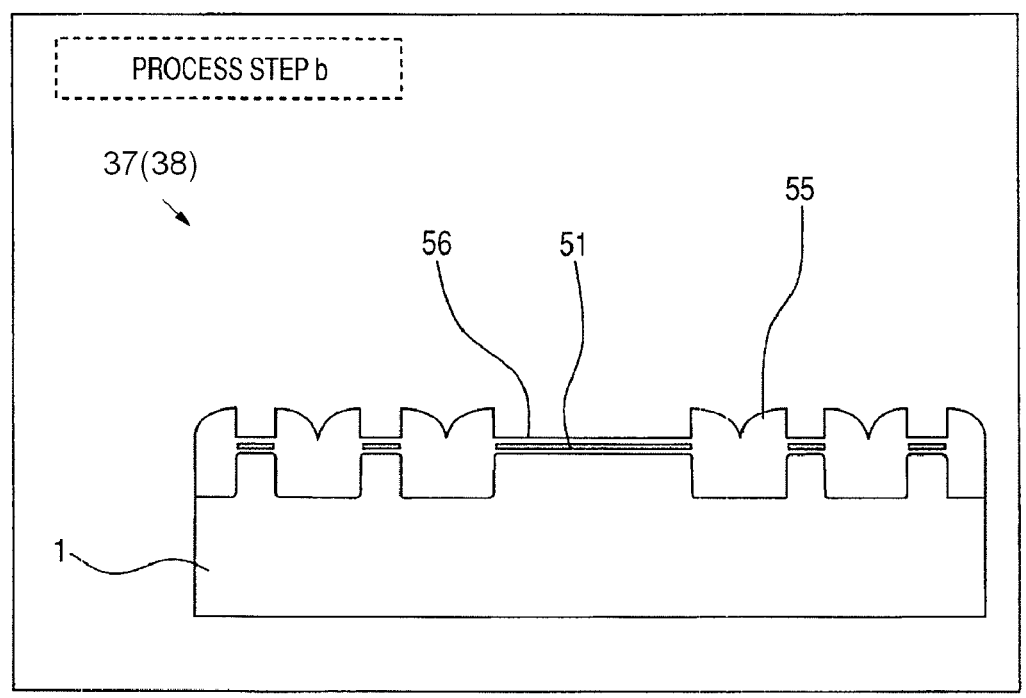
FIG. 54 is a device cross-sectional view (process step b) illustrating the process flow in the method of manufacturing the semiconductor integrated circuit device according to the embodiment of the present invention which is related to the SBD portion (device structure 1)

Next, the SBD portion (device structure 1) will be described. FIG. 54 is a device cross-sectional view (process step b) illustrating the process flow in the method of manufacturing the semiconductor integrated circuit device according to the embodiment of the present invention which is related to the SBD portion (device structure 1).

As shown in FIG. 54, the CVD silicon dioxide film 55 is formed also in the SBD portion, and then reverse pattern etching for the subsequent CMP is performed using the black-and-white inversion resist pattern for the STI trench etching, in the same manner as in FIG. 23. The thin thermal oxide film 56 remains over the silicon nitride 51.

As for the SBD portions (device structures 2 and 3), they are substantially the same as the SBD portion (device structure 1) mentioned above so that the description thereof will not be repeated.

(3) Step c (Formation of N-Type Deep Well)

Figure 24:
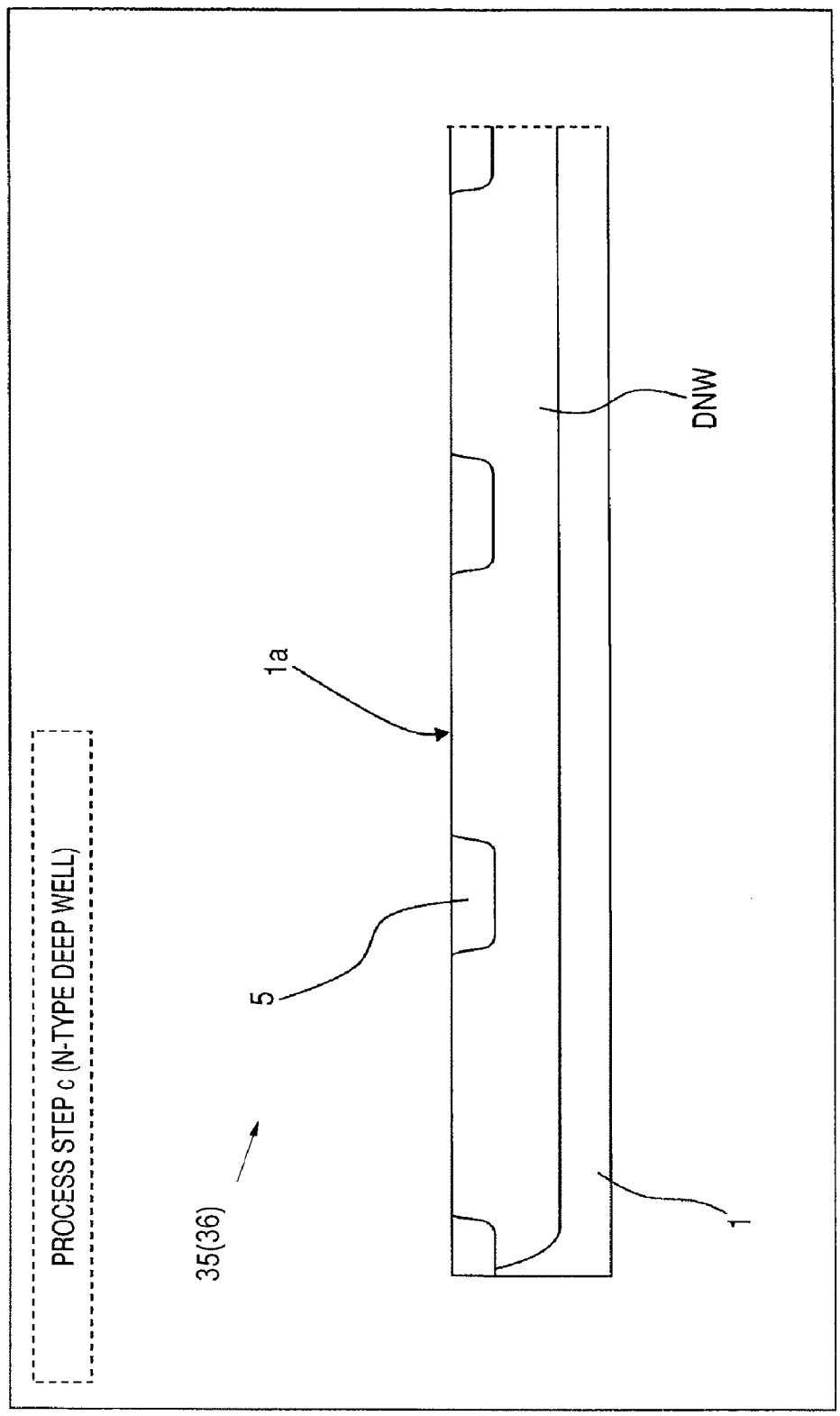
FIG. 24 is a device cross-sectional view (process step c) illustrating the process flow in the method of manufacturing the semiconductor integrated circuit device according to the embodiment of the present invention which is related to the low-breakdown-voltage portion and the intermediate-breakdown-voltage portion.

FIG. 24 is a device cross-sectional view (process step c) illustrating the process flow in the method of manufacturing the semiconductor integrated circuit device according to the embodiment of the present invention which is related to the low-breakdown-voltage portion and the intermediate-breakdown-voltage portion.

As shown in FIG. 24, the first principal surface 1a is planarized by a CMP process such that the field insulating film 5 is left in the trench. Then, an N-type impurity is ion planted to form the N-type deep well region DNW having a relatively low impurity concentration in a predetermined portion.

Figure 41:
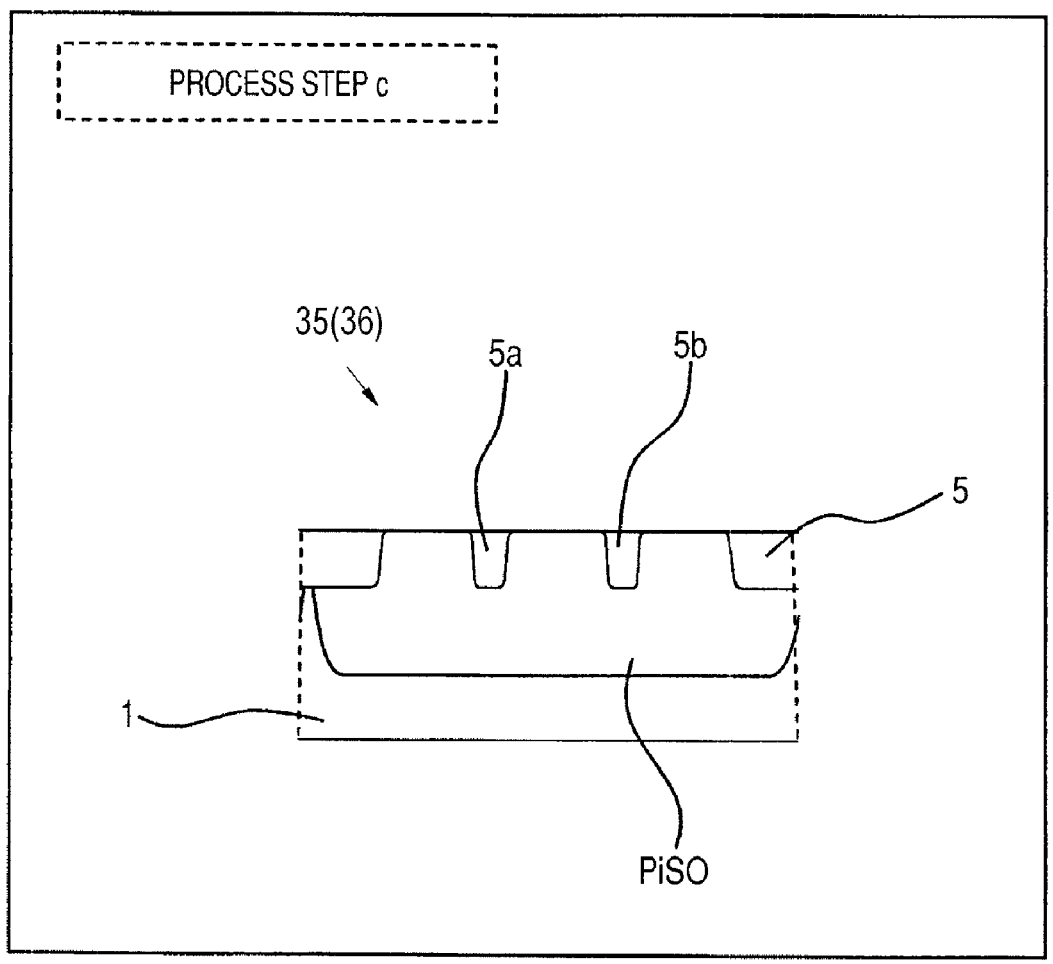
FIG. 41 is a device cross-sectional view (process step c) illustrating the process flow in the method of manufacturing the semiconductor integrated circuit device according to the embodiment of the present invention which is related to the high-breakdown-voltage portion.

Next, the high-breakdown-voltage portion will be described. FIG. 41 is a device cross-sectional view (process step c) illustrating the process flow in the method of manufacturing the semiconductor integrated circuit device according to the embodiment of the present invention which is related to the high-breakdown-voltage portion.

As shown in FIG. 41, prior to the ion implantation for the N-type deep well DNW, a P-type impurity is ion implanted to form a P-type deep well region PiSO (referred to also as "P-type isolation region" depending on the location thereof) having a relatively low impurity concentration in the predetermined part of the high-breakdown-voltage portion. By the planarization process mentioned above, buried gate insulating films 5a and 5b are formed in the buried gate insulating film trenches 82.

Figure 55:
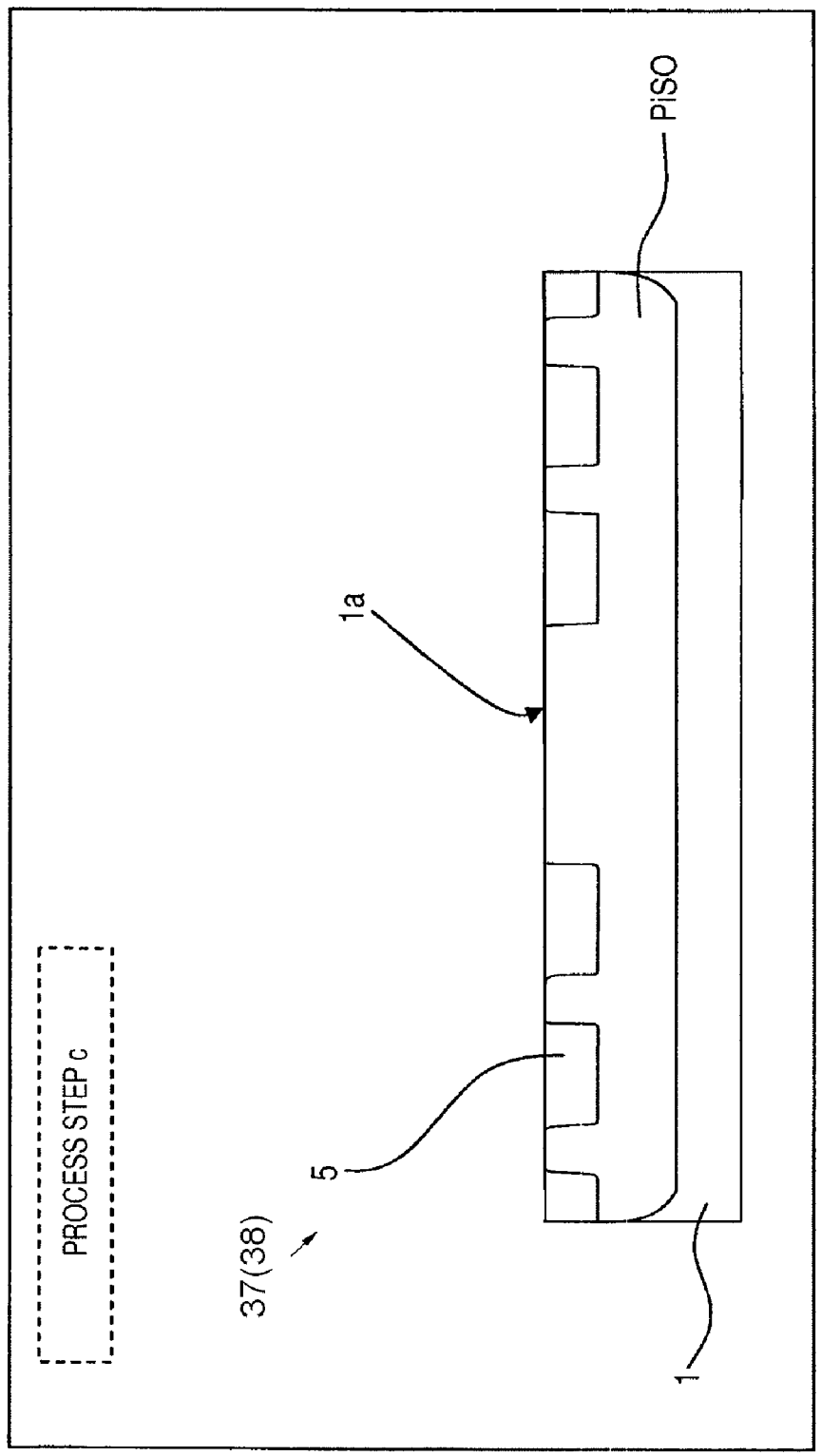
FIG. 55 is a device cross-sectional view (process step c) illustrating the process flow in the method of manufacturing the semiconductor integrated circuit device according to the embodiment of the present invention which is related to the SBD portion (device structure 1)

Next, the SBD portion (device structure 1) will be described. FIG. 55 is a device cross-sectional view (process step c) illustrating the process flow in the method of manufacturing the semiconductor integrated circuit device according to the embodiment of the present invention which is related to the SBD portion (device structure 1).

As shown in FIG. 55, at the same time as the process related to the high-breakdown-voltage portion shown in FIG. 41, the P-type deep well region PiSO serving as the isolation region for the SBD portion is introduced.

Figure 66:
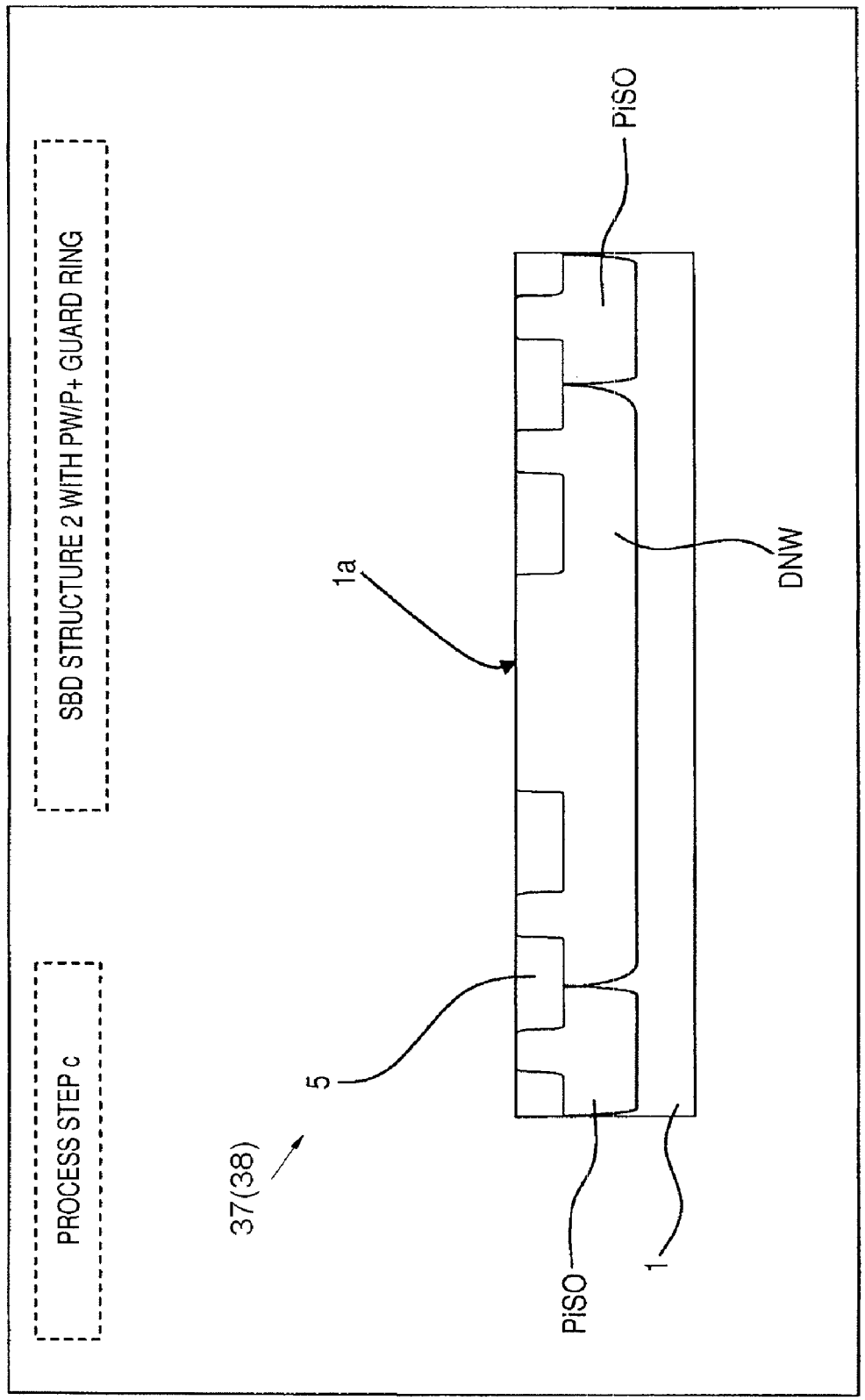
FIG. 66 is a device cross-sectional view (process step c) illustrating a process flow in the method of manufacturing the semiconductor integrated circuit device according to the embodiment of the present invention which is related to a SBD portion (device structure 2)

Next, the SBD portion (device structure 3) will be described. FIG. 66 is a device cross-sectional view (process step c) illustrating a process flow in the method of manufacturing the semiconductor integrated circuit device according to the embodiment of the present invention which is related to the SBD portion (device structure 3).

As shown in FIG. 66, at the same time as the process related to the high-breakdown-voltage portion shown in FIG. 41, the P-type deep well region PiSO serving as the isolation for the SBD portion is introduced.

As for the SBD portion (device structure 2), it is substantially the same as the SBD portion (device structure 3) mentioned above so that the description thereof will not be repeated.

(4) Step d (Formation of N-Type Inner Well)

Figure 25:
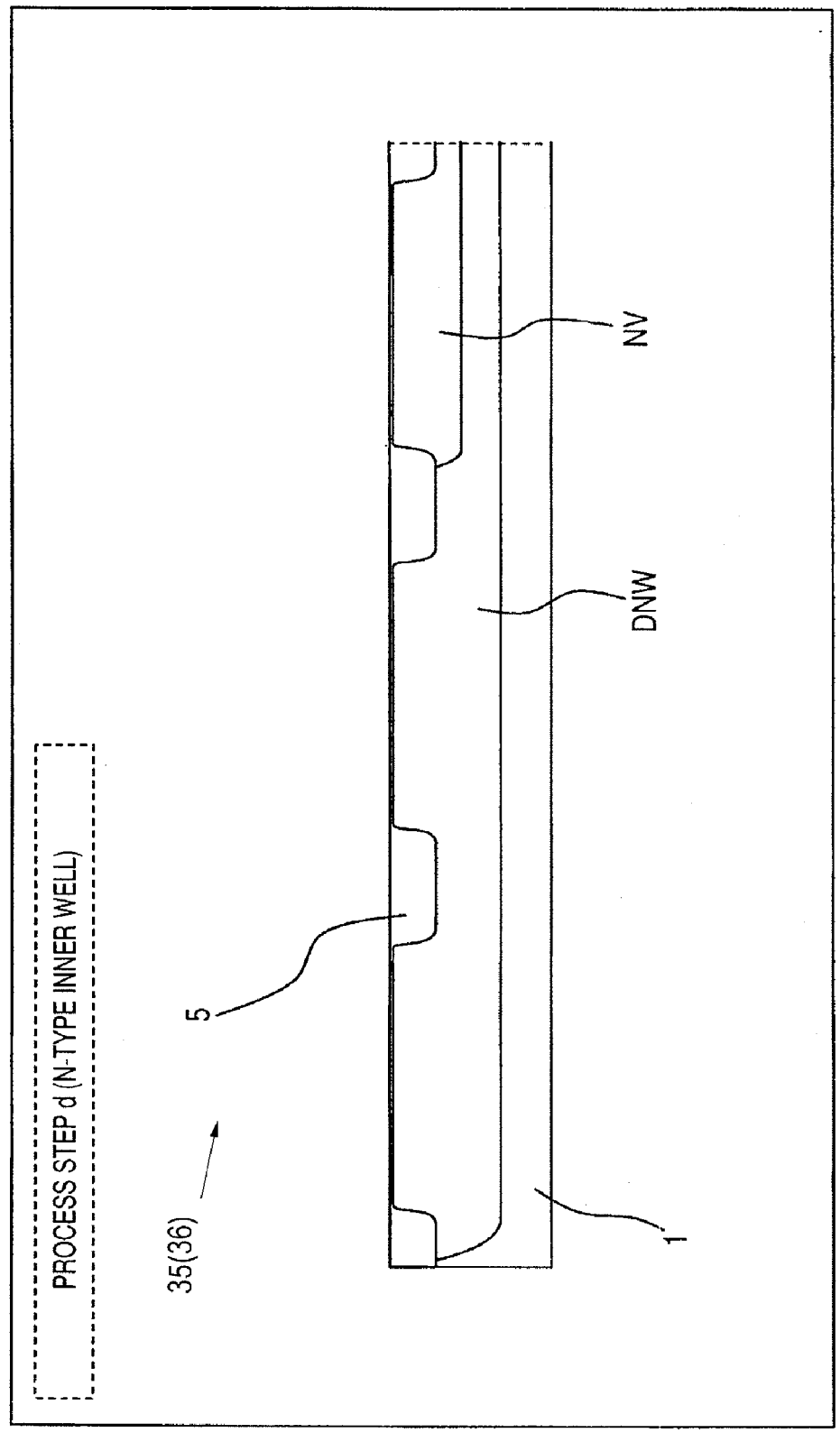
FIG. 25 is a device cross-sectional view (process step d) illustrating the process flow in the method of manufacturing the semiconductor integrated circuit device according to the embodiment of the present invention which is related to the low-breakdown-voltage portion and the intermediate-breakdown-voltage portion.

FIG. 25 is a device cross-sectional view (process step d) illustrating the process flow in the method of manufacturing the semiconductor integrated circuit device according to the embodiment of the present invention which is related to the low-breakdown-voltage portion and the intermediate-breakdown-voltage portion.

As shown in FIG. 25, an N-type impurity is ion implanted to form an inner well region NV higher in impurity concentration than the N-type deep well DNW.

Figure 42:
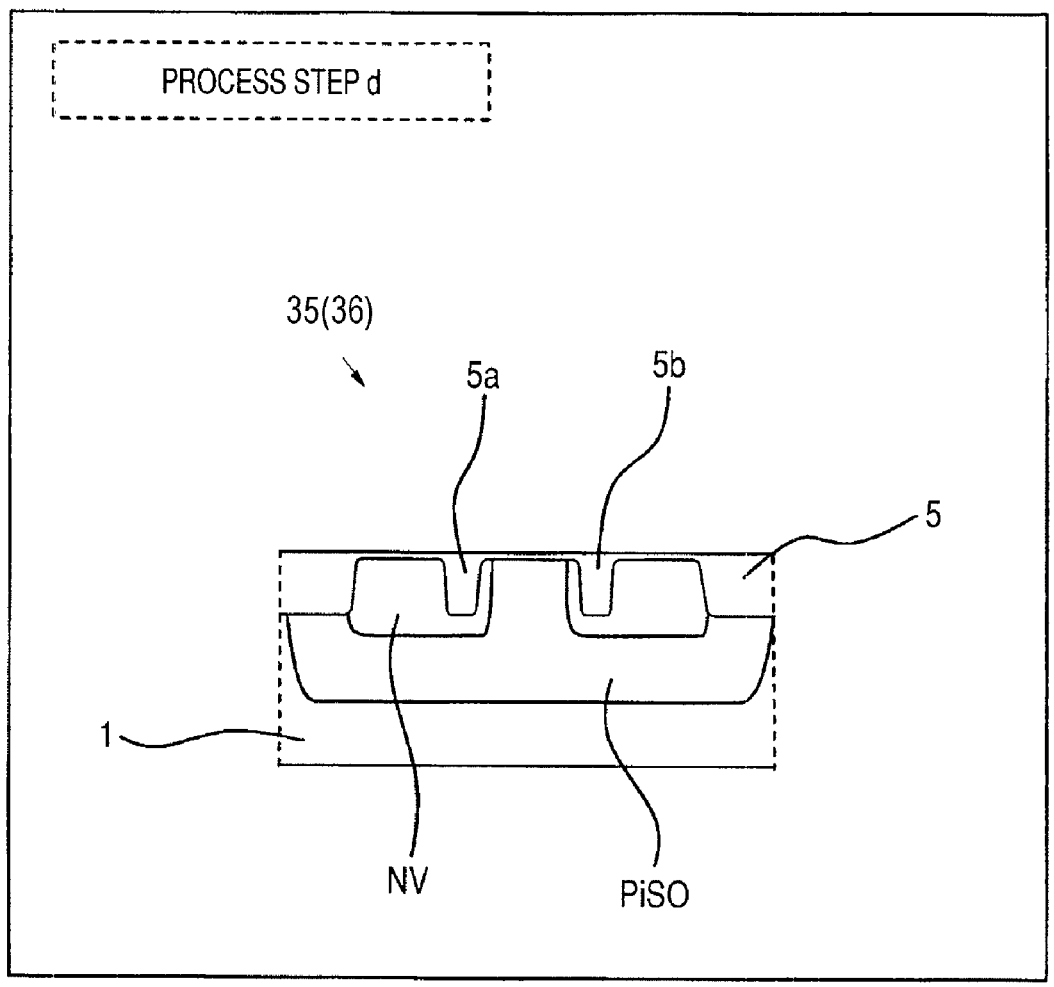
FIG. 42 is a device cross-sectional view (process step d) illustrating the process flow in the method of manufacturing the semiconductor integrated circuit device according to the embodiment of the present invention which is related to the high-breakdown-voltage portion.

Next, the high-breakdown-voltage portion will be described. FIG. 42 is a device cross-sectional view (process step d) illustrating the process flow in the method of manufacturing the semiconductor integrated circuit device according to the embodiment of the present invention which is related to the high-breakdown-voltage portion.

As shown in FIG. 42, the inner well region NV in the intermediate-breakdown-voltage portion is formed also in the high-breakdown-voltage portion at the same time as the ion implantation of the N-type impurity mentioned above to result in source/drain regions.

Figure 56:
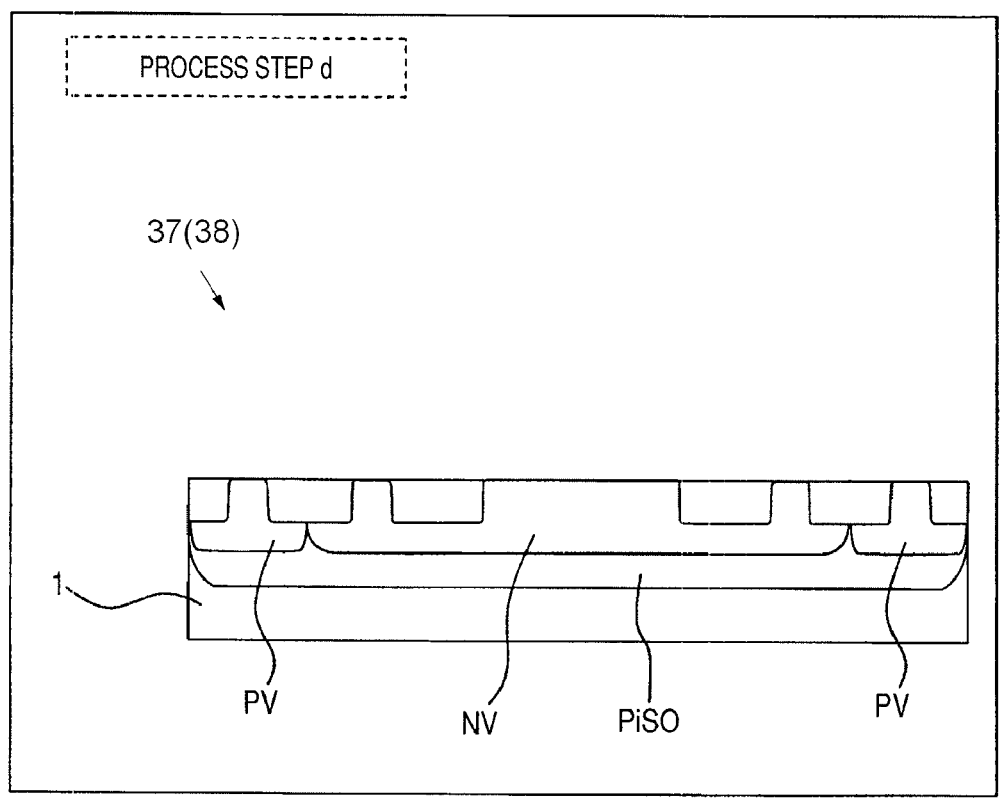
FIG. 56 is a device cross-sectional view (process step d) illustrating the process flow in the method of manufacturing the semiconductor integrated circuit device according to the embodiment of the present invention which is related to the SBD portion (device structure 1)

Next, the SBD portion (device structure 1) will be described. FIG. 56 is a device cross-sectional view (process step d) illustrating the process flow in the method of manufacturing the semiconductor integrated circuit device according to the embodiment of the present invention which is related to the SBD portion (device structure 1).

As shown in FIG. 56, the N-type impurity region NV serving as the cathode region of the SBD portion is formed simultaneously with the formation of the inner well region NV in the intermediate-breakdown-voltage portion. Further, at the same time as ion implantation for the P-type impurity region PV serving as the source/drain regions of the P-type MOSFET in the high-breakdown-voltage portion, the P-type impurity region PV serving as the peripheral isolation region of the SBD portion is introduced.

Figure 67:
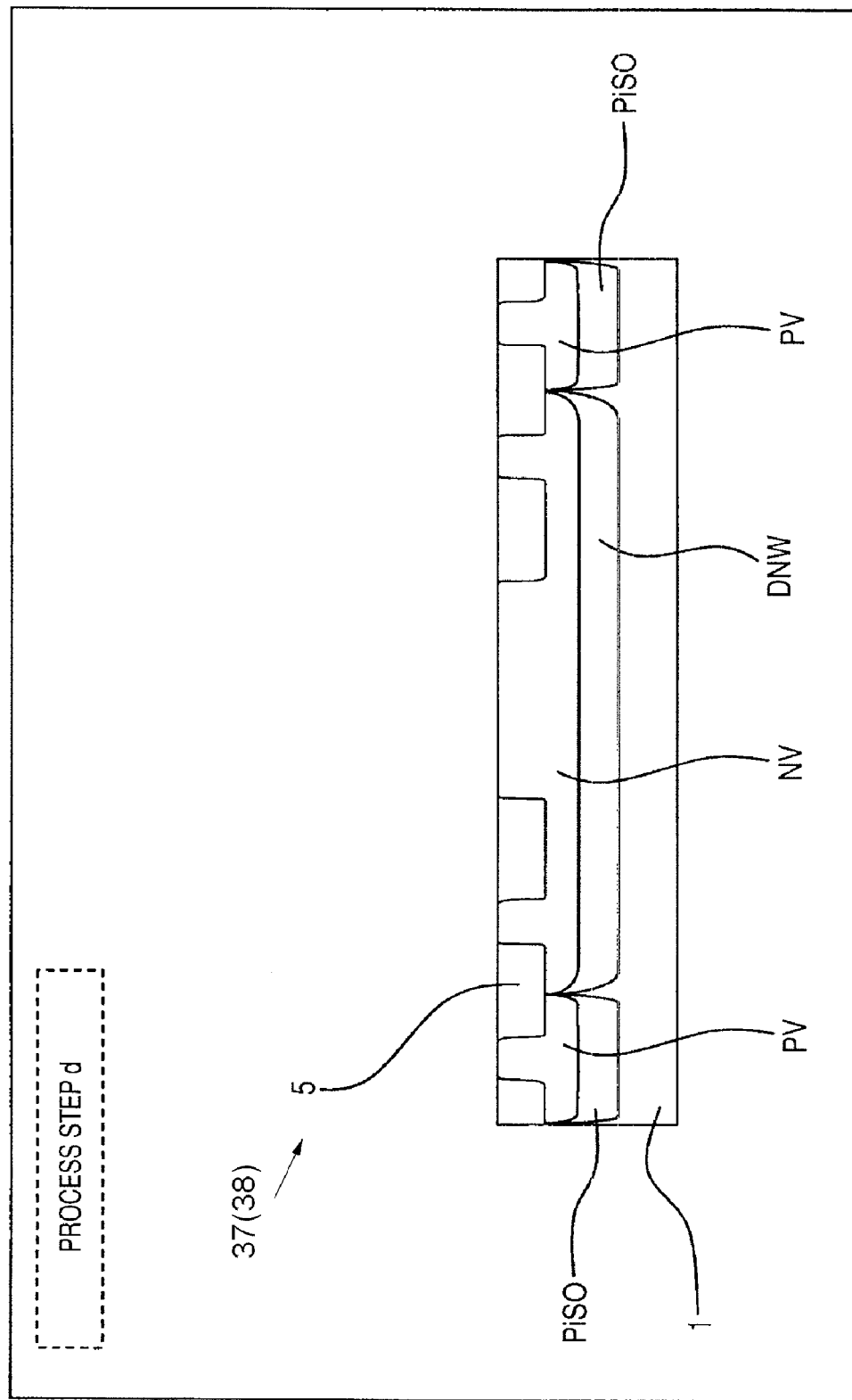
FIG. 67 is a device cross-sectional view (process step d) illustrating the process flow in the method of manufacturing the semiconductor integrated circuit device according to the embodiment of the present invention which is related to the SBD portion (device structure 2)

Next, the SBD portion (device structure 3) will be described. FIG. 67 is a device cross-sectional view (process step d) illustrating the process flow in the method of manufacturing the semiconductor integrated circuit device according to the embodiment of the present invention which is related to the SBD portion (device structure 3).

As shown in FIG. 67, at the same time as the formation of the inner well region VN in the intermediate-breakdown-voltage portion, the N-type impurity region VN serving as the cathode region of the SBD portion is formed. Further, at the same time as ion implantation for the source/drain regions of the P-type MOSFET in the high-breakdown-voltage portion, the P-type impurity region PV serving as the peripheral isolation region of the SBD portion is introduced.

Figure 77:
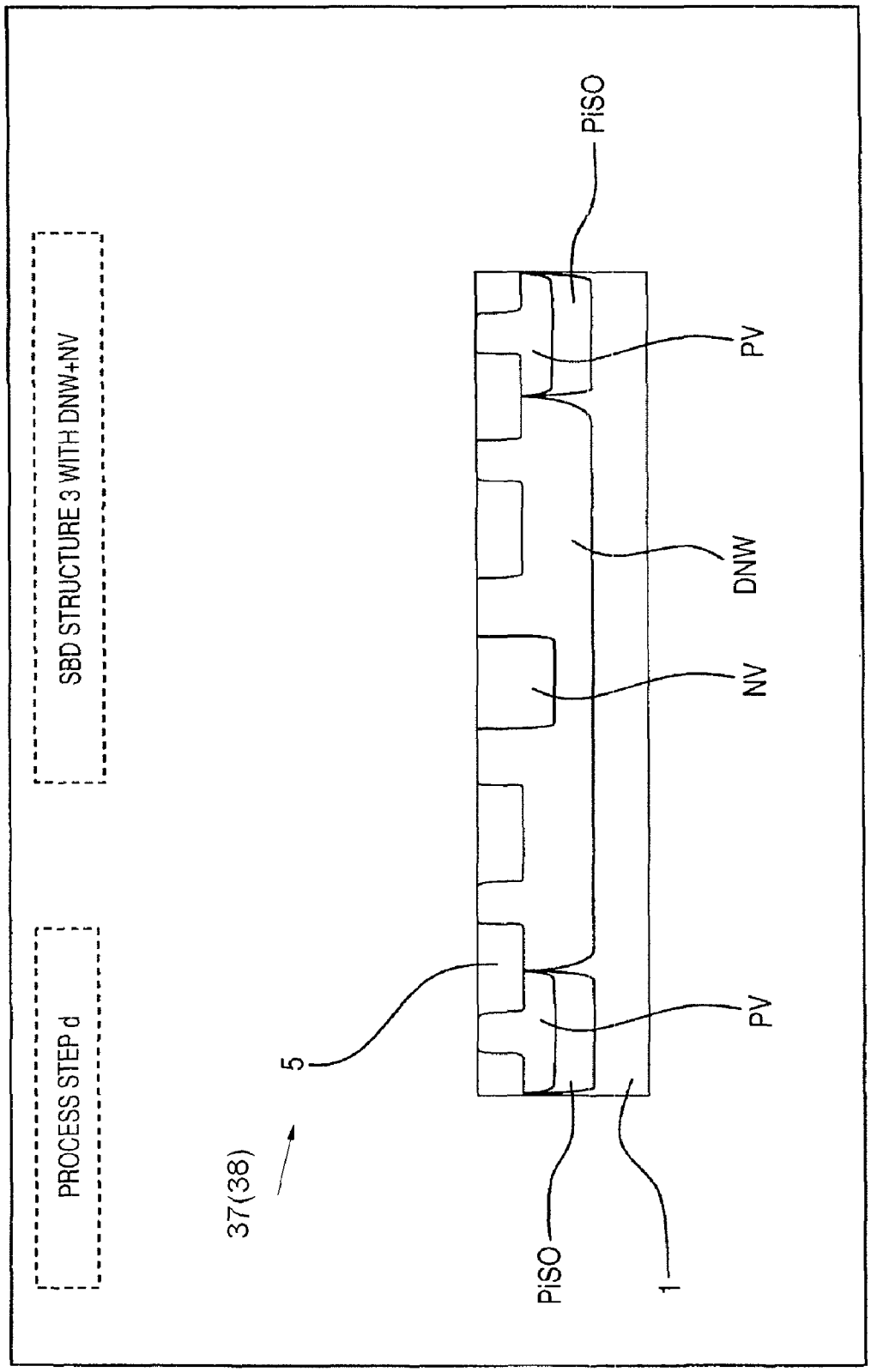
FIG. 77 is a device cross-sectional view (process step d) illustrating a process flow in the method of manufacturing the semiconductor integrated circuit device according to the embodiment of the present invention which is related to a SBD portion (device structure 3)
Figure 78:
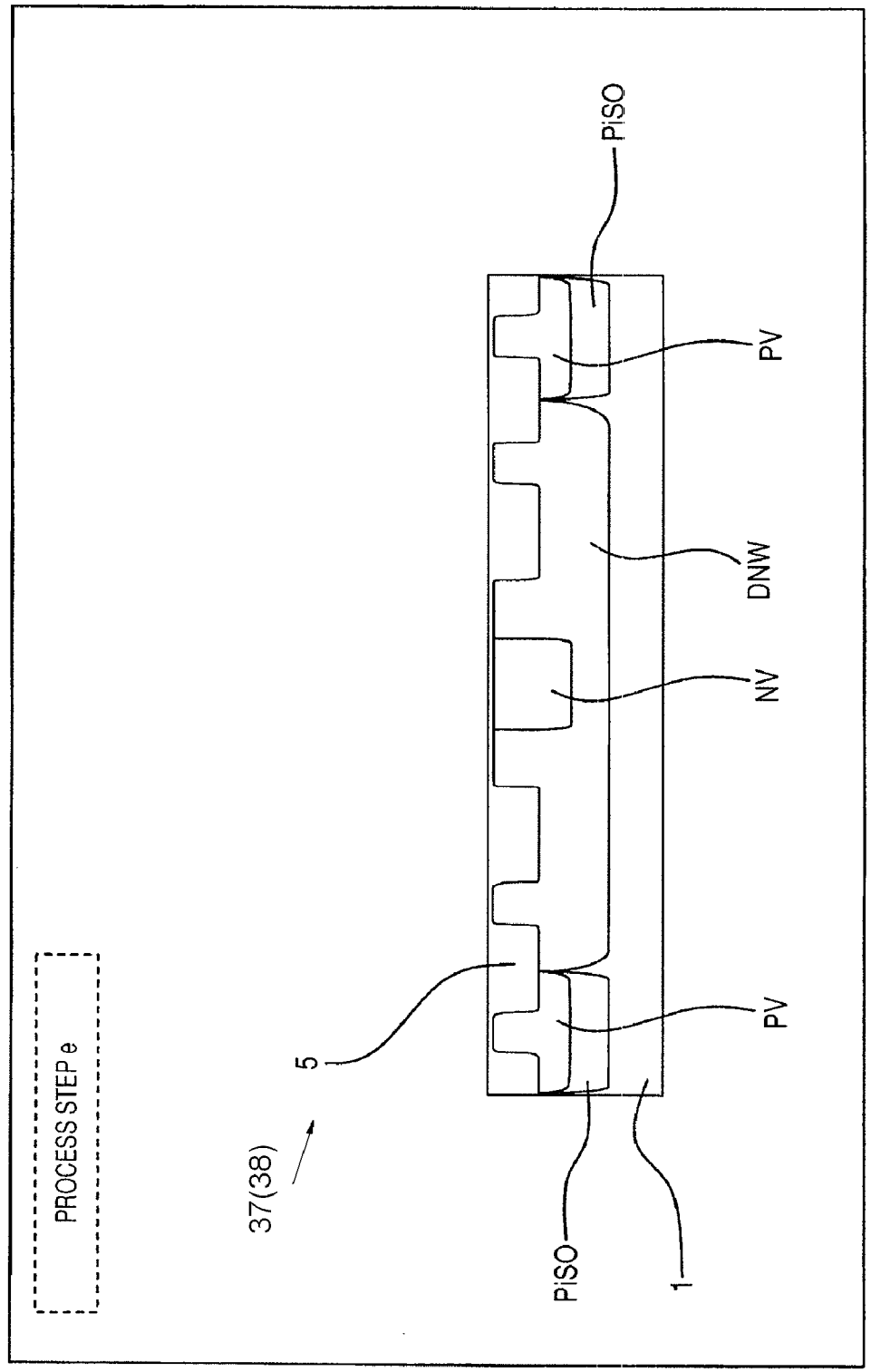
FIG. 78 is a device cross-sectional view (process step e) illustrating the process flow in the method of manufacturing the semiconductor integrated circuit device according to the embodiment of the present invention which is related to the SBD portion (device structure 3)
Figure 79:
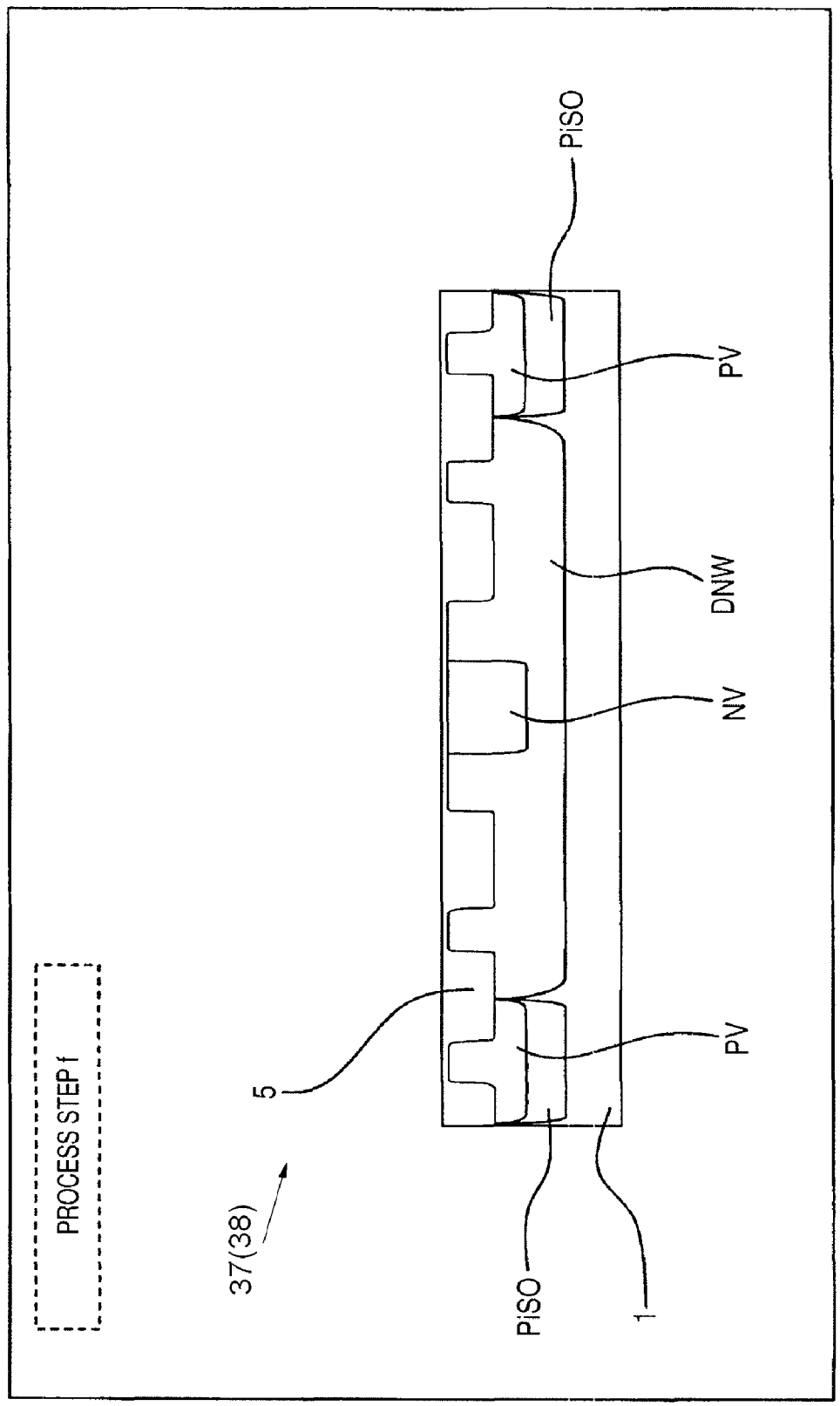
FIG. 79 is a device cross-sectional view (process step f) illustrating the process flow in the method of manufacturing the semiconductor integrated circuit device according to the embodiment of the present invention which is related to the SBD portion (device structure 3)

Next, the SBD portion (device structure 2) will be described. FIG. 77 is a device cross-sectional view (process step d) illustrating a process flow in the method of manufacturing the semiconductor integrated circuit device according to the embodiment of the present invention which is related to the SBD portion (device structure 2).

As shown in FIG. 77, at the same time as the formation of the inner well region NV in the intermediate-breakdown-voltage portion, the N-type impurity region NV higher in concentration than the N-type impurity region DNW serving as the principal cathode region of the SBD portion is formed. Further, at the same time as the ion implantation for the P-type impurity region PV serving as the source/drain region of the P-type MOSFET in the high-breakdown-voltage portion, the P-type impurity region PV serving as the peripheral isolation region for the SBD portion is introduced.

(5) Step e (Formation of High-Breakdown-Voltage Gate Insulating Film)

Figure 26:
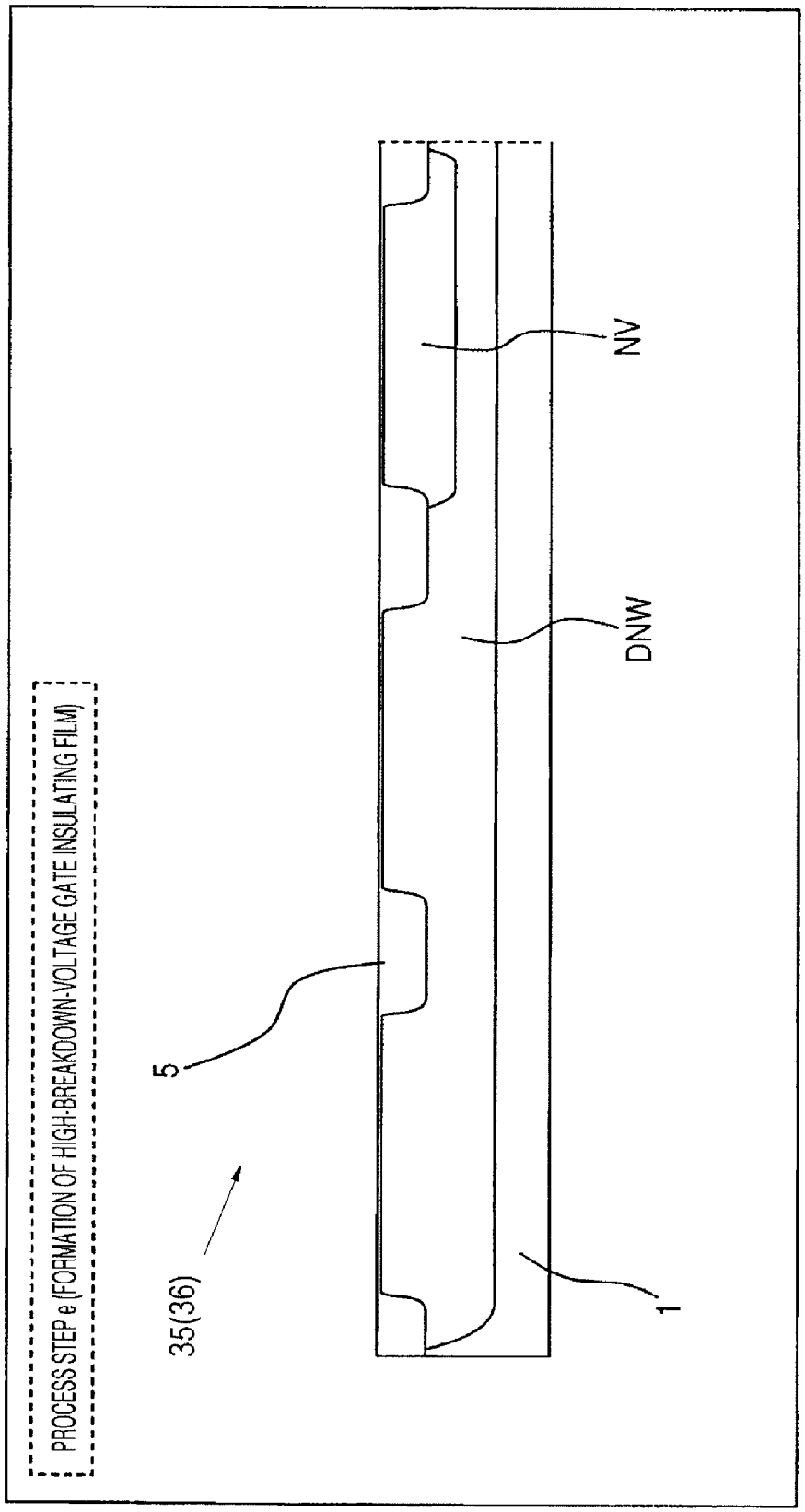
FIG. 26 is a device cross-sectional view (process step e) illustrating the process flow in the method of manufacturing the semiconductor integrated circuit device according to the embodiment of the present invention which is related to the low-breakdown-voltage portion and the intermediate-breakdown-voltage portion.

FIG. 26 is a device cross-sectional view (process step e) illustrating the process flow in the method of manufacturing the semiconductor integrated circuit device according to the embodiment of the present invention which is related to the low-breakdown-voltage portion and the intermediate-breakdown-voltage portion.

As shown in FIG. 26, in the step of forming the gate insulating film in the high-breakdown-voltage portion, a thermal oxide film is also simultaneously formed in each of the active regions of the low-breakdown-voltage portion and the intermediate-breakdown-voltage portion.

Figure 43:
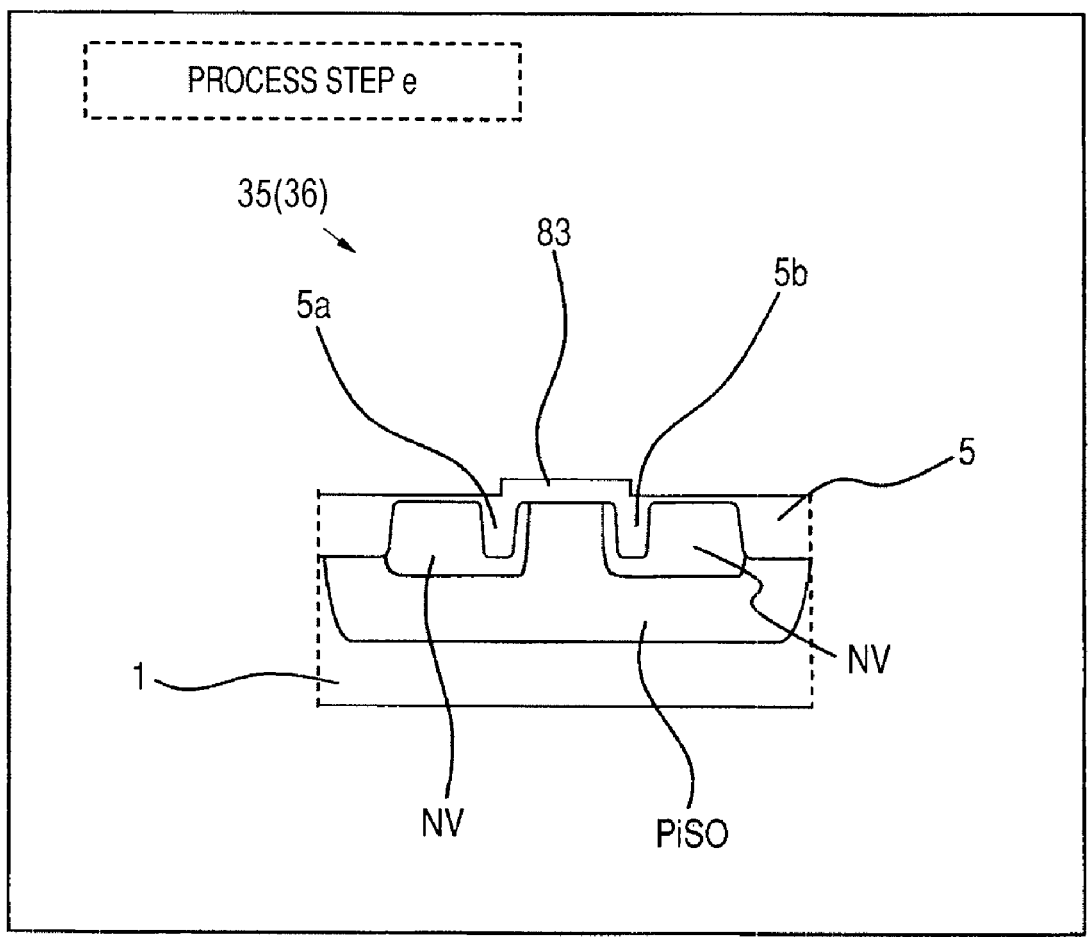
FIG. 43 is a device cross-sectional view (process step e) illustrating the process flow in the method of manufacturing the semiconductor integrated circuit device according to the embodiment of the present invention which is related to the high-breakdown-voltage portion.

Next, the high-breakdown-voltage portion will be described. FIG. 43 is a device cross-sectional view (process step e) illustrating the process flow in the method of manufacturing the semiconductor integrated circuit device according to the embodiment of the present invention which is related to the high-breakdown-voltage portion.

As shown in FIG. 43, a gate oxide film (insulating film) for the high-breakdown-voltage portion is formed. The gate oxide film in the high-breakdown-voltage portion is comprised of two layers, which are a lower-layer thermal oxide film or the like (with a thickness of about 15 nm) and an upper-layer CVD silicon dioxide film. The CVD silicon dioxide film and the like are immediately removed from the portions other than the high-breakdown-voltage portion.

Figure 57:
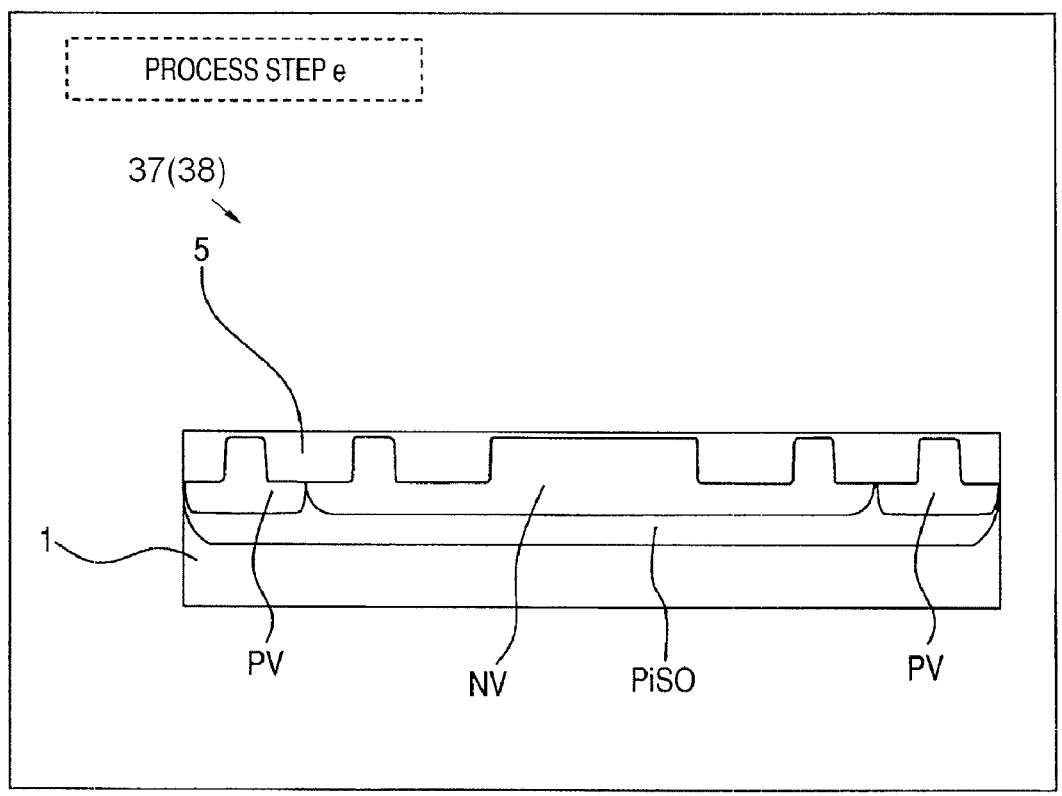
FIG. 57 is a device cross-sectional view (process step e) illustrating the process flow in the method of manufacturing the semiconductor integrated circuit device according to the embodiment of the present invention which is related to the SBD portion (device structure 1)

Next, the SBD portion (device structure 1) will be described. FIG. 57 is a device cross-sectional view (process step e) illustrating the process flow in the method of manufacturing the semiconductor integrated circuit device according to the embodiment of the present invention which is related to the SBD portion (device structure 1).

As shown in FIG. 57, the upper-layer CVD silicon dioxide film as the gate oxide film in the high-breakdown-voltage portion is removed immediately after being deposited in this portion, as mentioned above.

Figure 68:
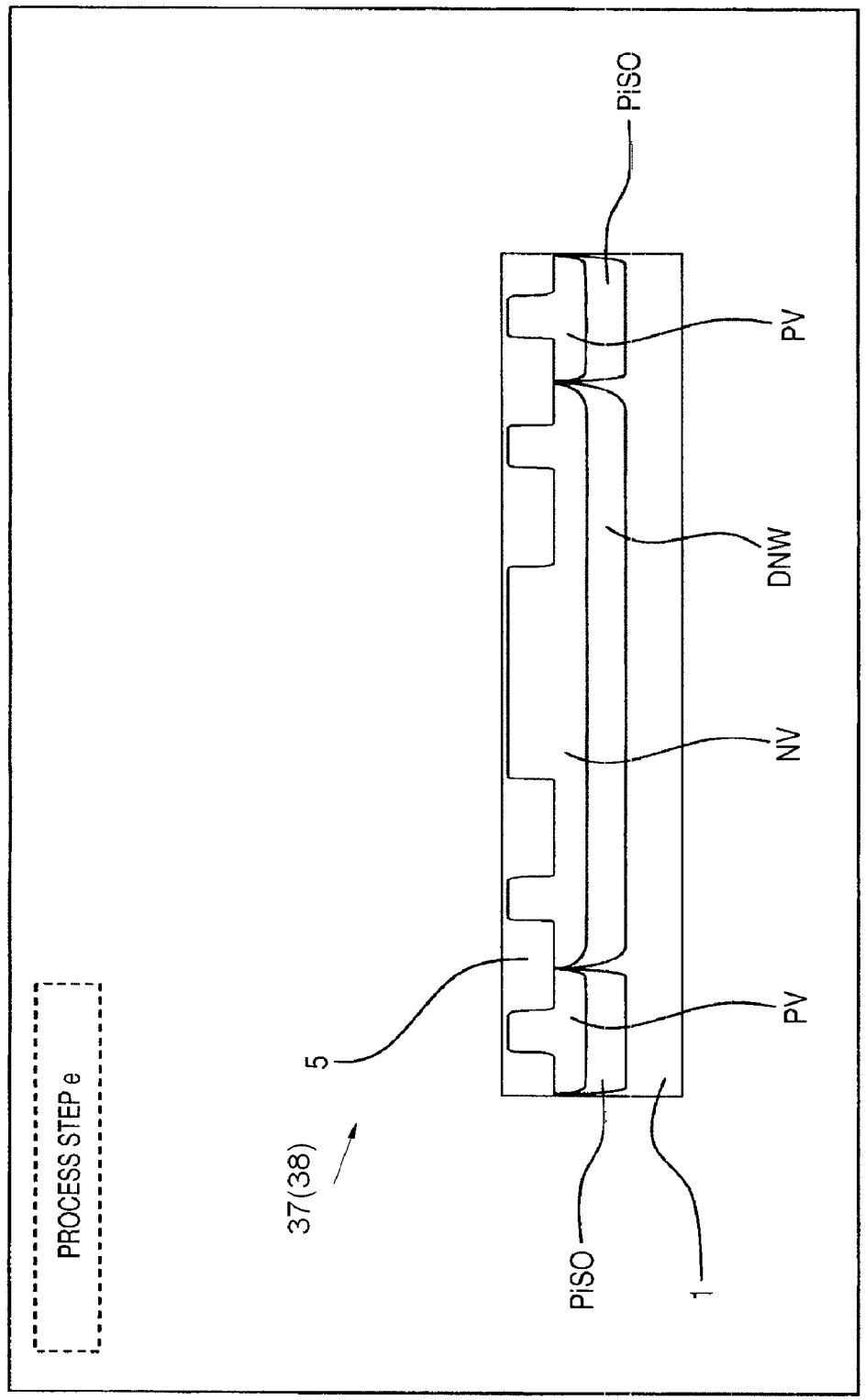
FIG. 68 is a device cross-sectional view (process step e) illustrating the process flow in the method of manufacturing the semiconductor integrated circuit device according to the embodiment of the present invention which is related to the SBD portion (device structure 2)

Next, the SBD portion (device structure 3) will be described. FIG. 68 is a device cross-sectional view (process step e) illustrating the process flow in the method of manufacturing the semiconductor integrated circuit device according to the embodiment of the present invention which is related to the SBD portion (device structure 3).

As shown in FIG. 68, the upper-layer CVD silicon dioxide film as the gate oxide film in the high-breakdown-voltage portion is removed immediately after being deposited in this portion, as mentioned above. The same also holds true for the SBD portion (device structure 2).

(6) Step f (6-V MOS FET Channel Implantation)

Figure 27:
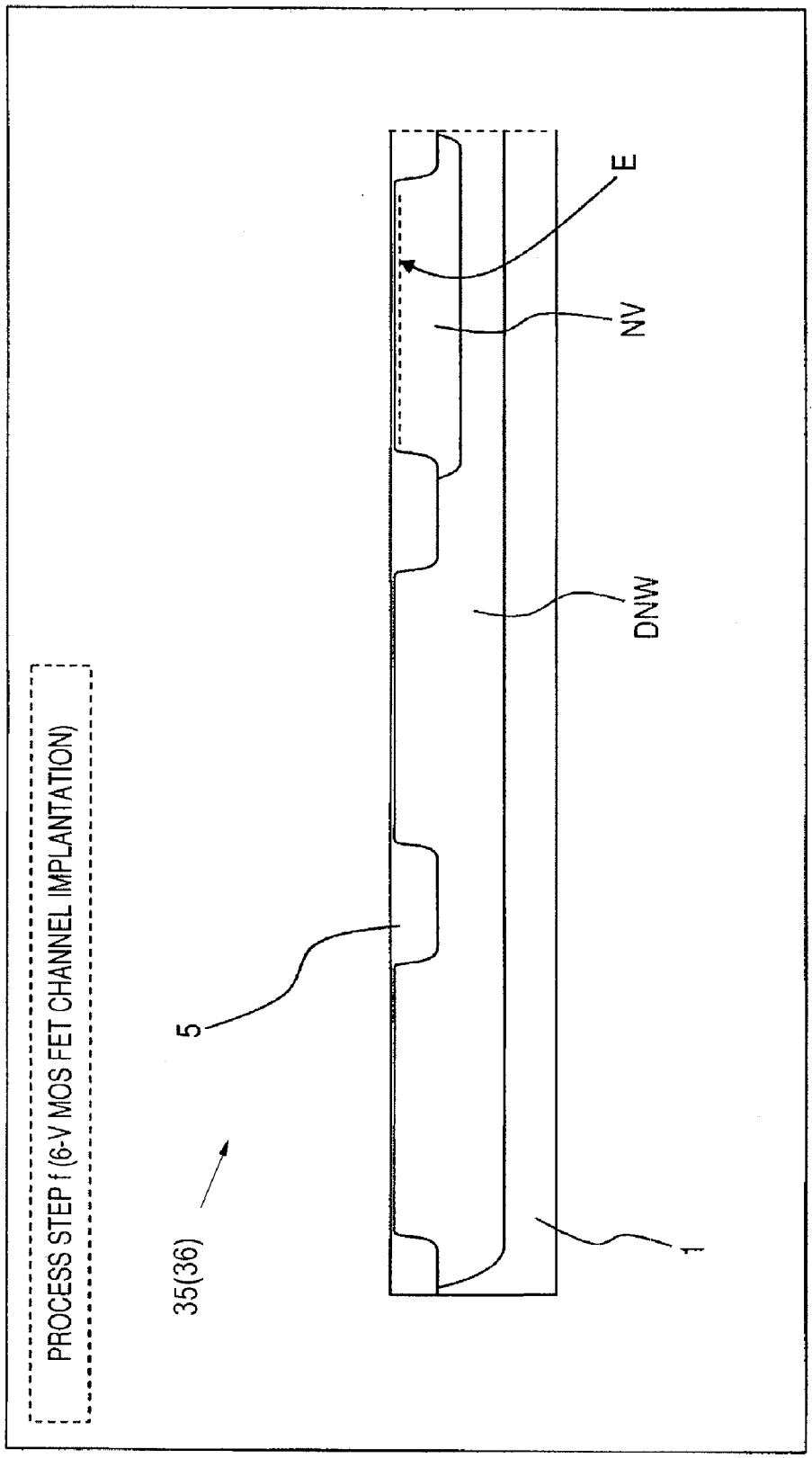
FIG. 27 is a device cross-sectional view (process step f) illustrating the process flow in the method of manufacturing the semiconductor integrated circuit device according to the embodiment of the present invention which is related to the low-breakdown-voltage portion and the intermediate-breakdown-voltage portion.

FIG. 27 is a device cross-sectional view (process step f) illustrating the process flow in the method of manufacturing the semiconductor integrated circuit device according to the embodiment of the present invention which is related to the low-breakdown-voltage portion and the intermediate-breakdown-voltage portion.

As shown in FIG. 27, an impurity is ion implanted into the entire surface (of a principal control region E) primarily for the control of the threshold Vth of the intermediate-breakdown-voltage MOS FET portion (so-called channel implantation in the same manner as in the subsequent description).

Figure 58:
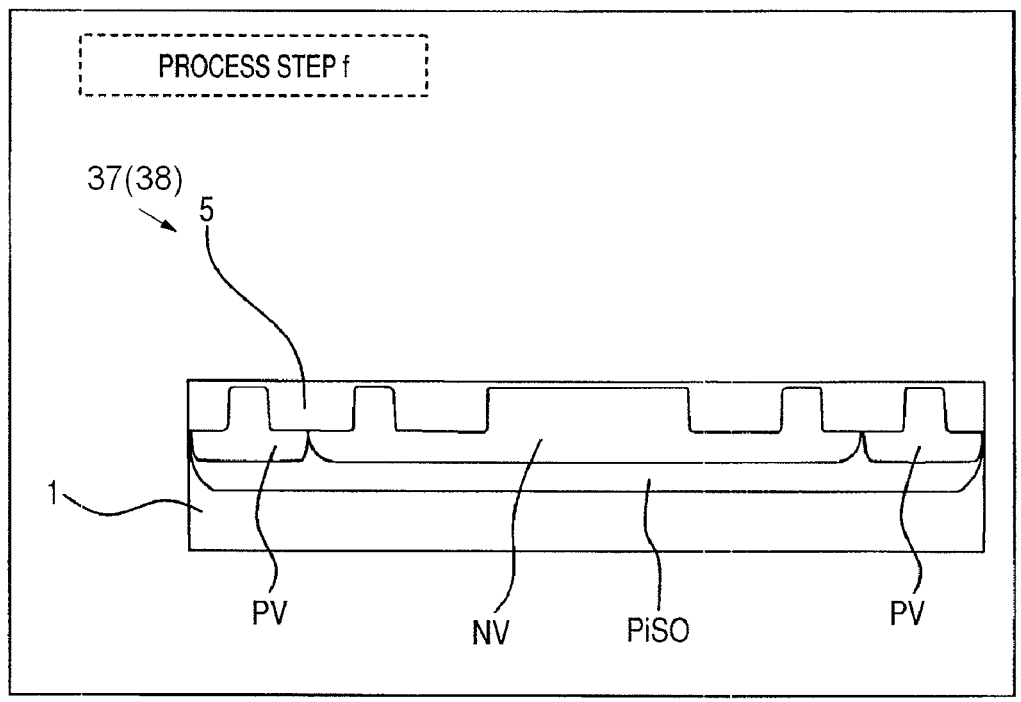
FIG. 58 is a device cross-sectional view (process step f) illustrating the process flow in the method of manufacturing the semiconductor integrated circuit device according to the embodiment of the present invention which is related to the SBD portion (device structure 1)

Next, the SBD portion (device structure 1) will be described. FIG. 58 is a device cross-sectional view (process step f) illustrating the process flow in the method of manufacturing the semiconductor integrated circuit device according to the embodiment of the present invention which is related to the SBD portion (device structure 1).

As shown in FIG. 58, since the impurity is ion implanted into the entire surface to control the threshold Vth of the intermediate-breakdown-voltage MOS FET portion, the impurity is also automatically implanted into the surface of this portion (implantation region will not be particularly shown for the avoidance of intricacy in the same manner as in the subsequent drawings).

Figure 69:
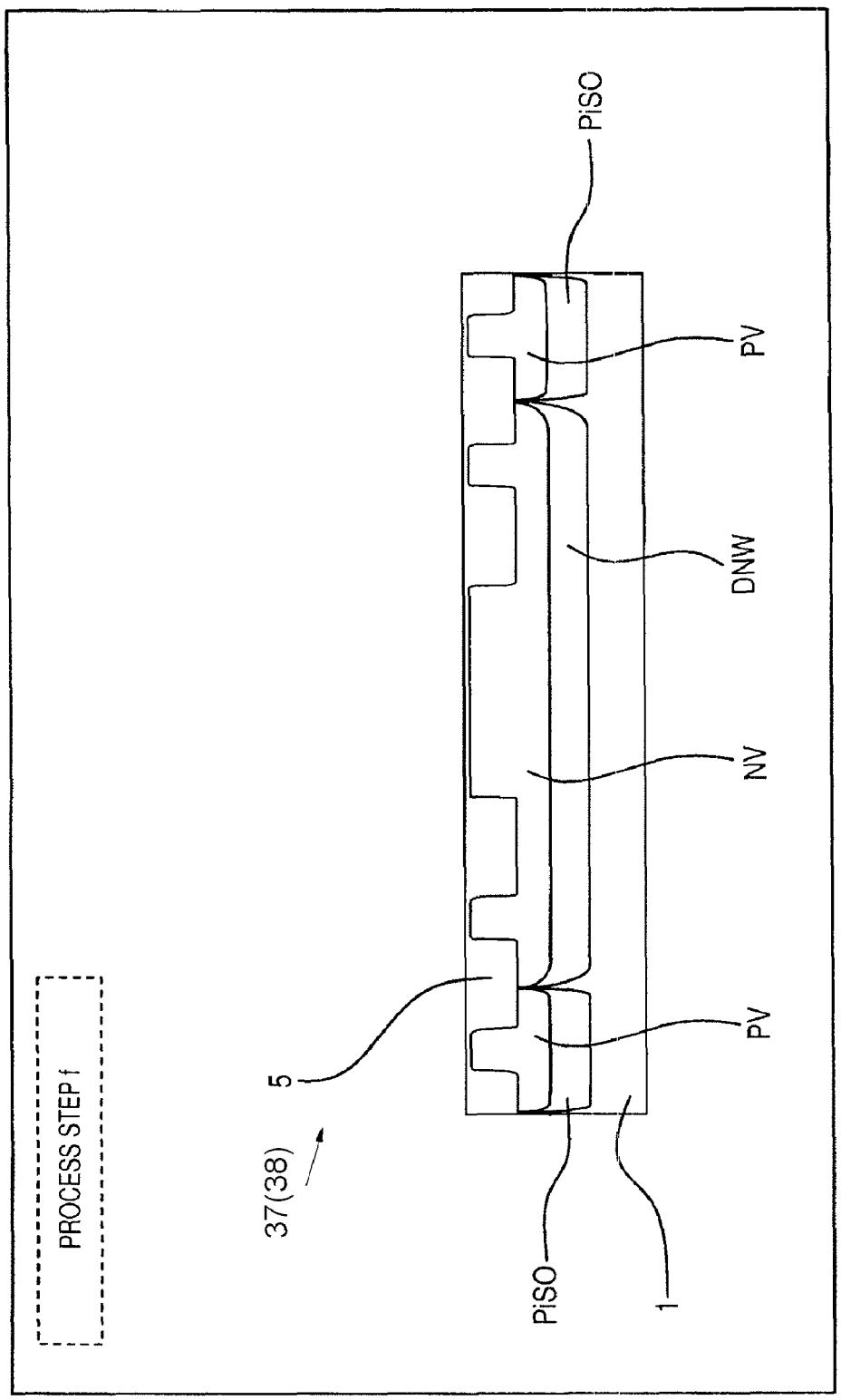
FIG. 69 is a device cross-sectional view (process step f) illustrating the process flow in the method of manufacturing the semiconductor integrated circuit device according to the embodiment of the present invention which is related to the SBD portion (device structure 2)

Next, the SBD portion (device structure 3) will be described. FIG. 69 is a device cross-sectional view (process step f) illustrating the process flow in the method of manufacturing the semiconductor integrated circuit device according to the embodiment of the present invention which is related to the SBD portion (device structure 3).

As shown in FIG. 69, since the impurity is ion implanted into the entire surface to control the threshold Vth of the intermediate-breakdown-voltage MOS FET portion, the impurity is also automatically implanted into the surface of this portion. The same also holds true for the SBD portion (device structure 2).

(7) Step g (Formation of Well)

Figure 28:
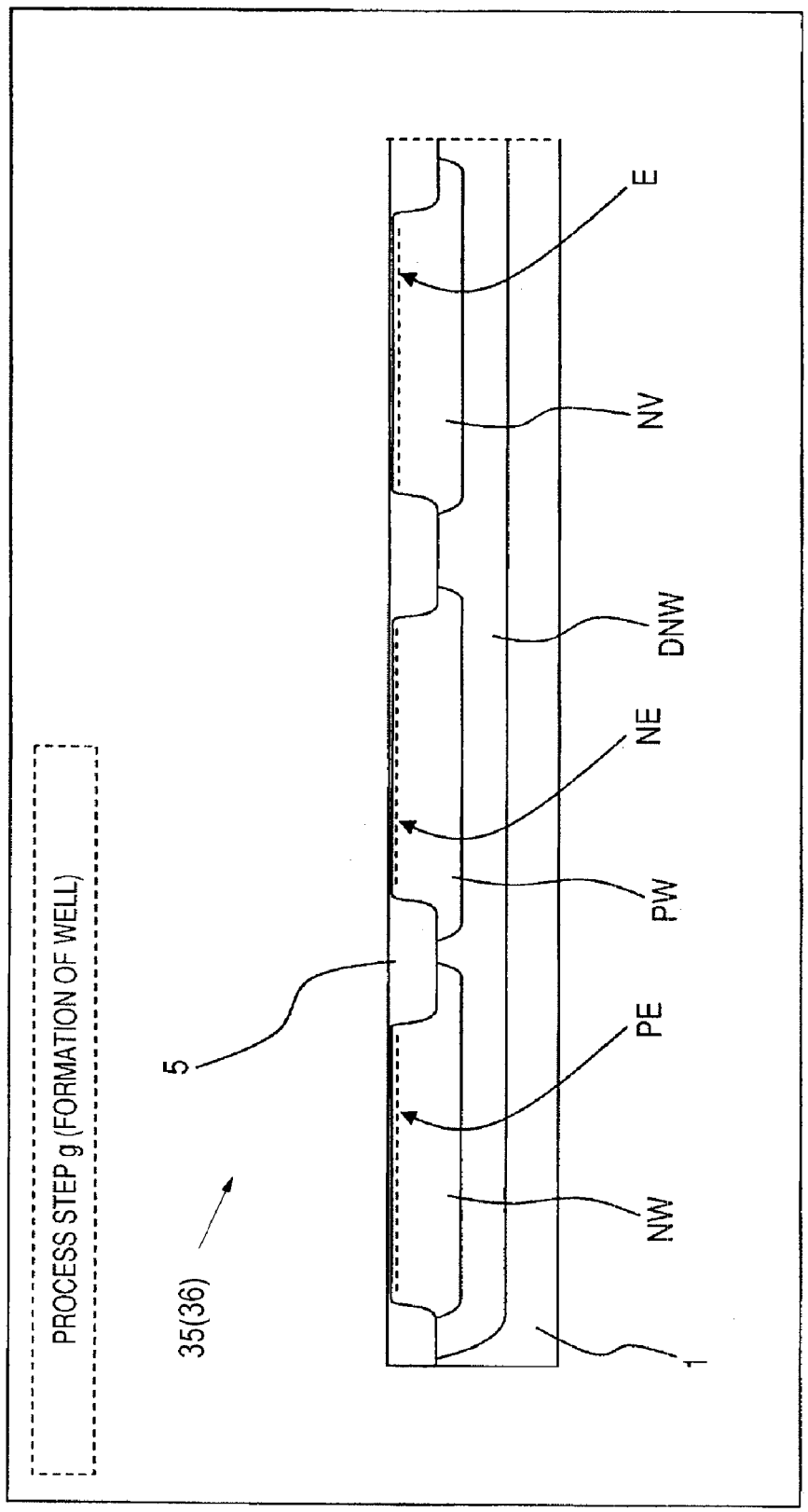
FIG. 28 is a device cross-sectional view (process step g) illustrating the process flow in the method of manufacturing the semiconductor integrated circuit device according to the embodiment of the present invention which is related to the low-breakdown-voltage portion and the intermediate-breakdown-voltage portion.

FIG. 28 is a device cross-sectional view (process step g) illustrating the process flow in the method of manufacturing the semiconductor integrated circuit device according to the embodiment of the present invention which is related to the low-breakdown-voltage portion and the intermediate-breakdown-voltage portion.

As shown in FIG. 28, the N-well NW and the P-well PW are formed in the respective regions of the PMOS FET and the NMOS FET and, using resist patterns for ion implantation for the respective wells, impurities for controlling the thresholds Vth are ion implanted into the respective regions of the PMOS FET and the NMOS FET (implantation regions PE and NE). Thereafter, the resist patterns which are no more needed are removed.

Figure 59:
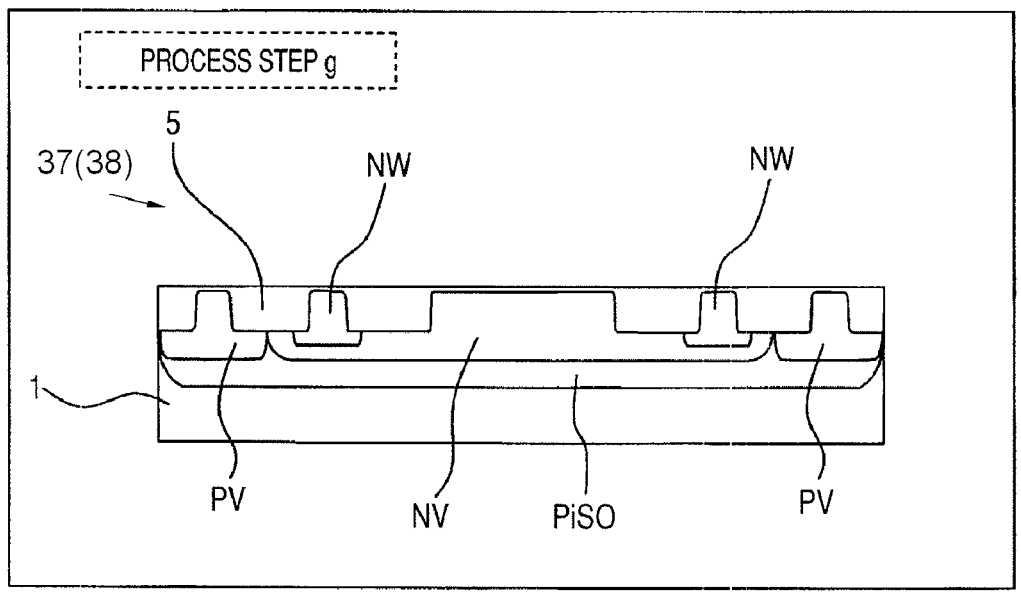
FIG. 59 is a device cross-sectional view (process step g) illustrating the process flow in the method of manufacturing the semiconductor integrated circuit device according to the embodiment of the present invention which is related to the SBD portion (device structure 1)

Next, the SBD portion (device structure 1) will be described. FIG. 59 is a device cross-sectional view (process step g) illustrating the process flow in the method of manufacturing the semiconductor integrated circuit device according to the embodiment of the present invention which is related to the SBD portion (device structure 1).

As shown in FIG. 59, when the N-well NW is formed in the region of the PMOS FET, the N-type impurity region NW is formed in the cathode contact portion of the SBD portion by ion implantation.

Figure 70:
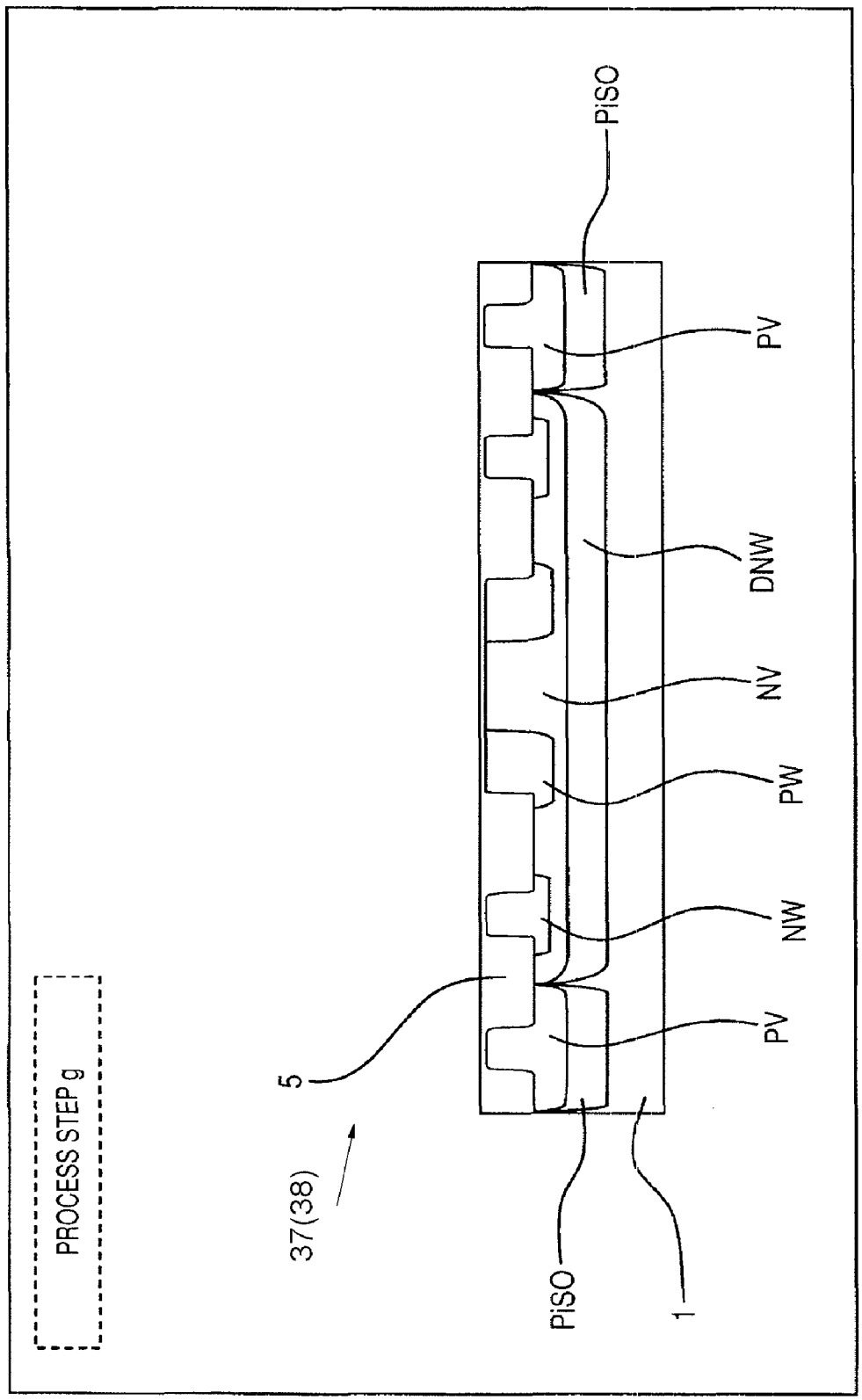
FIG. 70 is a device cross-sectional view (process step g) illustrating the process flow in the method of manufacturing the semiconductor integrated circuit device according to the embodiment of the present invention which is related to the SBD portion (device structure 2)

Next, the SBD portion (device structure 3) will be described. FIG. 70 is a device cross-sectional view (process step g) illustrating the process flow in the method of manufacturing the semiconductor integrated circuit device according to the embodiment of the present invention which is related to the SBD portion (device structure 3).

As shown in FIG. 70, when the N-well NW is formed in the region of the PMOS FET in the low-breakdown-voltage portion by ion implantation, the N-type impurity region NW is simultaneously formed in the cathode contact portion of the SBD portion by ion implantation. On the other hand, when the P-well PW is formed in the region of the NMOS FET in the low-breakdown-voltage portion by ion implantation, the low-concentration P-type guard ring region PW is simultaneously formed in the portion of the SBD portion where the guard ring is to be formed by ion implantation.

Figure 80:
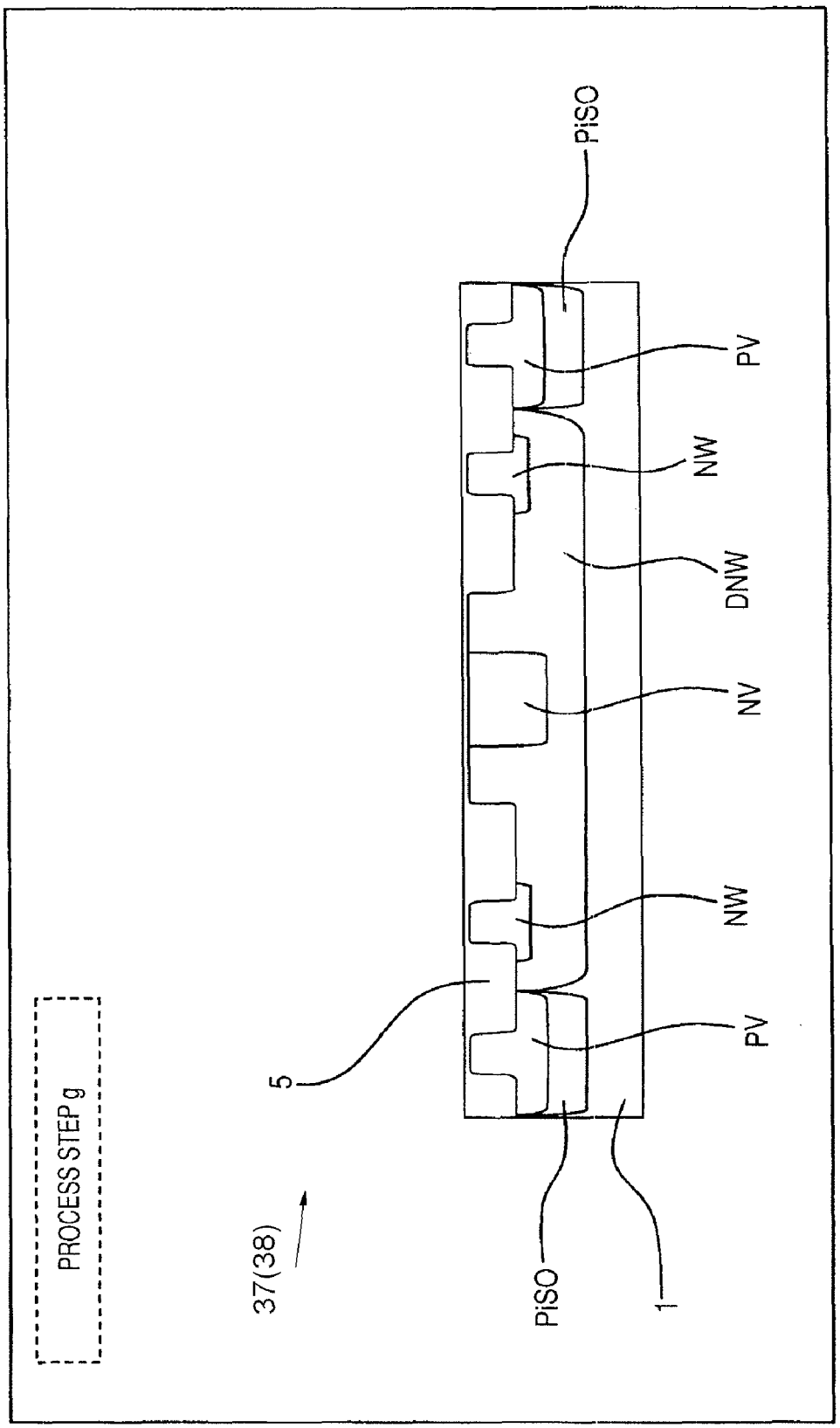
FIG. 80 is a device cross-sectional view (process step g) illustrating the process flow in the method of manufacturing the semiconductor integrated circuit device according to the embodiment of the present invention which is related to the SBD portion (device structure 3)
Figure 81:
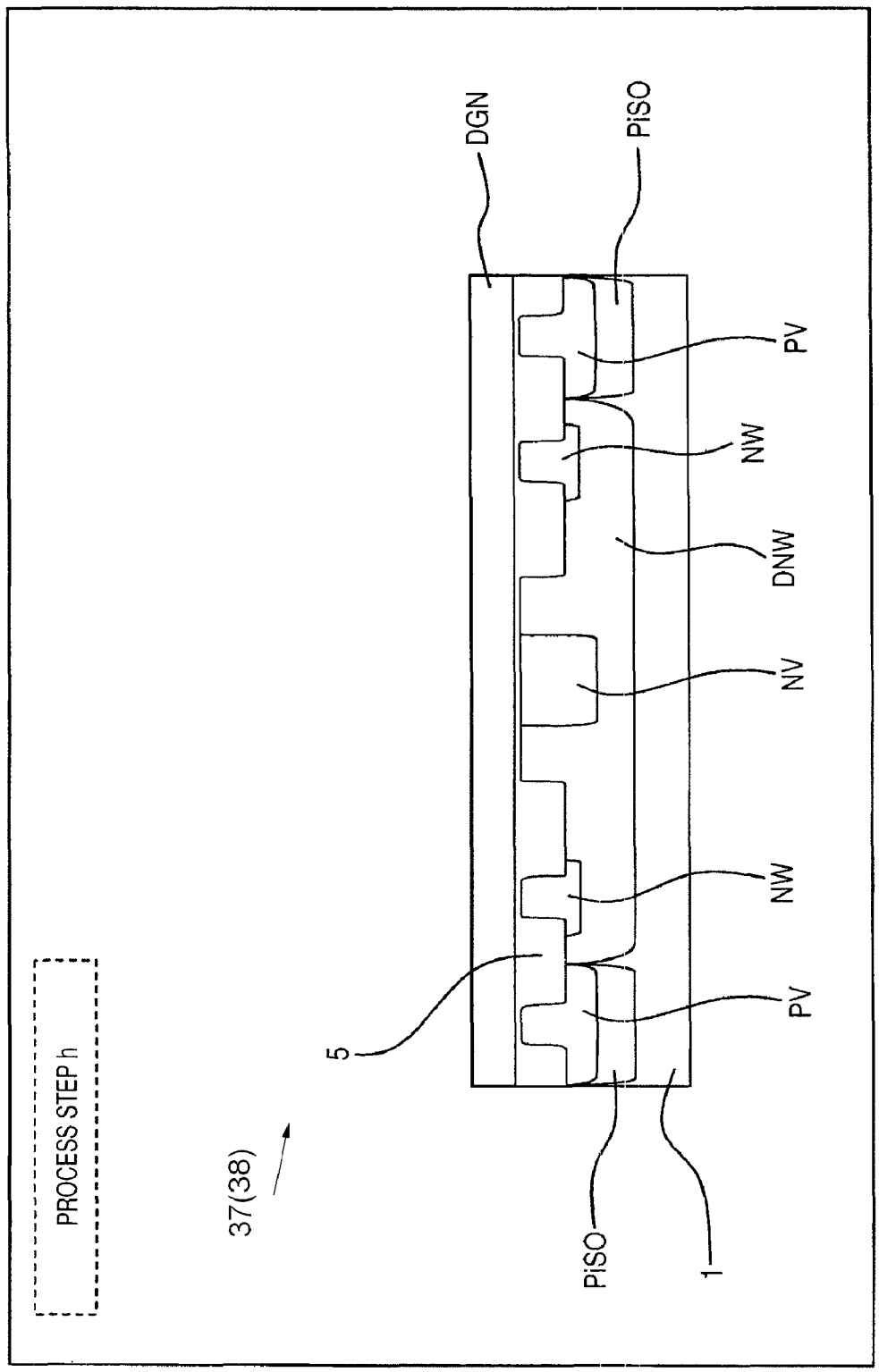
FIG. 81 is a device cross-sectional view (process step h) illustrating the process flow in the method of manufacturing the semiconductor integrated circuit device according to the embodiment of the present invention which is related to the SBD portion (device structure 3)
Figure 82:
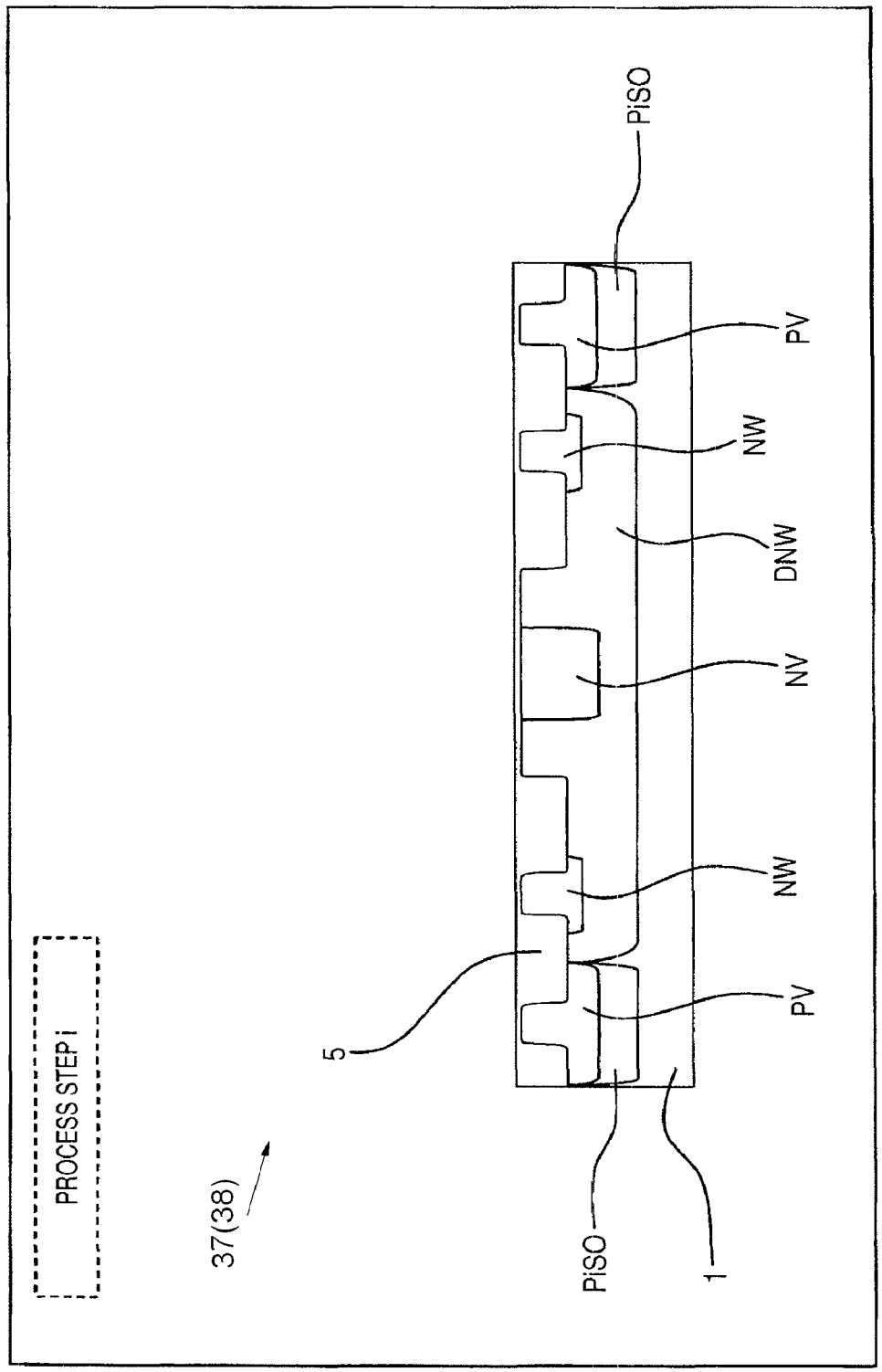
FIG. 82 is a device cross-sectional view (process step i) illustrating the process flow in the method of manufacturing the semiconductor integrated circuit device according to the embodiment of the present invention which is related to the SBD portion (device structure 3)
Figure 83:
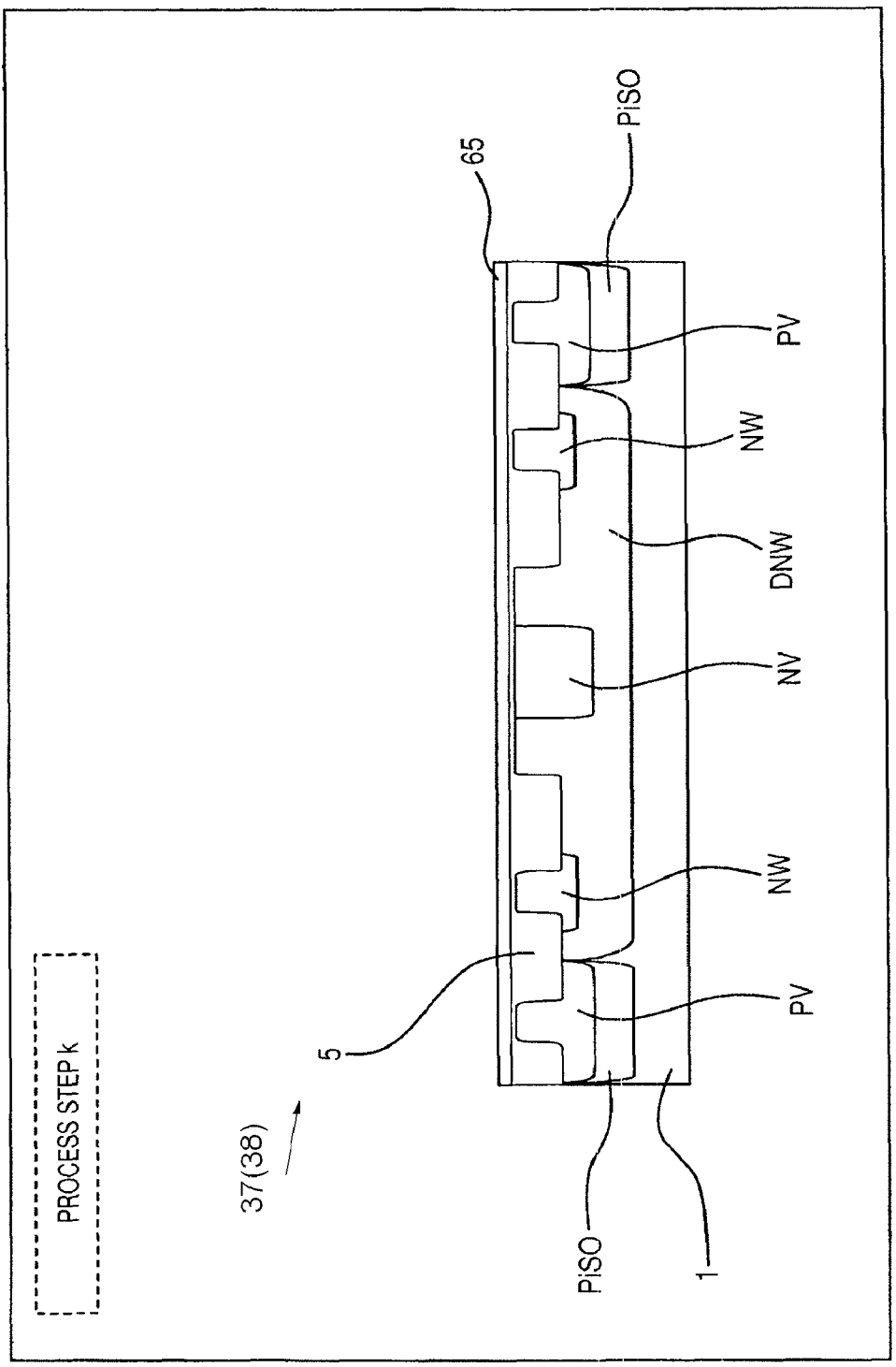
FIG. 83 is a device cross-sectional view (process step k) illustrating the process flow in the method of manufacturing the semiconductor integrated circuit device according to the embodiment of the present invention which is related to the SBD portion (device structure 3)

Next, the SBD portion (device structure 2) will be described. FIG. 80 is a device cross-sectional view (process step g) illustrating the process flow in the method of manufacturing the semiconductor integrated circuit device according to the embodiment of the present invention which is related to the SBD portion (device structure 2).

As shown in FIG. 80, when the N-well NW is formed in the region of the PMOS FET in the low-breakdown-voltage portion by ion implantation, the N-type impurity region NW is simultaneously formed in the cathode contact portion of the SBD portion by ion implantation.

(8) Step h (Formation of Gate Electrode Film)

Figure 29:
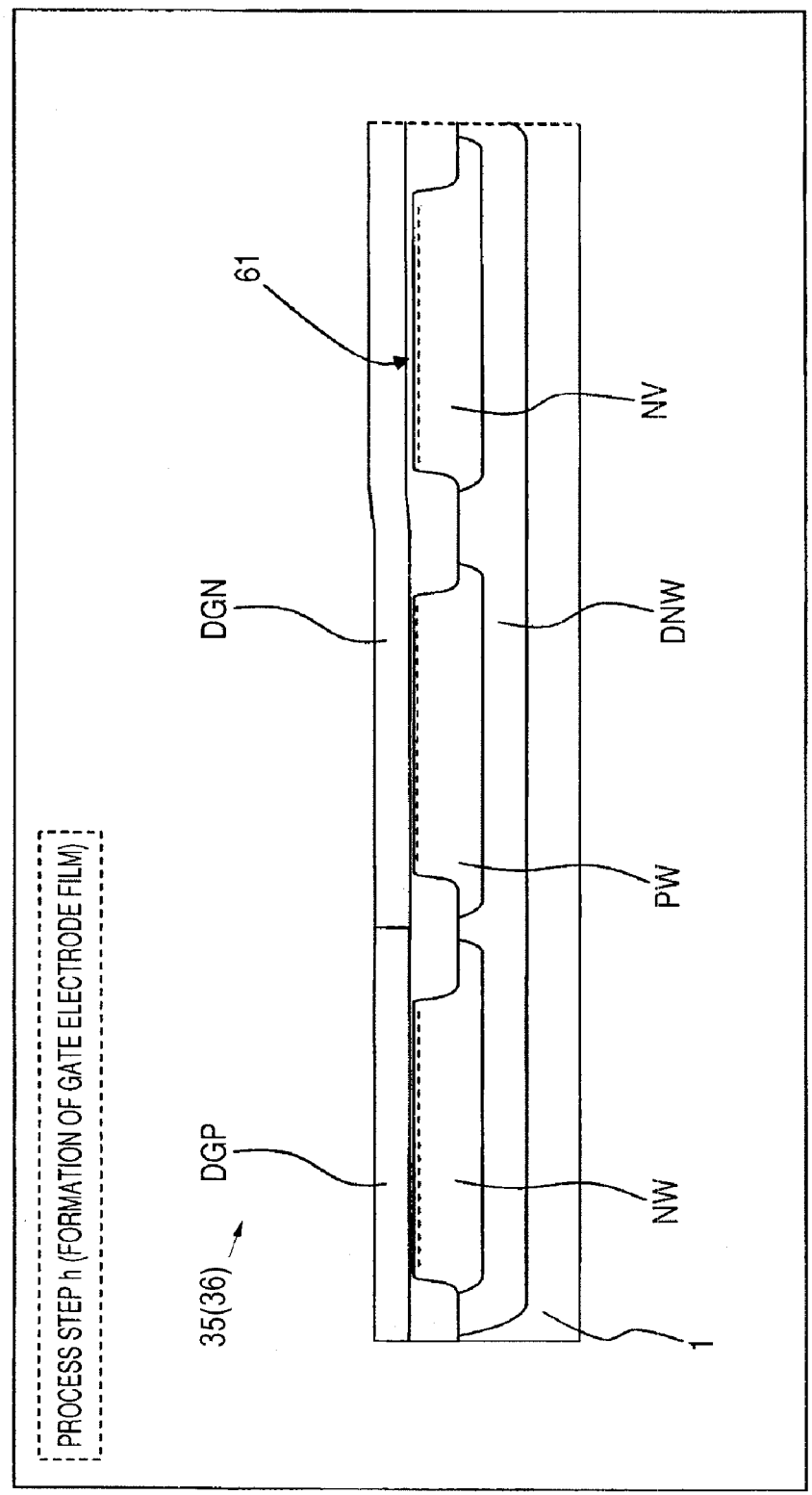
FIG. 29 is a device cross-sectional view (process step h) illustrating the process flow in the method of manufacturing the semiconductor integrated circuit device according to the embodiment of the present invention which is related to the low-breakdown-voltage portion and the intermediate-breakdown-voltage portion.

FIG. 29 is a device cross-sectional view (process step h) illustrating the process flow in the method of manufacturing the semiconductor integrated circuit device according to the embodiment of the present invention which is related to the low-breakdown-voltage portion and the intermediate-breakdown-voltage portion.

As shown in FIG. 29, a thermal oxidation process for the final formation of respective gate thermal oxide films (gate insulating films) in the high-breakdown-voltage portion and the intermediate-breakdown-voltage portion is performed. Then, the thermal oxide film in the low-breakdown-voltage portion is removed by typical lithography. Thereafter, a thermal oxidation process (including an oxynitridation process or the like) for the formation of a gate oxide film (gate insulating film) in the low-breakdown-voltage portion is performed. As a result of these processes, the gate oxide film 61 in the intermediate-breakdown-portion is slightly thicker than that in the low-breakdown-voltage portion. Then, a CVD polysilicon film with a thickness of about 250 nm is formed over the entire surface, and an N-type impurity and a P-type impurity are respectively ion implanted into an N-type device portion (SBD in this case is the N-type device portion) and a P-type device portion to dope them, thereby forming an N-type polysilicon film DGN and a P-type polysilicon film DGP.

Figure 44:
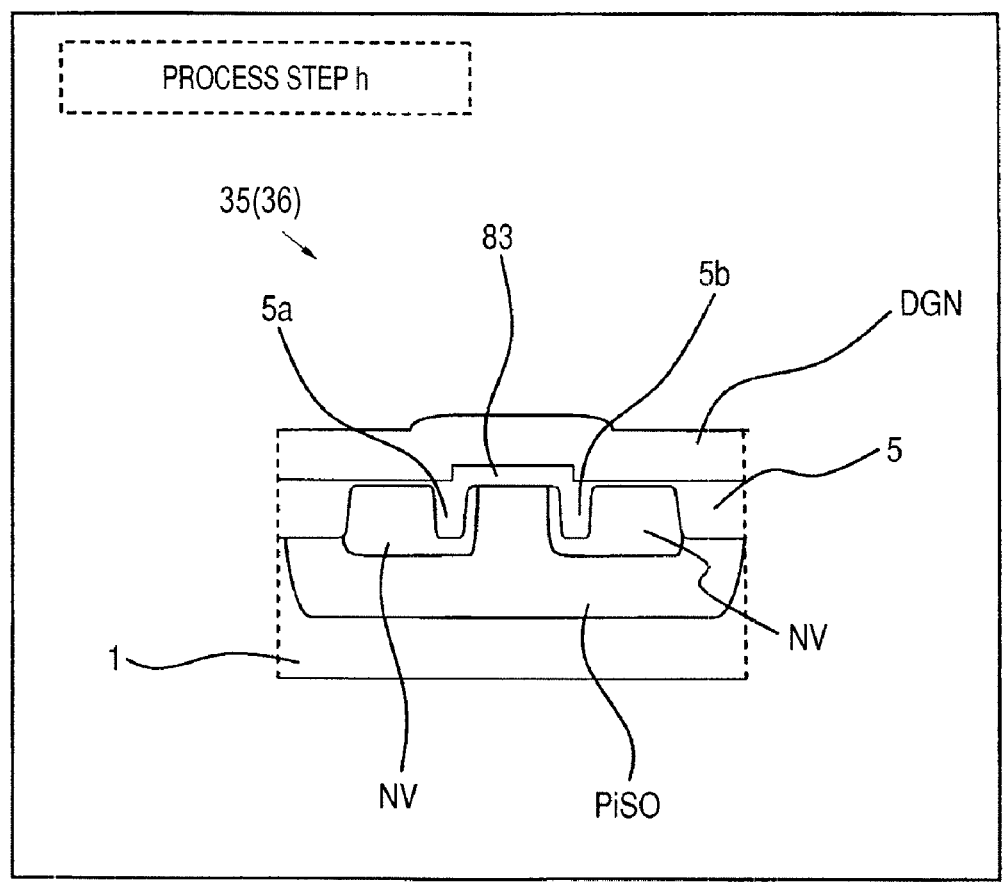
FIG. 44 is a device cross-sectional view (process step h) illustrating the process flow in the method of manufacturing the semiconductor integrated circuit device according to the embodiment of the present invention which is related to the high-breakdown-voltage portion.

Next, the high-breakdown-voltage portion will be described. FIG. 44 is a device cross-sectional view (process step h) illustrating the process flow in the method of manufacturing the semiconductor integrated circuit device according to the embodiment of the present invention which is related to the high-breakdown-voltage portion.

As shown in FIG. 44, the N-type polysilicon film DGN is also similarly formed in the high-breakdown-voltage portion.

Figure 60:
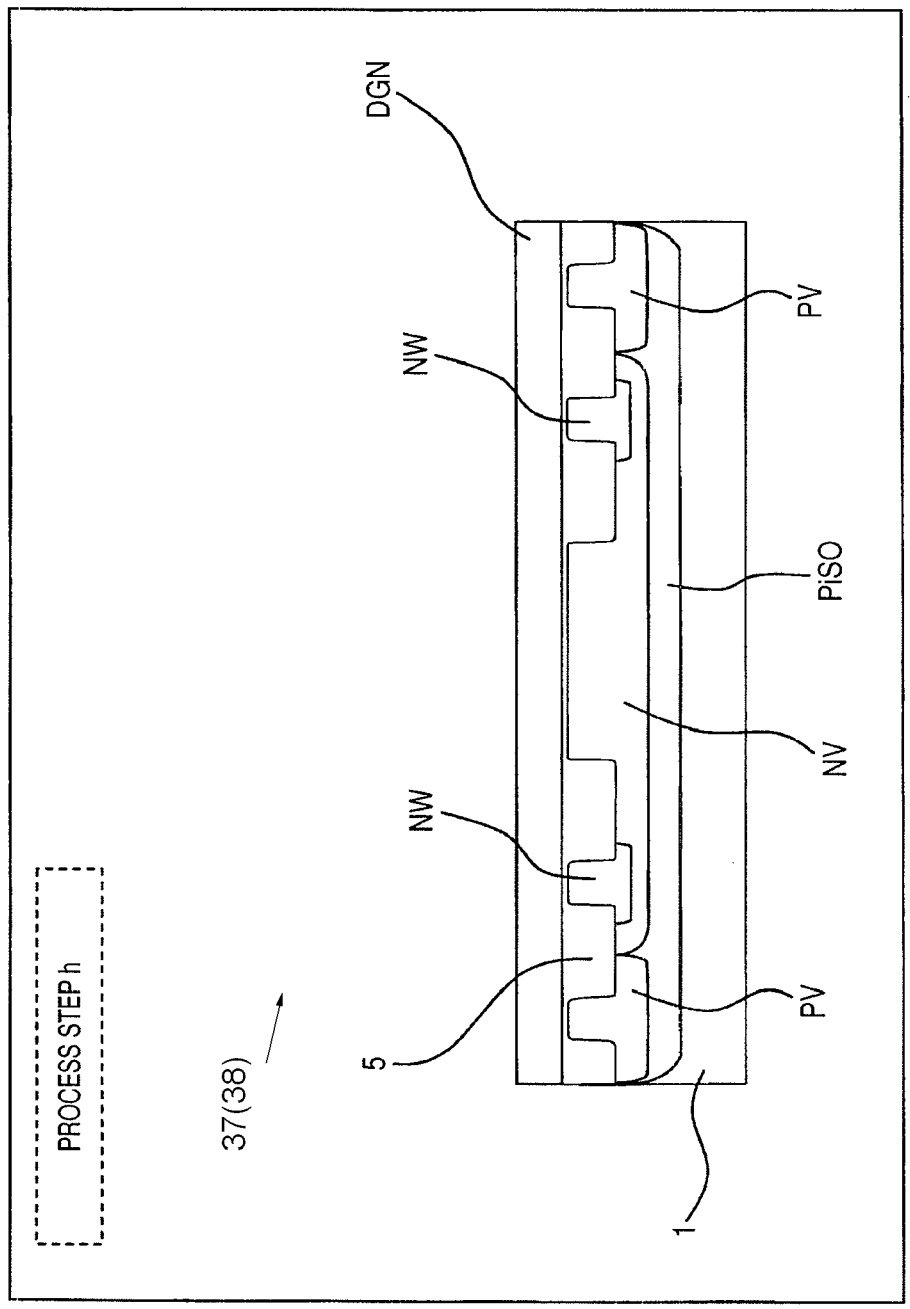
FIG. 60 is a device cross-sectional view (process step h) illustrating the process flow in the method of manufacturing the semiconductor integrated circuit device according to the embodiment of the present invention which is related to the SBD portion (device structure 1)

Next, the SBD portion (device structure 1) will be described. FIG. 60 is a device cross-sectional view (process step h) illustrating the process flow in the method of manufacturing the semiconductor integrated circuit device according to the embodiment of the present invention which is related to the SBD portion (device structure 1).

As shown in FIG. 60, the N-type polysilicon film DGN is formed also in the SBD portion at the same time as the formation of the N-type polysilicon film DGN in each of the high-breakdown-voltage portion and the intermediate-breakdown-voltage portion.

Figure 71:
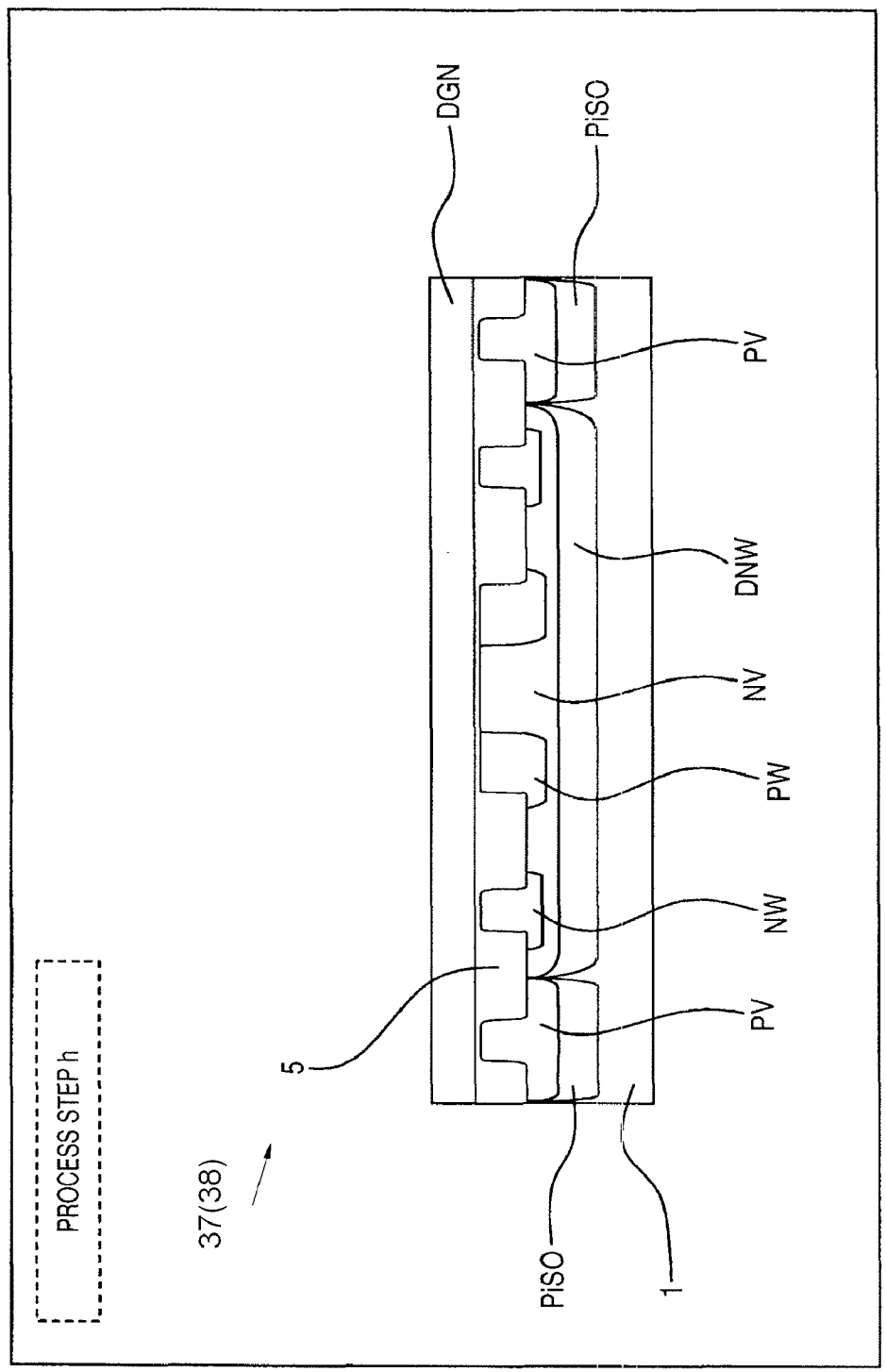
FIG. 71 is a device cross-sectional view (process step h) illustrating the process flow in the method of manufacturing the semiconductor integrated circuit device according to the embodiment of the present invention which is related to the SBD portion (device structure 2)

Next, the SBD portion (device structure 3) will be described. FIG. 71 is a device cross-sectional view (process step h) illustrating the process flow in the method of manufacturing the semiconductor integrated circuit device according to the embodiment of the present invention which is related to the SBD portion (device structure 3).

As shown in FIG. 71, the N-type polysilicon film DGN is formed also in the SBD portion at the same time as the formation of the N-type polysilicon film DGN in each of the high-breakdown-voltage portion and the intermediate-breakdown-voltage portion. The same also holds true for the SBD portion (device structure 2).

(9) Step i (Gate Electrode Patterning)

Figure 30:
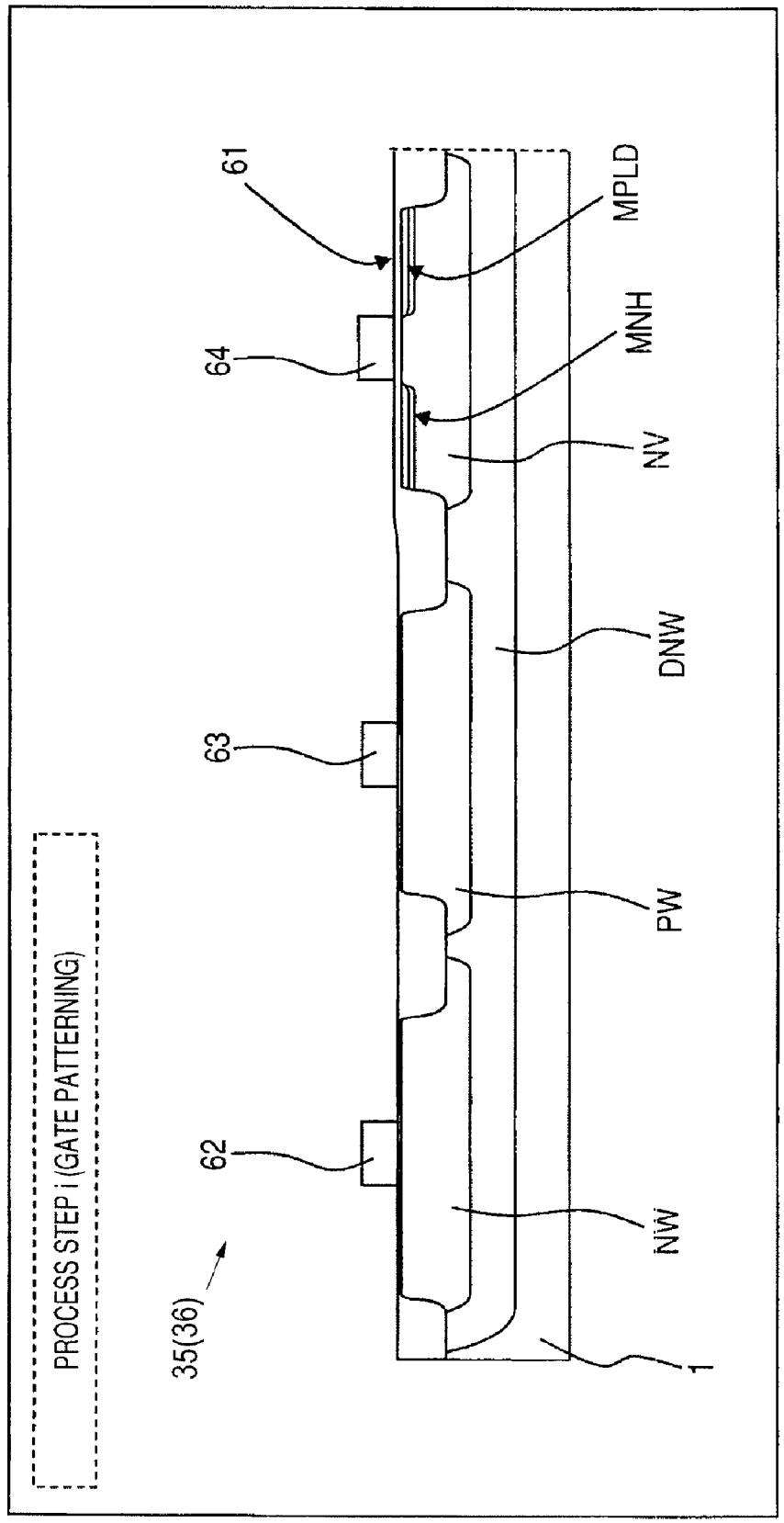
FIG. 30 is a device cross-sectional view (process step i) illustrating the process flow in the method of manufacturing the semiconductor integrated circuit device according to the embodiment of the present invention which is related to the low-breakdown-voltage portion and the intermediate-breakdown-voltage portion.

FIG. 30 is a device cross-sectional view (process step i) illustrating the process flow in the method of manufacturing the semiconductor integrated circuit device according to the embodiment of the present invention which is related to the low-breakdown-voltage portion and the intermediate-breakdown-voltage portion.

As shown in FIG. 30, patterning for forming gate electrodes 62, 63, and 64 is performed by normal lithography. Then, a resist pattern for gate patterning is removed. Subsequently, a re-oxidation process for the gate electrodes is executed. Using a new resist pattern as a mask for ion implantation, ion implantation for forming P-type extension regions MPLD in the LDD structure of a PMOS FET in the intermediate-breakdown-voltage portion is performed. Further, using the same resist pattern, ion implantation for forming the N-type halo region MNH of the PMOS FET in the intermediate-breakdown-voltage portion is performed.

Figure 45:
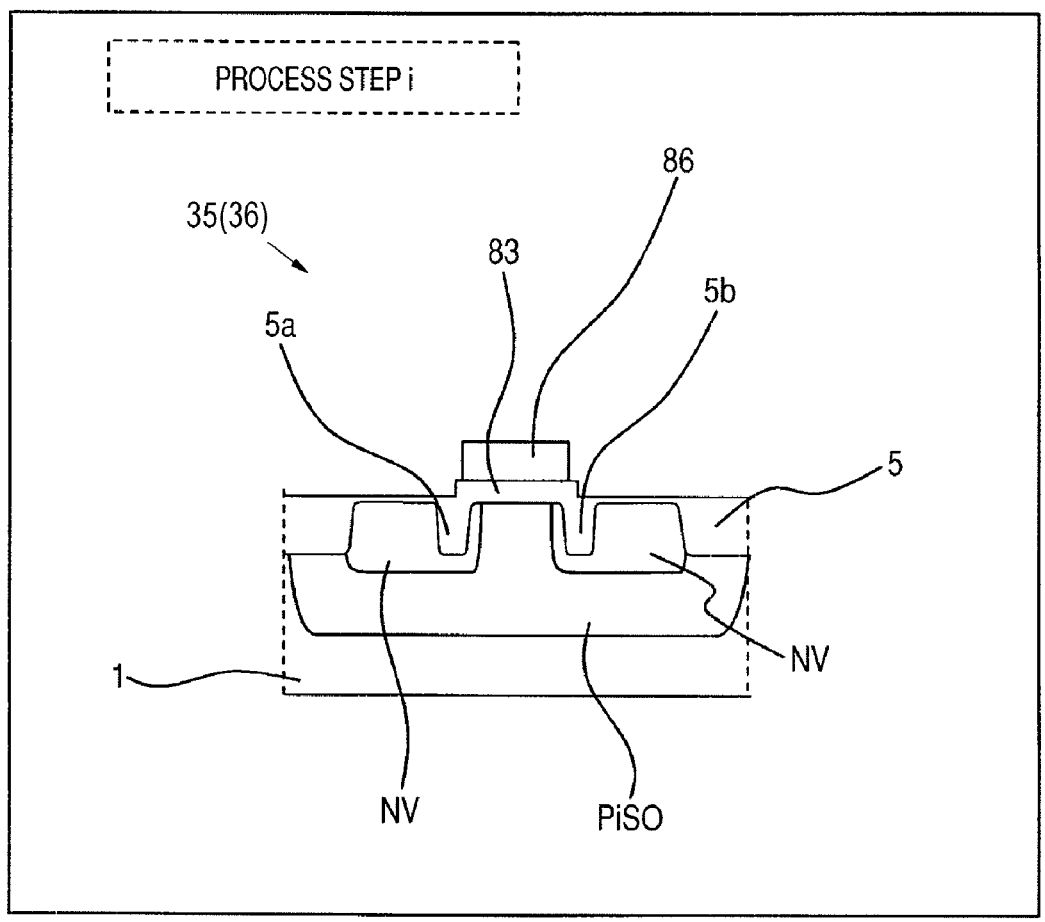
FIG. 45 is a device cross-sectional view (process step i) illustrating the process flow in the method of manufacturing the semiconductor integrated circuit device according to the embodiment of the present invention which is related to the high-breakdown-voltage portion.

Next, the high-breakdown-voltage portion will be described. FIG. 45 is a device cross-sectional view (process step i) illustrating the process flow in the method of manufacturing the semiconductor integrated circuit device according to the embodiment of the present invention which is related to the high-breakdown-voltage portion.

As shown in FIG. 45, patterning for forming a gate electrode 86 is also simultaneously performed in the high-breakdown-voltage portion.

Figure 61:
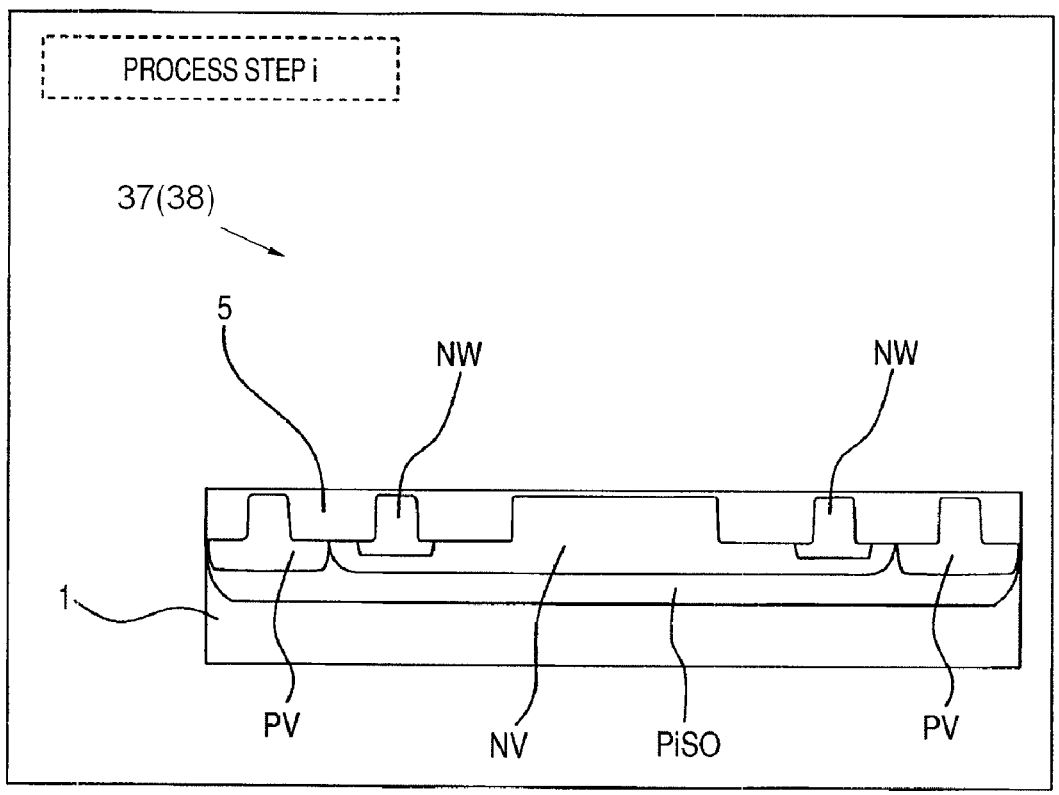
FIG. 61 is a device cross-sectional view (process step i) illustrating the process flow in the method of manufacturing the semiconductor integrated circuit device according to the embodiment of the present invention which is related to the SBD portion (device structure 1)

Next, the SBD portion (device structure 1) will be described. FIG. 61 is a device cross-sectional view (process step i) illustrating the process flow in the method of manufacturing the semiconductor integrated circuit device according to the embodiment of the present invention which is related to the SBD portion (device structure 1).

As shown in FIG. 61, as a result of the patterning for forming the gate electrodes in the low-breakdown-voltage portion, the intermediate-breakdown-voltage portion, and the like, the N-type polysilicon film DGN in the SBD portion is entirely removed.

Figure 72:
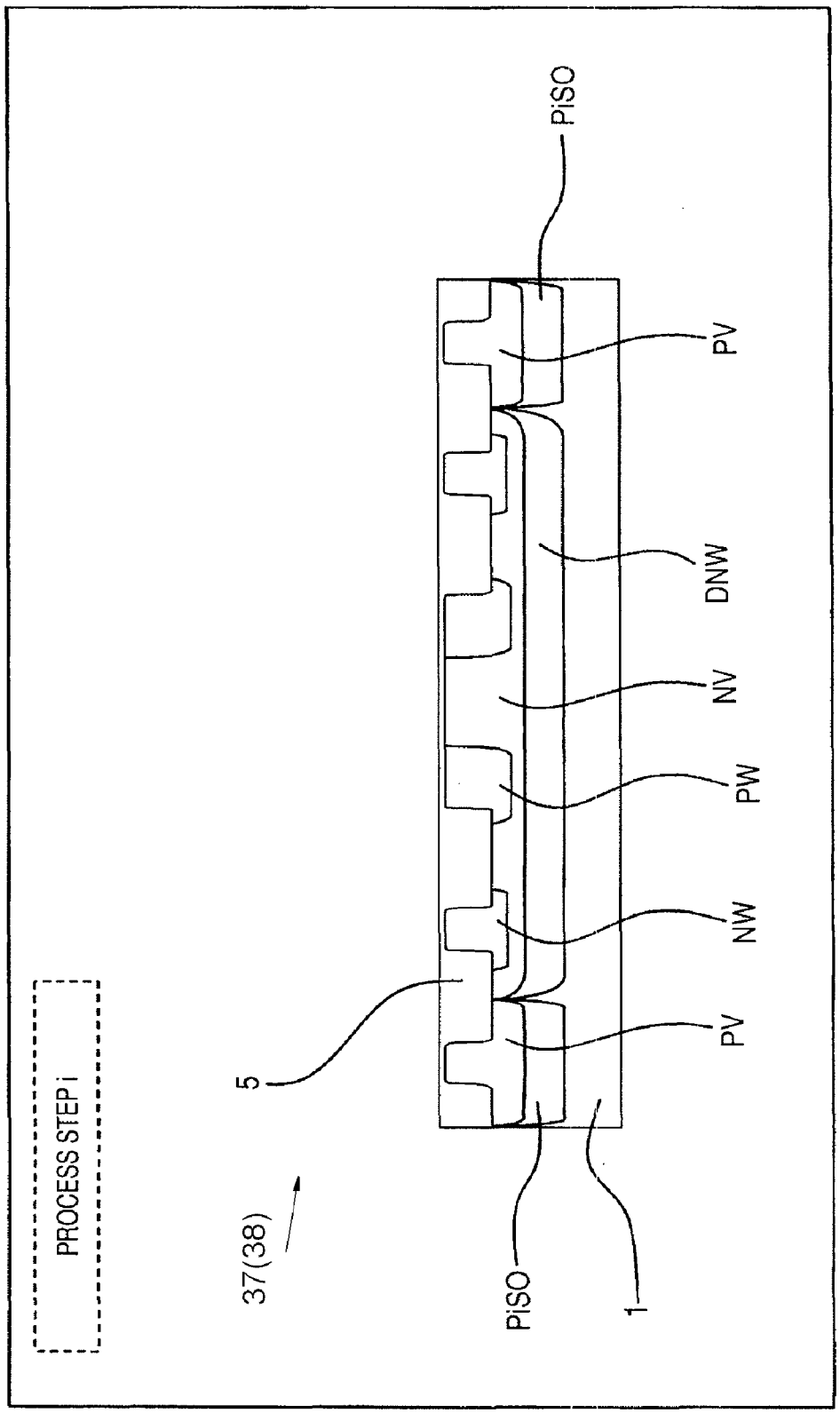
FIG. 72 is a device cross-sectional view (process step i) illustrating the process flow in the method of manufacturing the semiconductor integrated circuit device according to the embodiment of the present invention which is related to the SBD portion (device structure 2)

Next, the SBD portion (device structure 3) will be described. FIG. 72 is a device cross-sectional view (process step i) illustrating the process flow in the method of manufacturing the semiconductor integrated circuit device according to the embodiment of the present invention which is related to the SBD portion (device structure 3).

As shown in FIG. 72, as a result of the patterning for the gate electrodes in the low-breakdown-voltage portion, the intermediate-breakdown-voltage portion and the like, the N-type polysilicon film DGN in the SBD portion is entirely removed. The same also holds true for the SBD portion (device structure 3).

(10) Step j (LDD Implantation)

Figure 31:
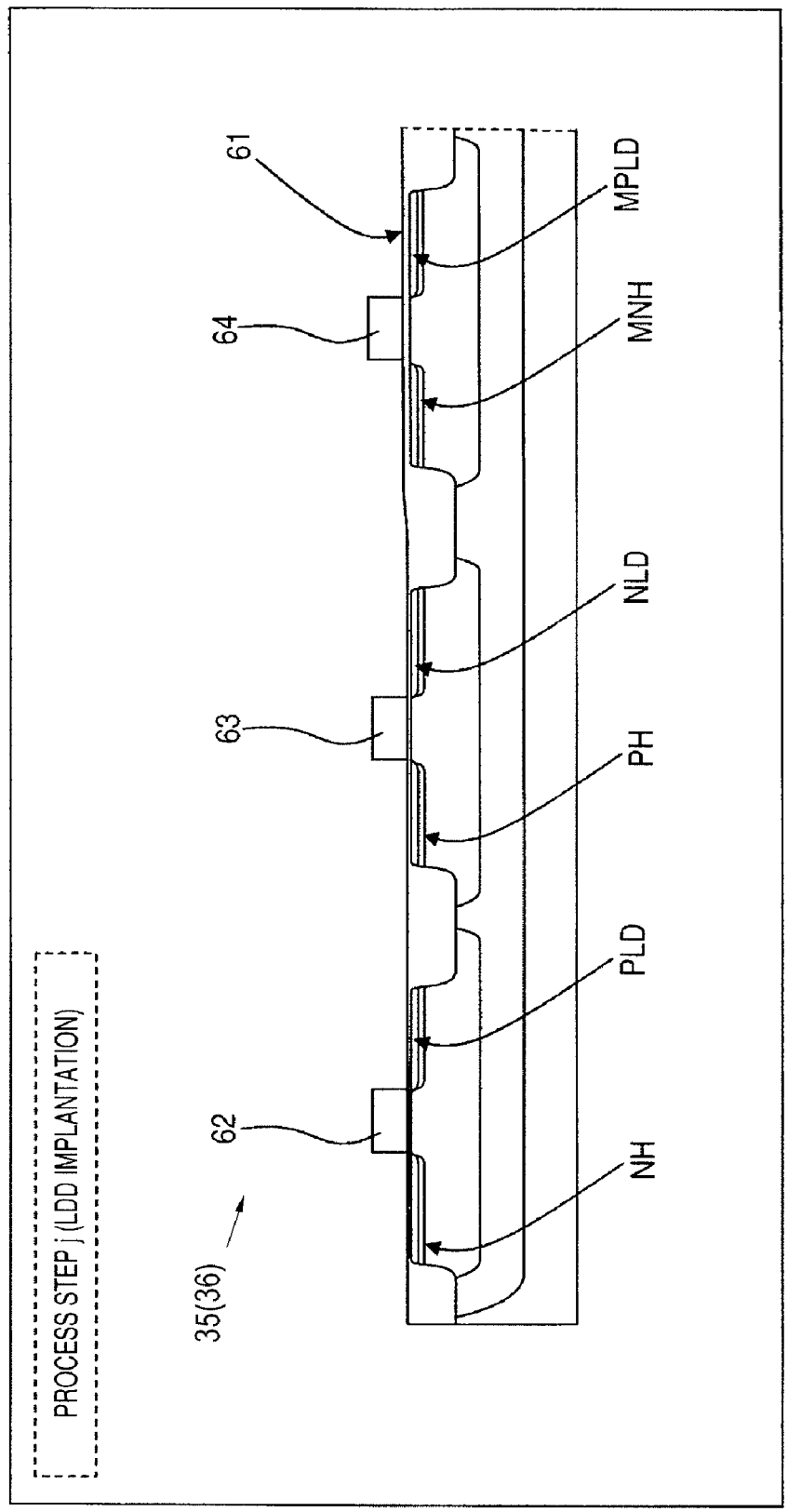
FIG. 31 is a device cross-sectional view (process step j) illustrating the process flow in the method of manufacturing the semiconductor integrated circuit device according to the embodiment of the present invention which is related to the low-breakdown-voltage portion and the intermediate-breakdown-voltage portion.

FIG. 31 is a device cross-sectional view (process step j) illustrating the process flow in the method of manufacturing the semiconductor integrated circuit device according to the embodiment of the present invention which is related to the low-breakdown-voltage portion and the intermediate-breakdown-voltage portion.

As shown in FIG. 31, using a new resist pattern as a mask for ion implantation, ion implantation for forming P-type extension regions PLD in the LDD structure of the PMOS FET in the low-breakdown-voltage portion is performed. Further, using the same resist pattern, ion implantation for forming the N-type halo region NH of the PMOS FET in the low-breakdown-voltage portion is performed. At this stage, the resist pattern is temporarily removed. Then, using a new resist pattern as a mask for ion implantation, ion implantation for forming N-type extension regions NLD in the LDD structure of the NMOS FET in the low-breakdown-voltage portion is performed. Further, using the same resist pattern, ion implantation for forming the P-type halo region PH of the NMOS FET in the low-breakdown-voltage portion is performed. Thereafter, the resist pattern which is no more needed is removed.

(11) Step k (Deposition of Sidewall Insulating Film)

Figure 32:
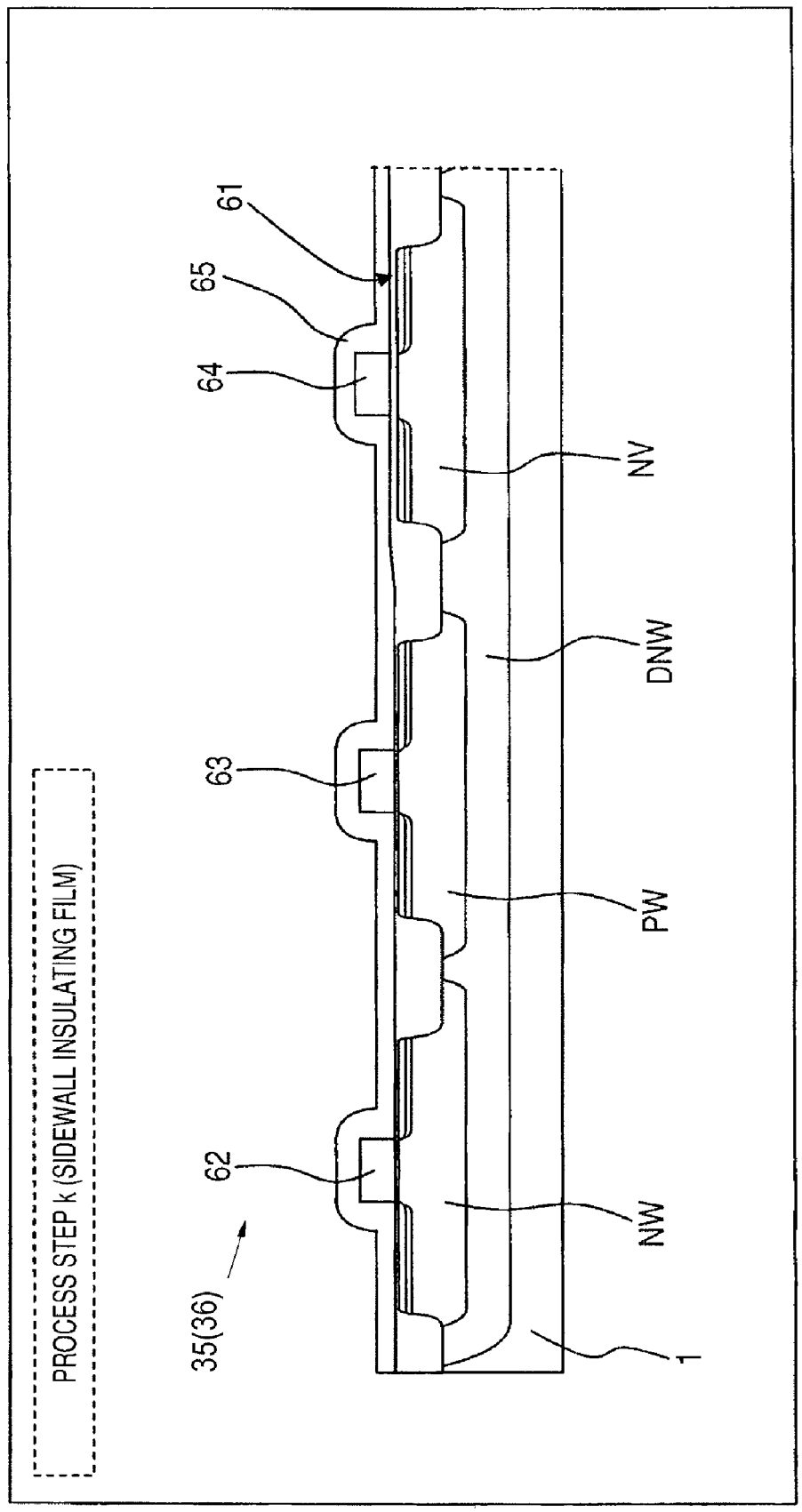
FIG. 32 is a device cross-sectional view (process step k) illustrating the process flow in the method of manufacturing the semiconductor integrated circuit device according to the embodiment of the present invention which is related to the low-breakdown-voltage portion and the intermediate-breakdown-voltage portion.

FIG. 32 is a device cross-sectional view (process step k) illustrating the process flow in the method of manufacturing the semiconductor integrated circuit device according to the embodiment of the present invention which is related to the low-breakdown-voltage portion and the intermediate-breakdown-voltage portion.

As shown in FIG. 32, a CVD silicon dioxide film 65 with a thickness of about 100 nm is deposited over the entire first principal surface of the wafer 1.

Figure 46:
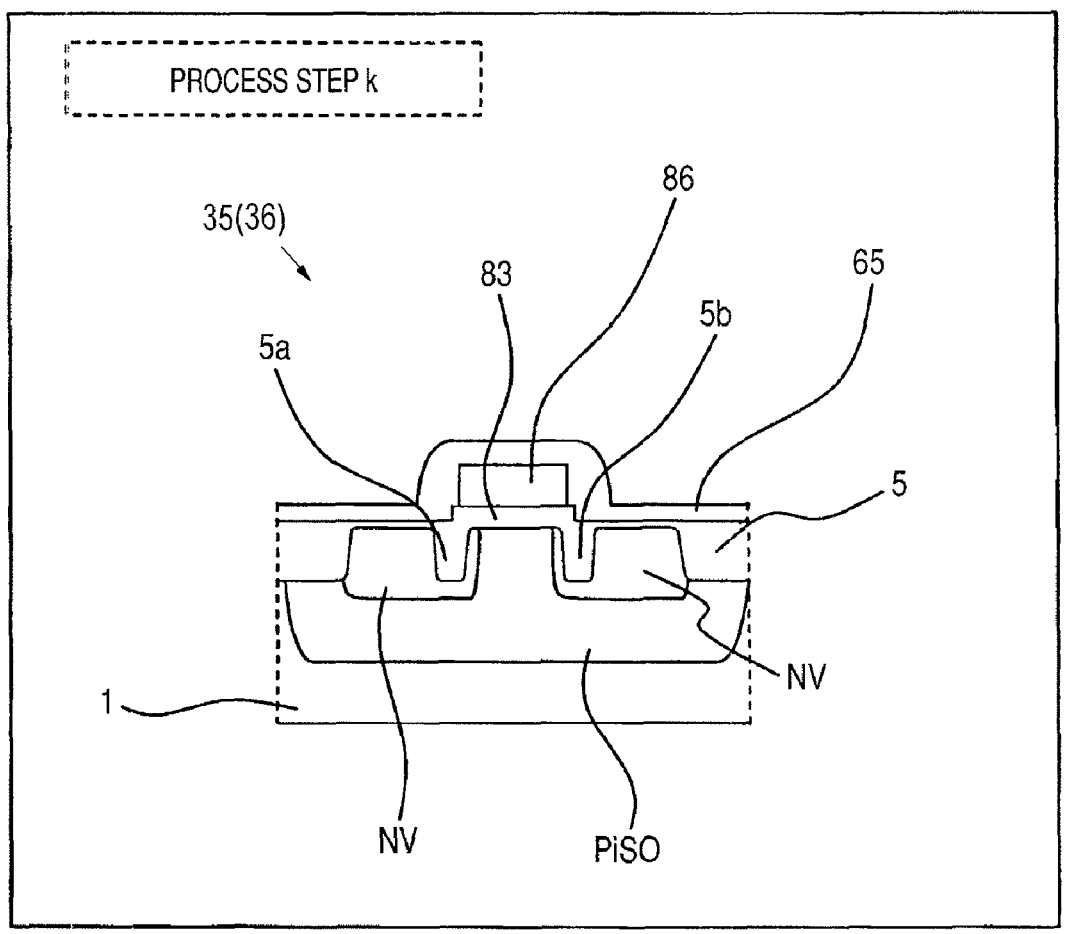
FIG. 46 is a device cross-sectional view (process step k) illustrating the process flow in the method of manufacturing the semiconductor integrated circuit device according to the embodiment of the present invention which is related to the high-breakdown-voltage portion.

Next, the high-breakdown-voltage portion will be described. FIG. 46 is a device cross-sectional view (process step k) illustrating the process flow in the method of manufacturing the semiconductor integrated circuit device according to the embodiment of the present invention which is related to the high-breakdown-voltage portion.

As shown in FIG. 46, the CVD silicon dioxide film 65 is deposited also in the high-breakdown-voltage portion.

Figure 62:
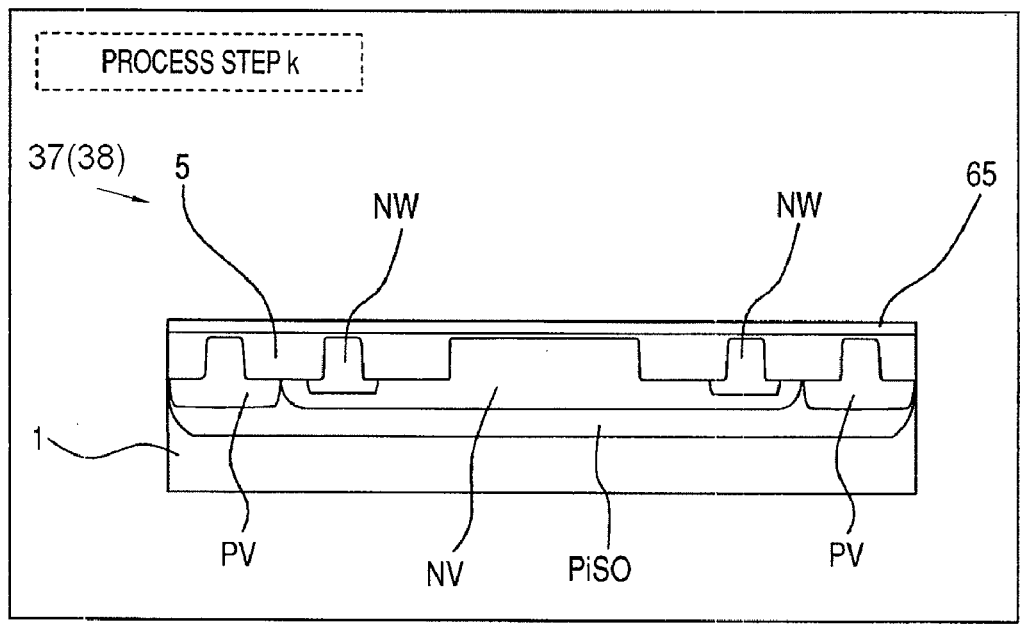
FIG. 62 is a device cross-sectional view (process step k) illustrating the process flow in the method of manufacturing the semiconductor integrated circuit device according to the embodiment of the present invention which is related to the SBD portion (device structure 1)

Next, the SBD portion (device structure 1) will be described. FIG. 62 is a device cross-sectional view (process step k) illustrating the process flow in the method of manufacturing the semiconductor integrated circuit device according to the embodiment of the present invention which is related to the SBD portion (device structure 1).

As shown in FIG. 62, the CVD silicon dioxide film 65 is deposited also in the SBD portion.

Figure 73:
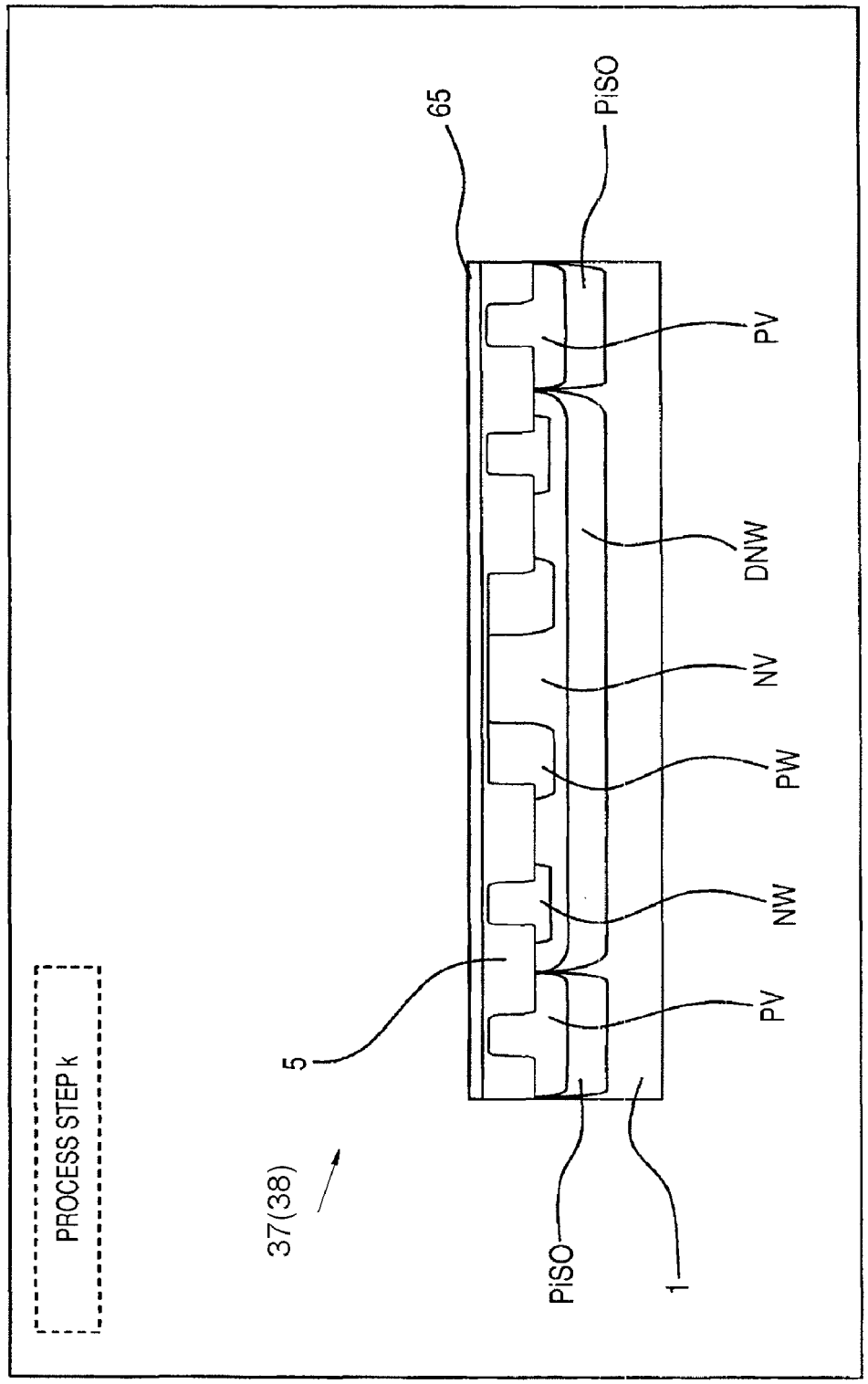
FIG. 73 is a device cross-sectional view (process step k) illustrating the process flow in the method of manufacturing the semiconductor integrated circuit device according to the embodiment of the present invention which is related to the SBD portion (device structure 2)

Next, the SBD portion (device structure 3) will be described. FIG. 73 is a device cross-sectional view (process step k) illustrating the process flow in the method of manufacturing the semiconductor integrated circuit device according to the embodiment of the present invention which is related to the SBD portion (device structure 3).

As shown in FIG. 73, the CVD silicon dioxide film 65 is also similarly deposited in the SBD portion. The same also holds true for the SBD portion (device structure 2).

(12) Step l (SD Implantation)

Figure 33:
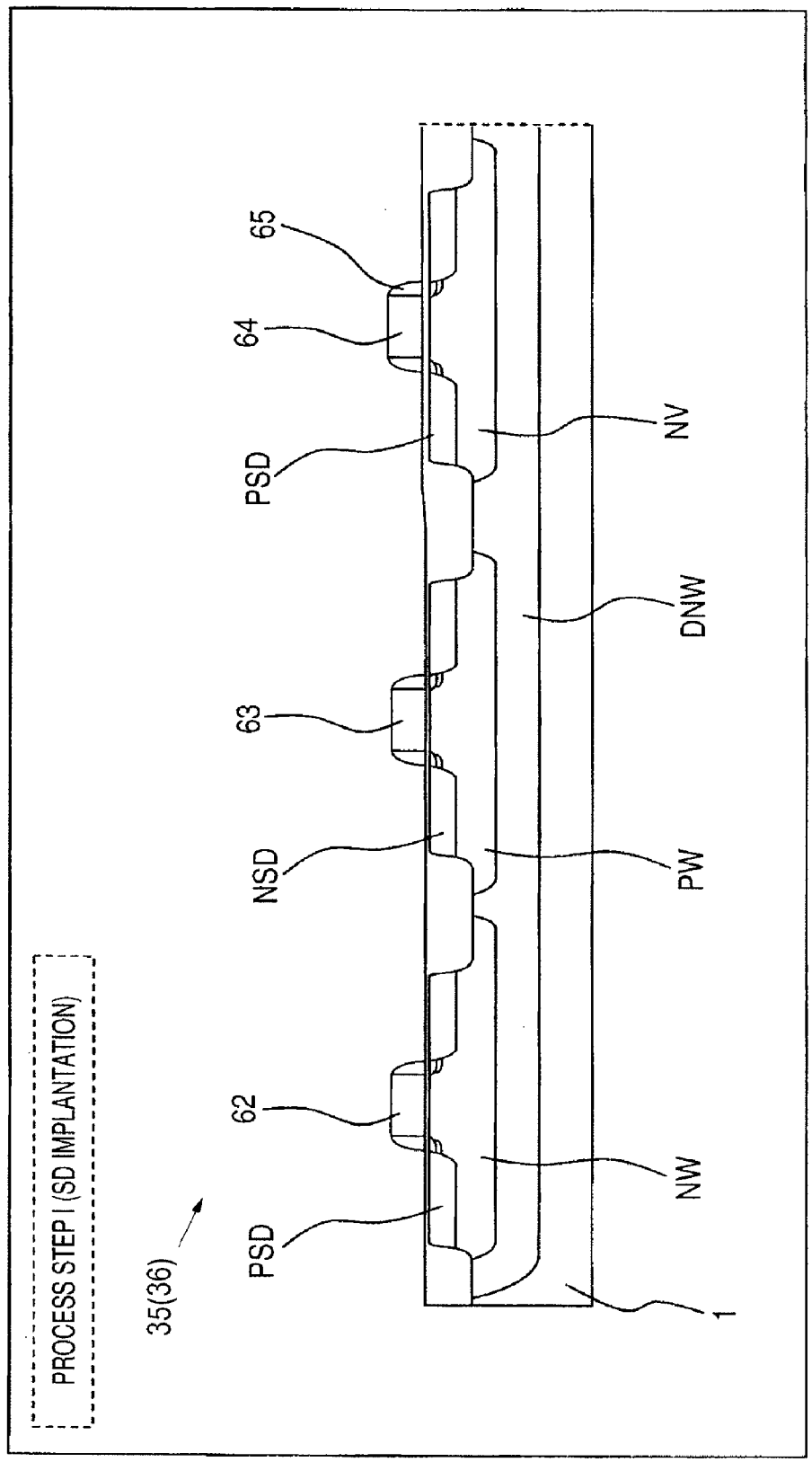
FIG. 33 is a device cross-sectional view (process step l) illustrating the process flow in the method of manufacturing the semiconductor integrated circuit device according to the embodiment of the present invention which is related to the low-breakdown-voltage portion and the intermediate-breakdown-voltage portion.

FIG. 33 is a device cross-sectional view (process step l) illustrating the process flow in the method of manufacturing the semiconductor integrated circuit device according to the embodiment of the present invention which is related to the low-breakdown-voltage portion and the intermediate-breakdown-voltage portion.

As shown in FIG. 33, the CVD silicon dioxide film 65 is processed by dry etching into the sidewalls 65. Next, using a new resist pattern as a mask for ion implantation, ion implantation for forming the high-concentration N-type source/drain regions NSD of the NMOS FET in the low-breakdown-voltage portion is performed. At this stage, the resist pattern is temporarily removed. Then, using a new resist pattern as a mask for ion implantation, ion implantation for forming the high-concentration P-type source drain regions PSD of the PMOS FET in the low-breakdown-voltage portion is performed. Thereafter, the resist patterns which are no more needed are removed.

Figure 47:
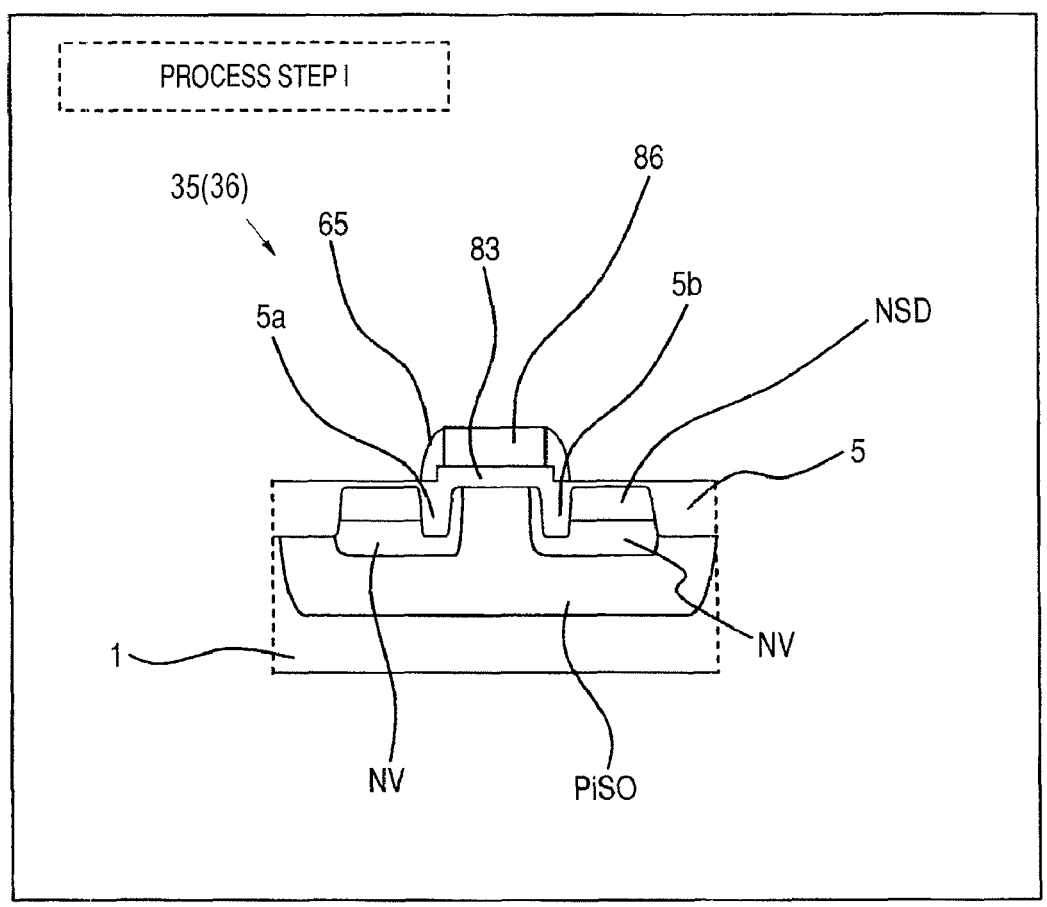
FIG. 47 is a device cross-sectional view (process step l) illustrating the process flow in the method of manufacturing the semiconductor integrated circuit device according to the embodiment of the present invention which is related to the high-breakdown-voltage portion.

Next, the high-breakdown-voltage portion will be described. FIG. 47 is a device cross-sectional view (process step l) illustrating the process flow in the method of manufacturing the semiconductor integrated circuit device according to the embodiment of the present invention which is related to the high-breakdown-voltage portion.

As shown in FIG. 47, the sidewalls 65 are also simultaneously formed in the high-breakdown-voltage portion. Further, when ion implantation for forming the high-concentration N-type source/drain regions NSD of the NMOS FET in the low-breakdown-voltage portion is performed, the high-concentration N-type source/drain regions NSD are also simultaneously performed in the N-type extension regions NV of the NMOS FET in the high-breakdown-voltage portion.

Figure 63:
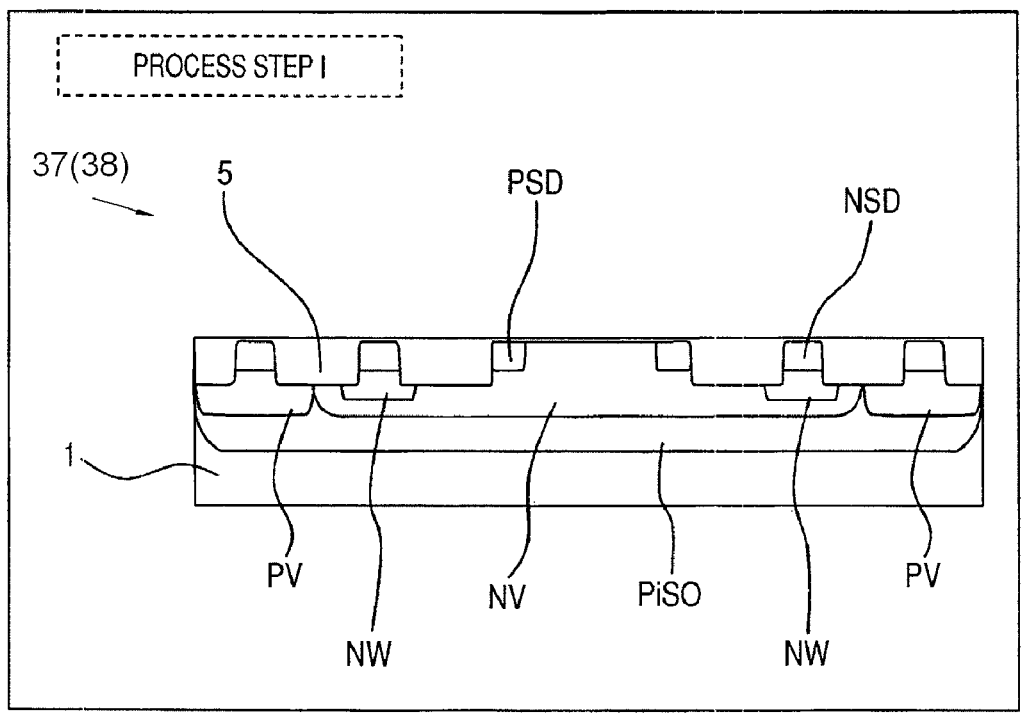
FIG. 63 is a device cross-sectional view (process step l) illustrating the process flow in the method of manufacturing the semiconductor integrated circuit device according to the embodiment of the present invention which is related to the SBD portion (device structure 1)

Next, the SBD portion (device structure 1) will be described. FIG. 63 is a device cross-sectional view (process step l) illustrating the process flow in the method of manufacturing the semiconductor integrated circuit device according to the embodiment of the present invention which is related to the SBD portion (device structure 1).

As shown in FIG. 63, when ion implantation for forming the high-concentration N-type source/drain regions NSD of the NMOS FET in the low-breakdown-voltage portion is performed, the high-concentration N-type semiconductor regions NSD are simultaneously introduced into the surface portion of the semiconductor substrate in the cathode contact portion of the SBD portion. Then, when ion implantation for forming the high-concentration P-type source/drain regions PSD of the PMOS FET in the low-breakdown-voltage portion is performed, the P-type guard ring PSD and the high-concentration P-type impurity regions PSD are simultaneously formed in the surface portion of the semiconductor substrate in the SBD portion and in the surface portion of the semiconductor substrate in the peripheral isolation region, respectively.

Figure 74:
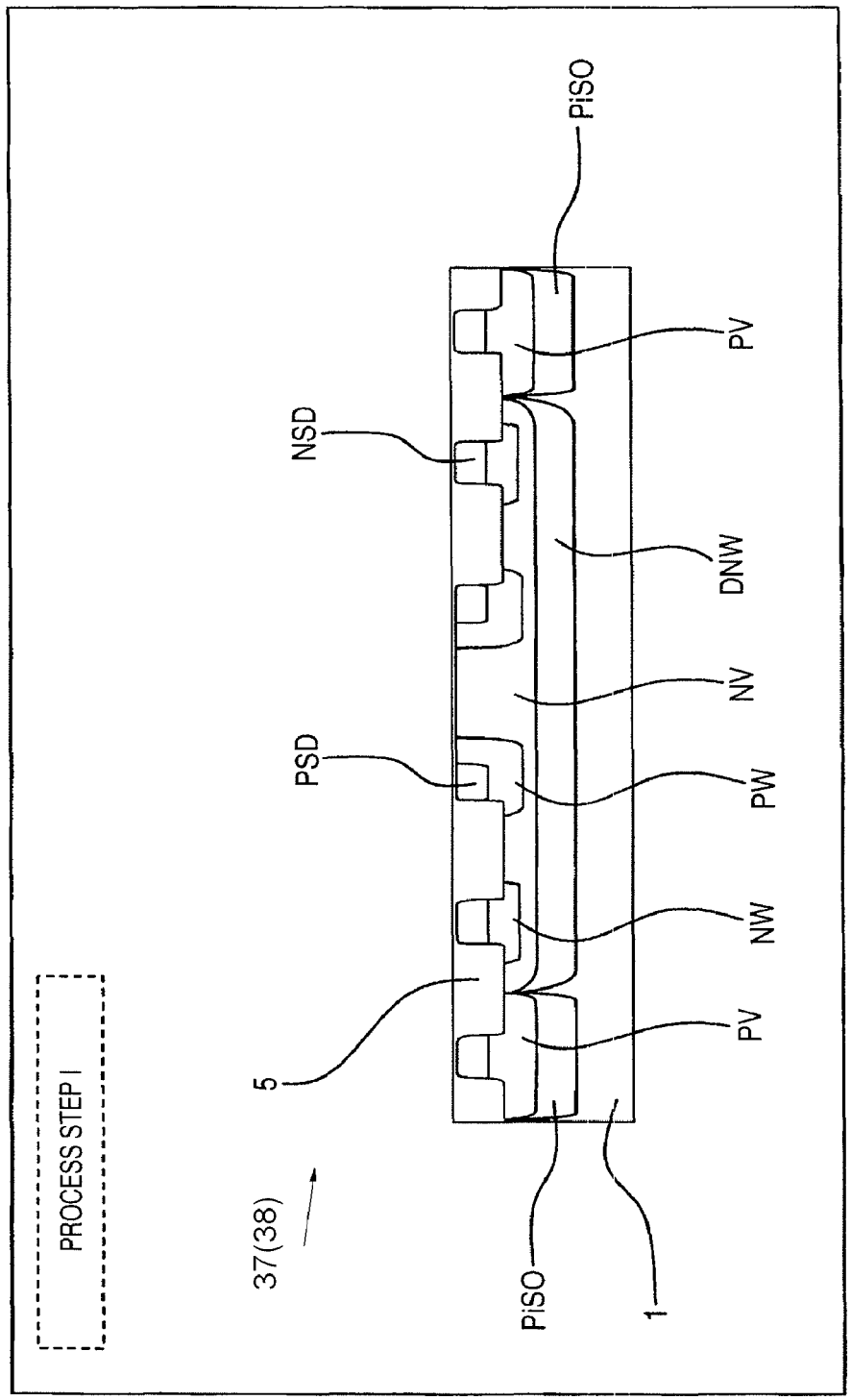
FIG. 74 is a device cross-sectional view (process step l) illustrating the process flow in the method of manufacturing the semiconductor integrated circuit device according to the embodiment of the present invention which is related to the SBD portion (device structure 2)

Next, the SBD portion (device structure 3) will be described. FIG. 74 is a device cross-sectional view (process step l) illustrating the process flow in the method of manufacturing the semiconductor integrated circuit device according to the embodiment of the present invention which is related to the SBD portion (device structure 3).

As shown in FIG. 74, when ion implantation for forming the high-concentration N-type source/drain regions NSD of the NMOS FET in the low-breakdown-voltage portion is performed, the high-concentration N-type semiconductor regions NSD are simultaneously introduced in the surface portion of the semiconductor substrate in the cathode contact portion of the SBD portion. Then, when ion implantation for forming the high-concentration P-type source/drain regions PSD of the PMOS FET in the low-breakdown-voltage portion is performed, the high-concentration P-type guard ring PSD and the high-concentration P-type impurity regions PSD are simultaneously formed within the low-concentration P-type guard ring PW in the surface portion of the semiconductor substrate in the SBD portion and in the surface portion of the semiconductor substrate in the peripheral isolation region, respectively.

Figure 84:
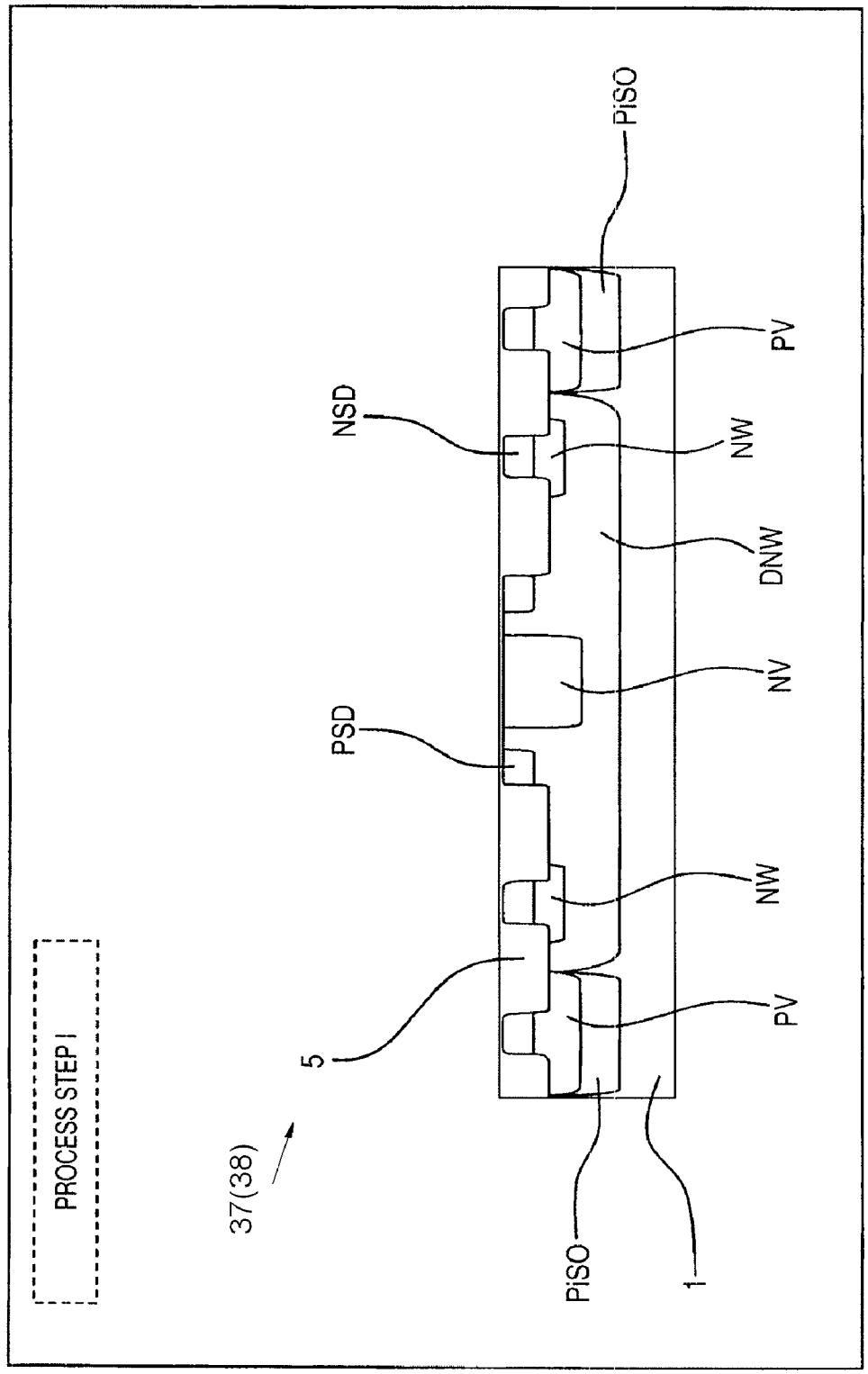
FIG. 84 is a device cross-sectional view (process step l) illustrating the process flow in the method of manufacturing the semiconductor integrated circuit device according to the embodiment of the present invention which is related to the SBD portion (device structure 3)
Figure 85:
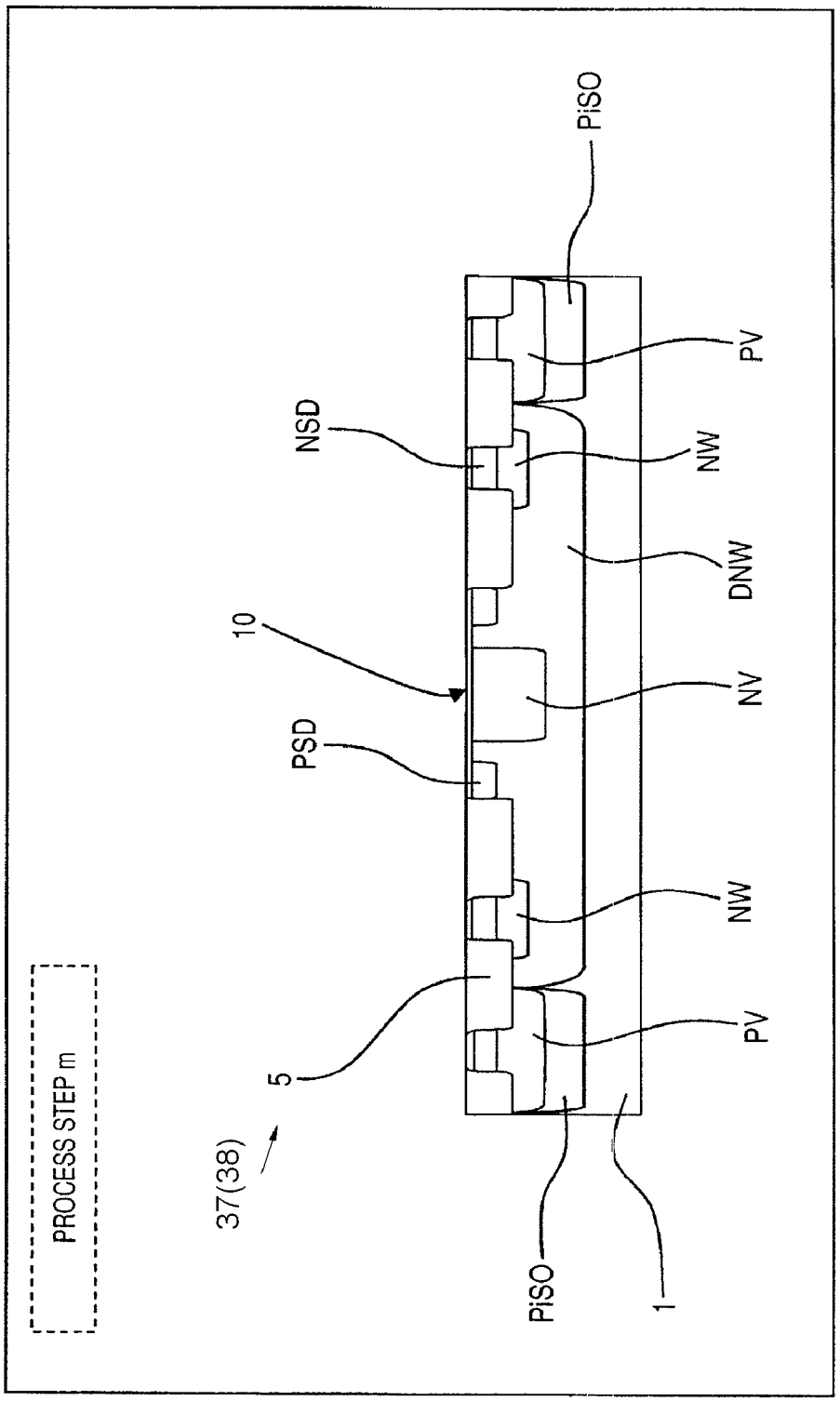
FIG. 85 is a device cross-sectional view (process step m) illustrating the process flow in the method of manufacturing the semiconductor integrated circuit device according to the embodiment of the present invention which is related to the SBD portion (device structure 3)

Next, the SBD portion (device structure 2) will be described. FIG. 84 is a device cross-sectional view (process step l) illustrating the process flow in the method of manufacturing the semiconductor integrated circuit device according to the embodiment of the present invention which is related to the SBD portion (device structure 2).

As shown in FIG. 84, when ion implantation for forming the high-concentration N-type source/drain regions NSD of the NMOS FET in the low-breakdown-voltage portion is performed, the high-concentration N-type semiconductor regions NSD are simultaneously introduced in the surface portion of the semiconductor substrate in the cathode contact portion of the SBD portion. Then, when ion implantation for forming the high-concentration P-type source/drain regions PSD of the PMOS FET in the low-breakdown-voltage portion is performed, the high-concentration P-type guard ring PSD and the high-concentration P-type impurity regions PSD are simultaneously formed in the surface portion of the low-concentration N-type deep well region DNW of the SBD portion and in the surface portion of the semiconductor substrate in the peripheral isolation region, respectively.

(13) Step m (Formation of Cobalt Film)

Figure 34:
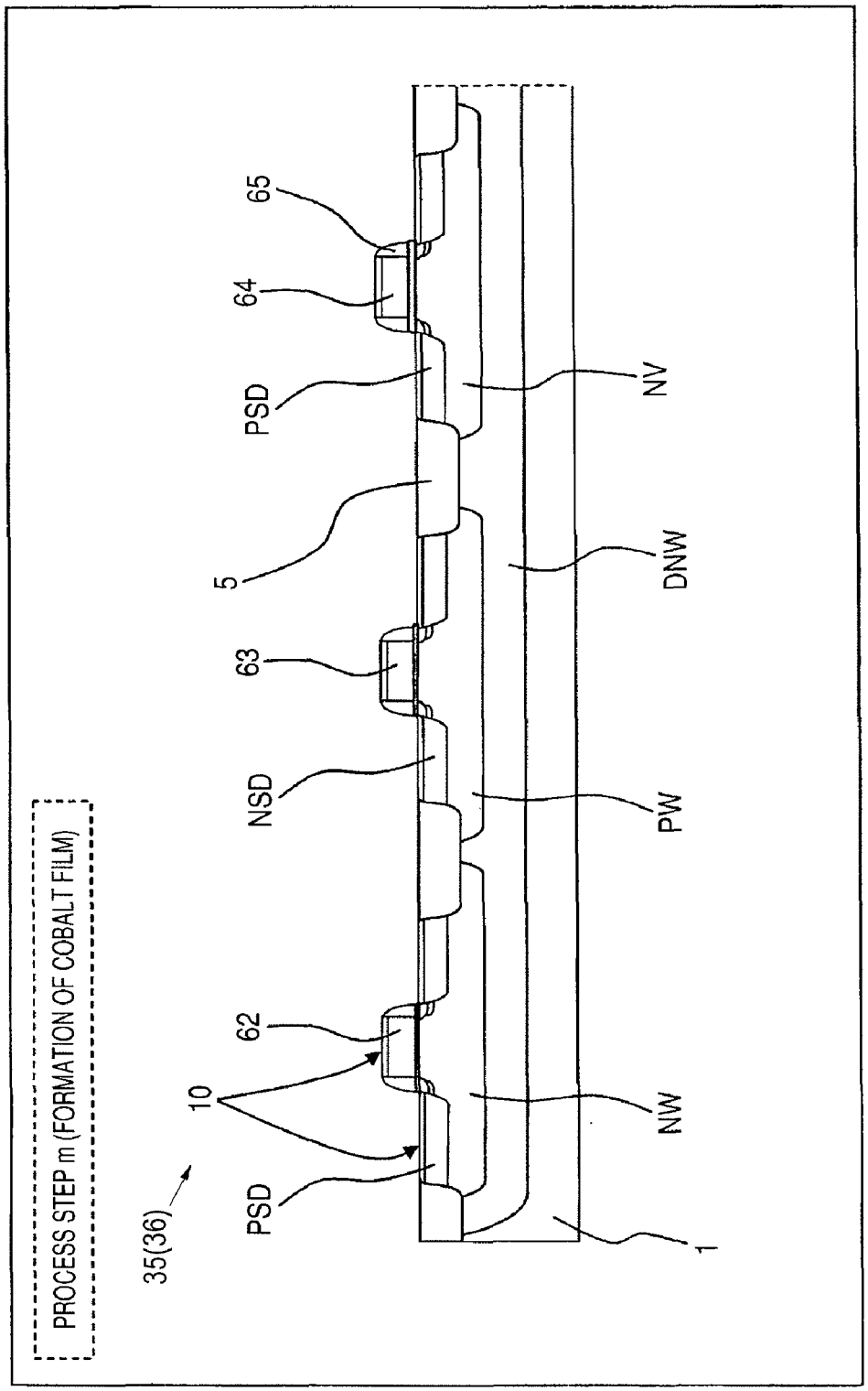
FIG. 34 is a device cross-sectional view (process step m) illustrating the process flow in the method of manufacturing the semiconductor integrated circuit device according to the embodiment of the present invention which is related to the low-breakdown-voltage portion and the intermediate-breakdown-voltage portion.

FIG. 34 is a device cross-sectional view (process step m) illustrating the process flow in the method of manufacturing the semiconductor integrated circuit device according to the embodiment of the present invention which is related to the low-breakdown-voltage portion and the intermediate-breakdown-voltage portion.

As shown in FIG. 34, cobalt silicide layers 10 are formed over the source drain regions, the gate electrodes except in the high-breakdown-voltage portion, and the like.

Figure 48:
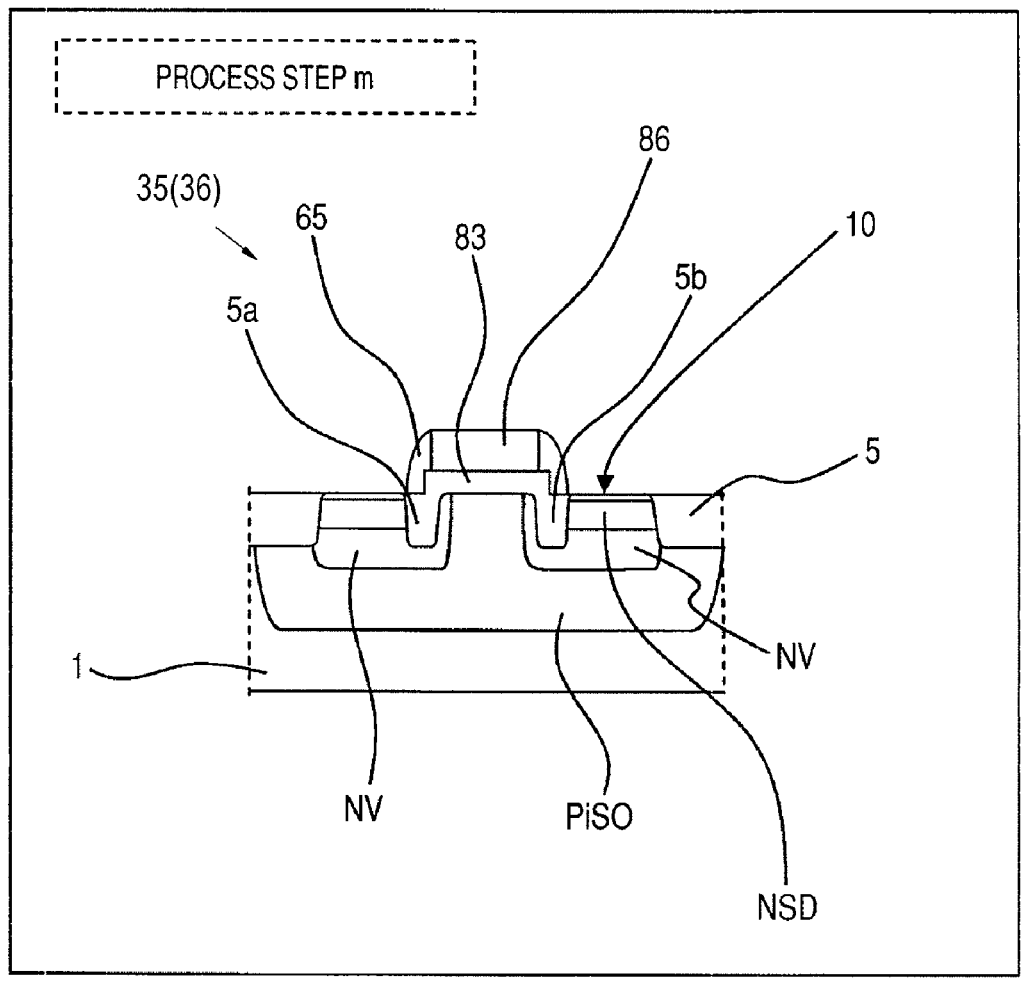
FIG. 48 is a device cross-sectional view (process step m) illustrating the process flow in the method of manufacturing the semiconductor integrated circuit device according to the embodiment of the present invention which is related to the high-breakdown-voltage portion.

Next, the high-breakdown-voltage portion will be described. FIG. 48 is a device cross-sectional view (process step m) illustrating the process flow in the method of manufacturing the semiconductor integrated circuit device according to the embodiment of the present invention which is related to the high-breakdown-voltage portion.

As shown in FIG. 48, the cobalt silicide layers 10 are also simultaneously formed over the source/drain regions NSD in the high breakdown-voltage portion.

Figure 64:
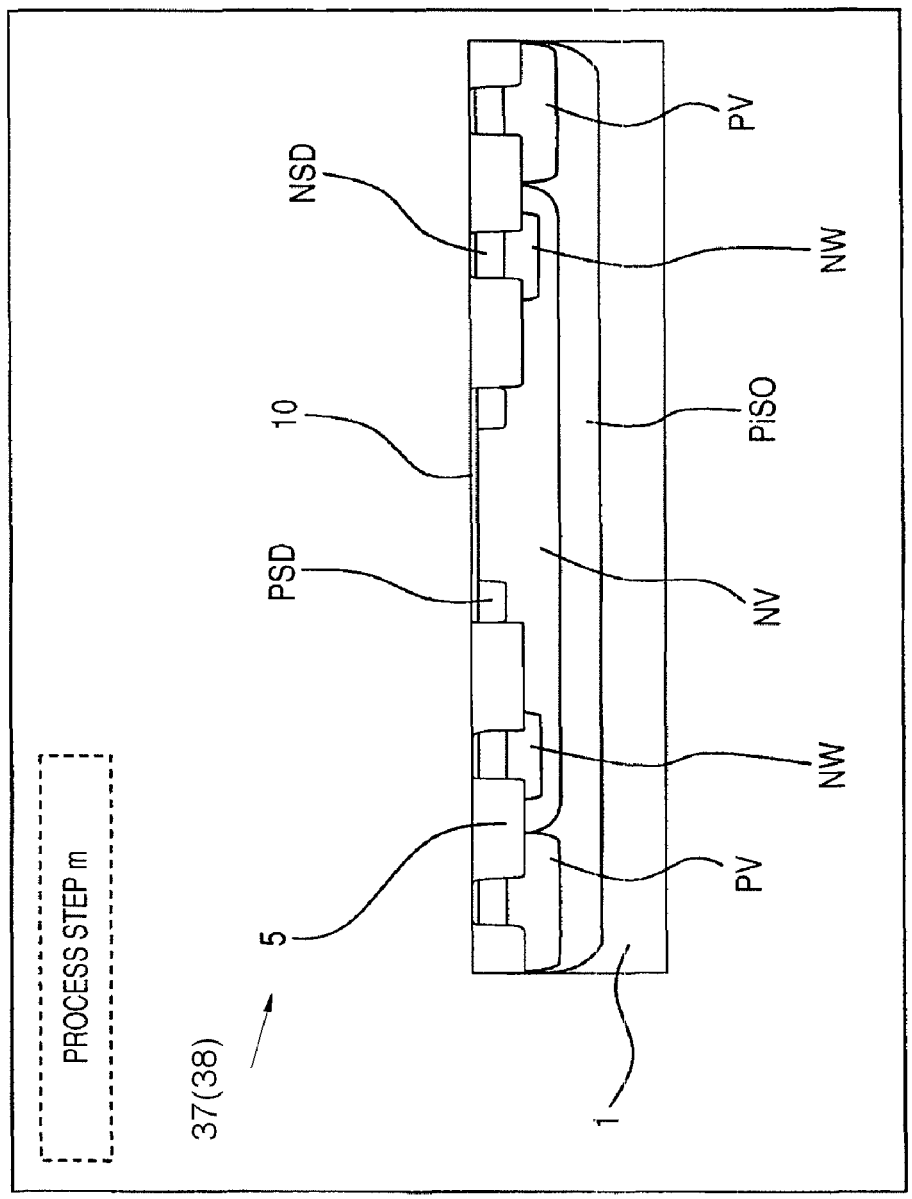
FIG. 64 is a device cross-sectional view (process step m) illustrating the process flow in the method of manufacturing the semiconductor integrated circuit device according to the embodiment of the present invention which is related to the SBD portion (device structure 1)

Next, the SBD portion (device structure 1) will be described. FIG. 64 is a device cross-sectional view (process step m) illustrating the process flow in the method of manufacturing the semiconductor integrated circuit device according to the embodiment of the present invention which is related to the SBD portion (device structure 1).

As shown in FIG. 64, at the same time as the formation of the cobalt silicide layers 10 (the finished thicknesses of which in the portion where the contact electrodes are not provided are in an optimum range of 20 nm to 30 nm around a center value of 25 nm) associated with the low-breakdown-voltage and the intermediate-breakdown-voltage portion, the cobalt silicide layers 10 each serving as an actual anode-side metal portion in a Schottky junction are formed also in the SBD portion. At this time, the cobalt silicide layers 10 are formed also in the cathode contact portion and the peripheral isolation contact portion.

Figure 75:
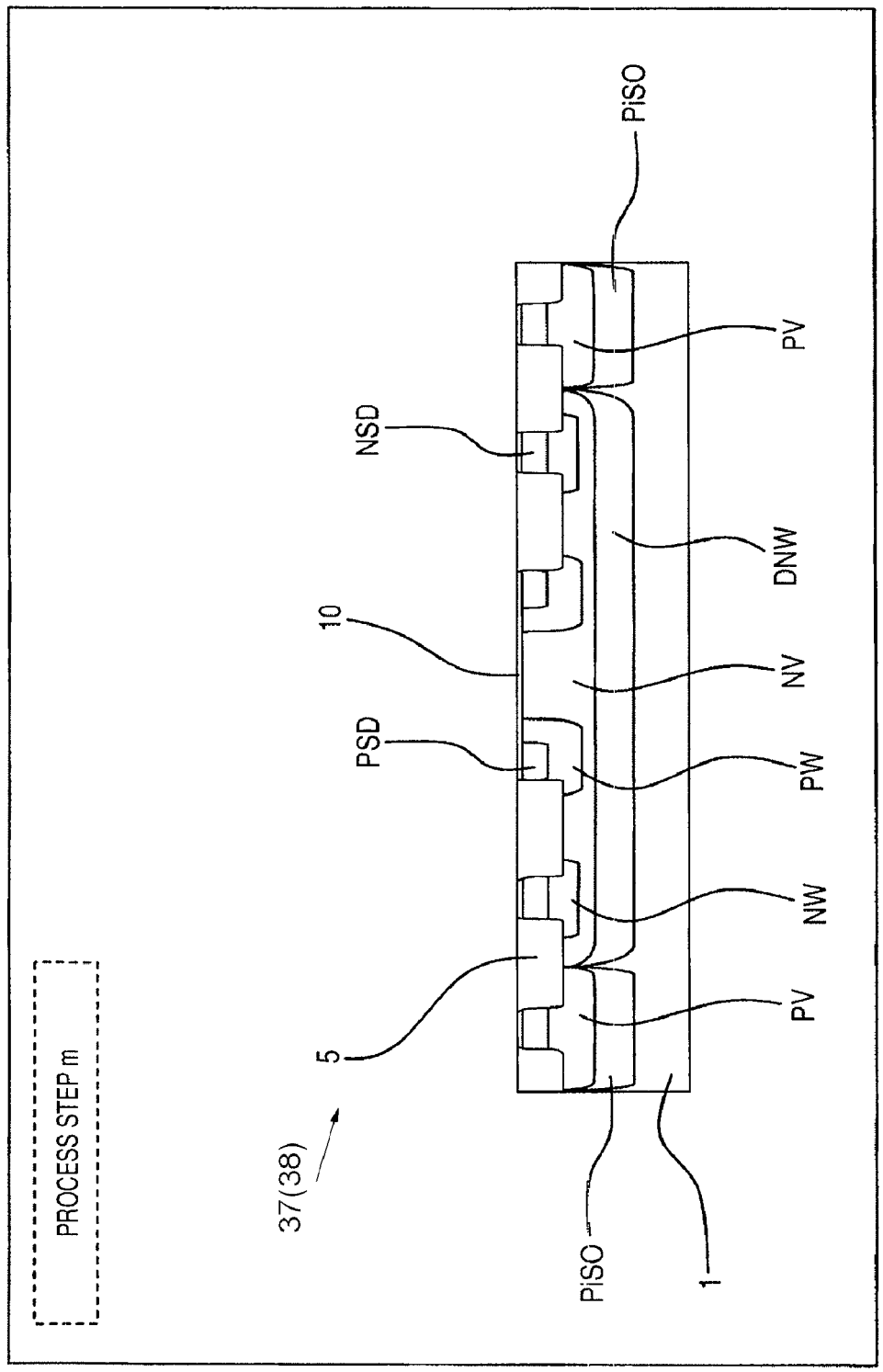
FIG. 75 is a device cross-sectional view (process step m) illustrating the process flow in the method of manufacturing the semiconductor integrated circuit device according to the embodiment of the present invention which is related to the SBD portion (device structure 2)

Next, the SBD portion (device structure 3) will be described. FIG. 75 is a device cross-sectional view (process step m) illustrating the process flow in the method of manufacturing the semiconductor integrated circuit device according to the embodiment of the present invention which is related to the SBD portion (device structure 3).

As shown in FIG. 75, at the same time as the formation of the cobalt silicide layers 10 associated with the low-breakdown-voltage and the intermediate-breakdown-voltage portion, the cobalt silicide layers 10 each serving as an actual anode-side metal portion in a Schottky junction are formed also in the SBD portion. At this time, the cobalt silicide layers 10 are formed also in the cathode contact portion and the peripheral isolation contact portion. The same also holds true also for the SBD (device structure 2).

(14) Step o (Contact)

Figure 35:
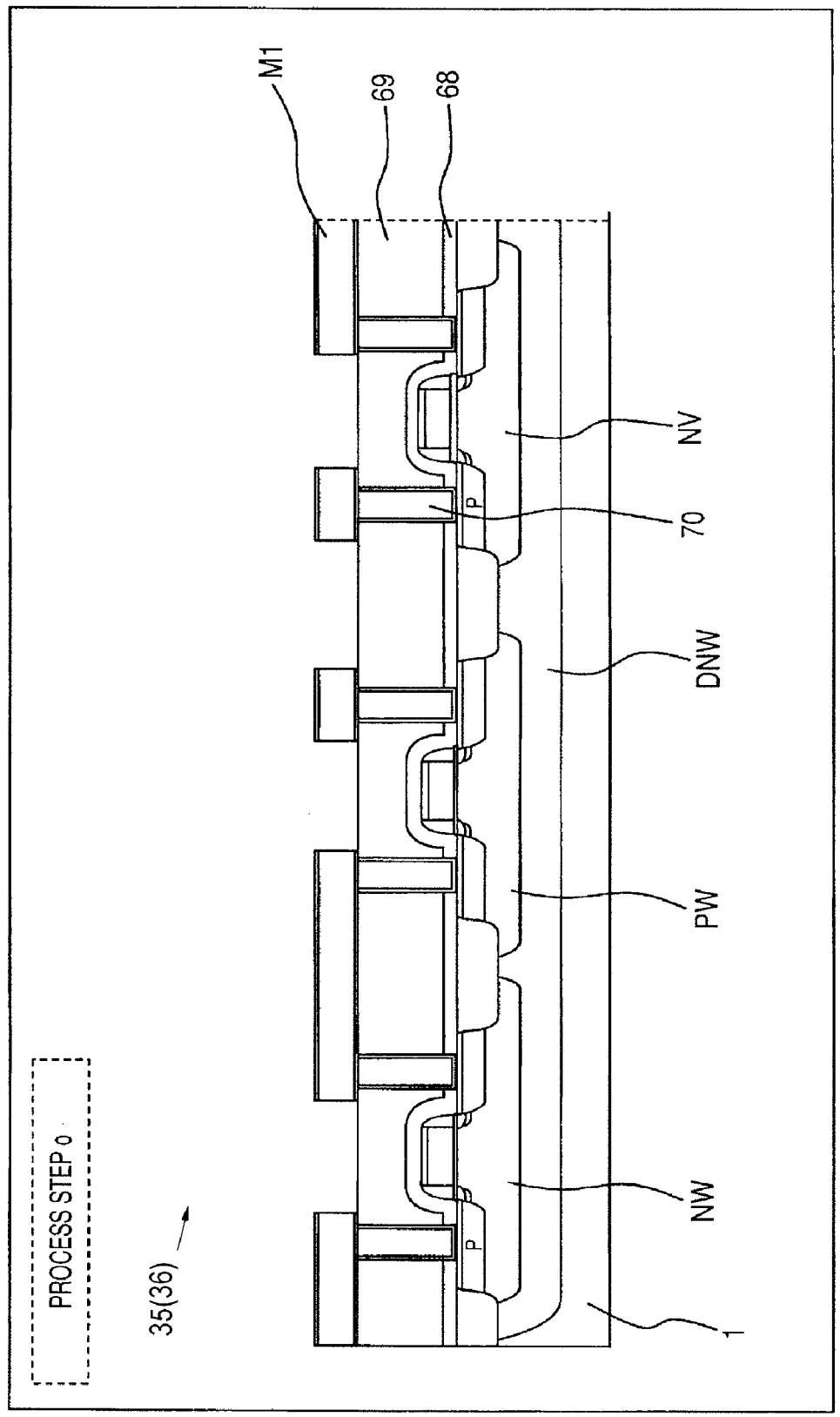
FIG. 35 is a device cross-sectional view (process step o) illustrating the process flow in the method of manufacturing the semiconductor integrated circuit device according to the embodiment of the present invention which is related to the low-breakdown-voltage portion and the intermediate-breakdown-voltage portion.

FIG. 35 is a device cross-sectional view (process step o) illustrating the process flow in the method of manufacturing the semiconductor integrated circuit device according to the embodiment of the present invention which is related to the low-breakdown-voltage portion and the intermediate-breakdown-voltage portion.

As shown in FIG. 35, a plasma CVD silicon nitride film with a thickness of about 50 nm is deposited over the entire first principal surface of the wafer 1. Over the plasma CVD silicon nitride film 68, a plasma CVD silicon dioxide film 69 (with a final thickness of about 500 nm) is deposited. The plasma CVD silicon dioxide film 69 is planarized by CMP. A resist pattern for contact hole openings is formed in the planarized plasma CVD silicon dioxide film 69. Using the resist pattern as a mask, the contact hole openings are formed by dry etching. Then, the resist pattern which is no more needed is removed. Thereafter, in order to slightly remove the underlie (by a thickness of about 10 nm) in the contact hole openings by etching, sputter etching is performed in an argon atmosphere (the avoidance of the influence of variations in this step is a factor for which a modification of the SBD structure as shown in the present embodiment is needed). The sputter etching is performed using, e.g., a single-wafer apparatus under such conditions as an argon gas flow rate of 20 sccm, an RF power of 500 W (60 MHz), and a pressure of about 0.5 Pa.

Subsequently, a titanium film is formed as a part of a barrier metal to a thickness of, e.g., about 10 nm by sputtering. Then, a titanium nitride film is continuously formed as a part of the barrier metal to a thickness of, e.g., about 30 nm by sputtering and CVD. Thereafter, a tungsten layer is formed by CVD so as to fill up the contact hole openings. Plugs 70 are formed by removing the unneeded portion of the tungsten layer by CMP. Further, an aluminum-based wiring layer M1 (a multilayer structure made of an aluminum-alloy/Ti/TiN containing, e.g., Ti/TiN/Al deposited upwardly in this order as main components, and copper or another additive in a proportion of not more than several percents, in which the thicknesses of the individual layers are, e.g., 10 nm/30 nm/300 nm/10 nm/20 nm) serving as a first-layer wiring is formed as a film by sputtering. The aluminum-based wiring layer M1 is patterned by typical lithography. Thereafter, the resist pattern which is no more needed is removed.

Figure 49:
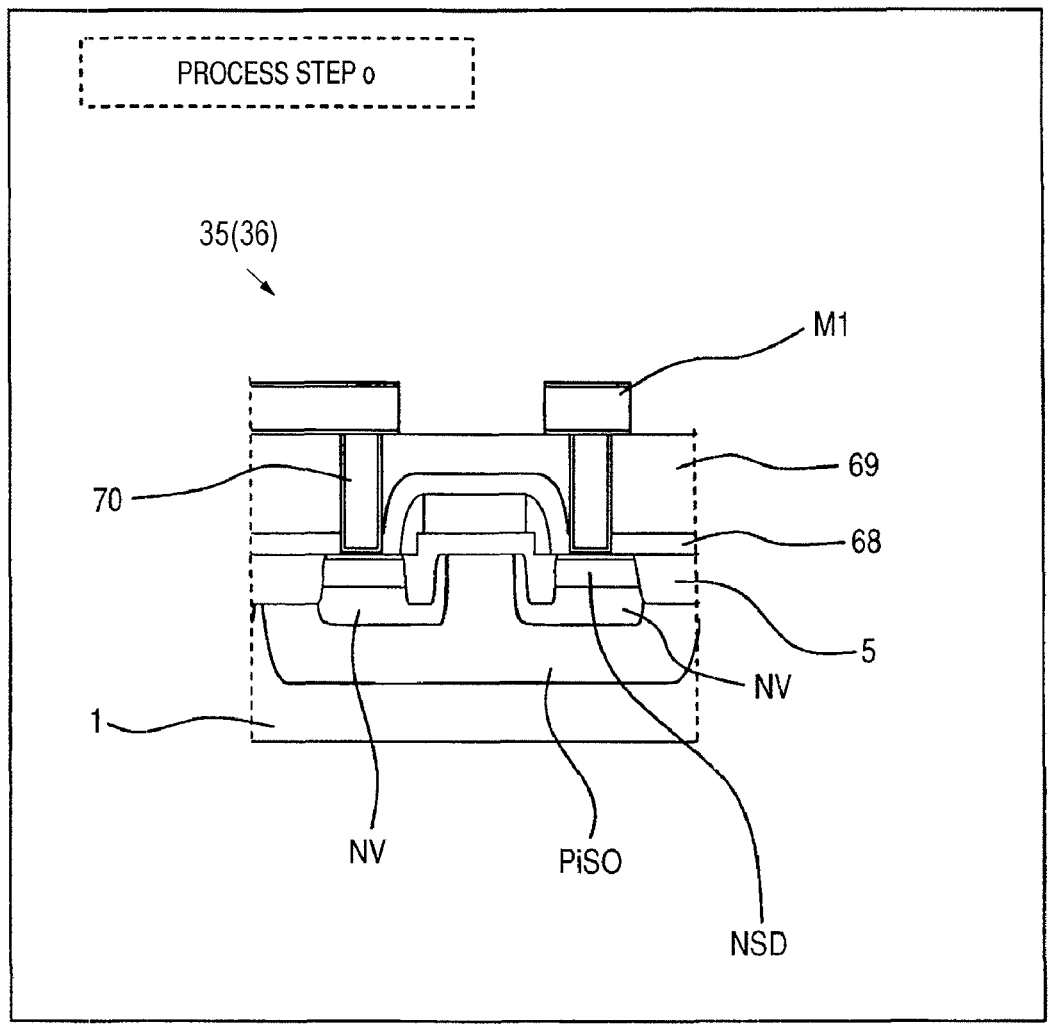
FIG. 49 is a device cross-sectional view (process step o) illustrating the process flow in the method of manufacturing the semiconductor integrated circuit device according to the embodiment of the present invention which is related to the high-breakdown-voltage portion.

Next, the high-breakdown-voltage portion is described. FIG. 49 is a device cross-sectional view (process step o) illustrating the process flow in the method of manufacturing the semiconductor integrated circuit device according to the embodiment of the present invention which is related to the high-breakdown-voltage portion.

As shown in FIG. 49, at the same time as each of the wiring steps including the steps of forming and planarizing the plasma CVD silicon nitride film 68 and the plasma CVD silicon dioxide film 69, the step of providing contact, and the step of forming the aluminum-based wiring layer M1 in each of the low-breakdown-voltage portion and the intermediate-breakdown-voltage portion, the same process is also performed in the high-breakdown-voltage portion.

Figure 65:
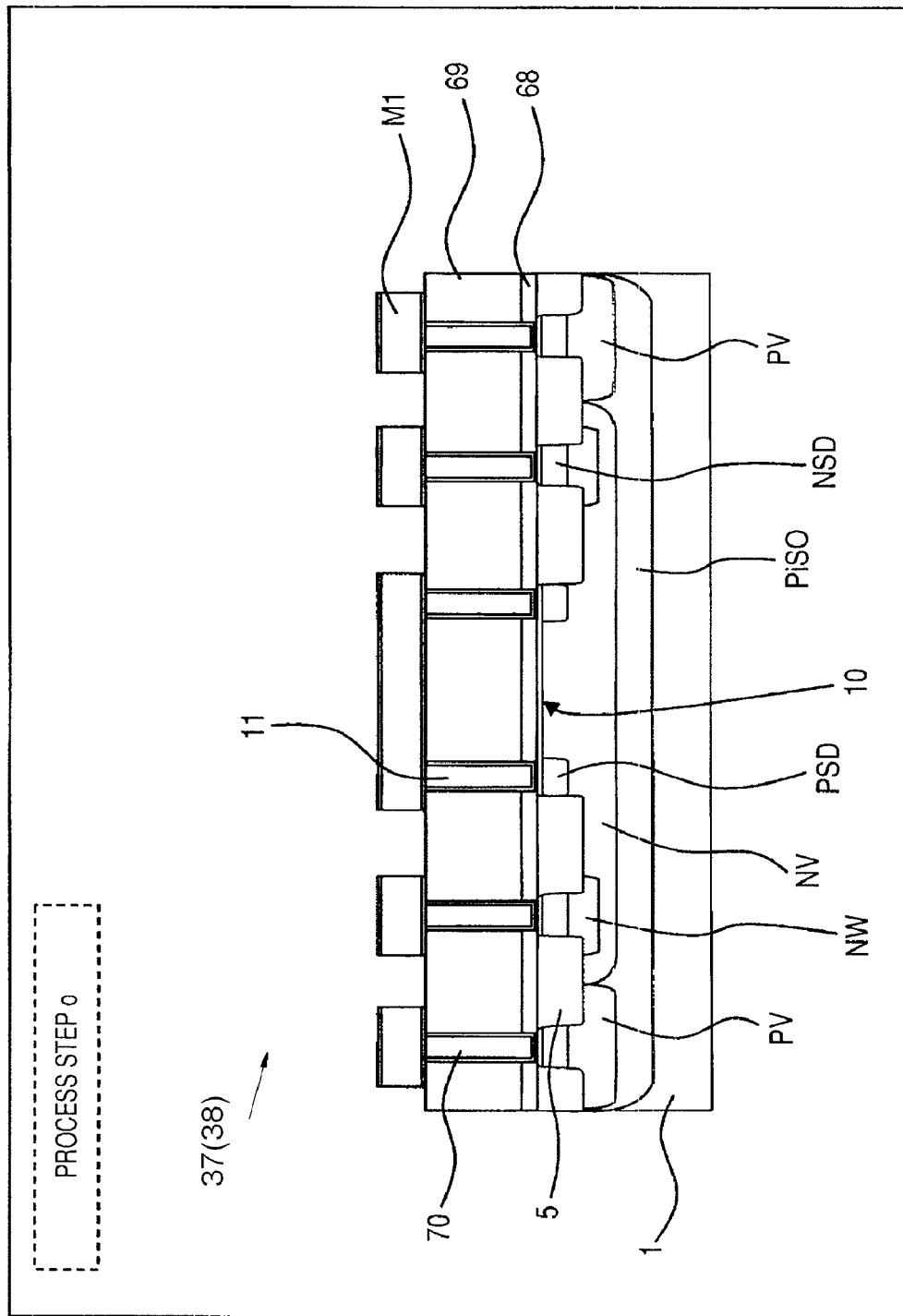
FIG. 65 is a device cross-sectional view (process step o) illustrating the process flow in the method of manufacturing the semiconductor integrated circuit device according to the embodiment of the present invention which is related to the SBD portion (device structure 1)

Next, the SBD portion (device structure 1) will be described. FIG. 65 is a device cross-sectional view (process step l) illustrating the process flow in the method of manufacturing the semiconductor integrated circuit device according to the embodiment of the present invention which is related to the SBD portion (device structure 1).

As shown in FIG. 65, in parallel with the process performed with respect to each of the low-breakdown-voltage portion and the intermediate-breakdown-voltage portion, a process as shown below is progressively performed with respect to the SBD portion. That is, the plasma CVD silicon nitride film 68 with a thickness of about 50 nm is deposited over the entire first principal surface of the wafer 1. Over the plasma CVD silicon nitride film 68, the plasma CVD silicon dioxide film 69 is deposited. The plasma CVD silicon dioxide film 69 is planarized by CMP. A resist pattern for contact hole openings is formed in the planarized plasma CVD silicon dioxide film 69. Using the resist pattern as a mask, the contact hole openings are formed by dry etching. Then, the resist pattern which is no more needed is removed. Thereafter, in order to slightly remove the underlie in the contact hole openings by etching, sputter etching is performed in an argon atmosphere. Subsequently, a titanium film is formed as a part of a barrier metal to a thickness of, e.g., about 10 nm by sputtering. Then, a titanium nitride film is continuously formed as a part of the barrier metal to a thickness of, e.g., about 30 nm by sputtering and CVD. Thereafter, a tungsten layer is formed by CVD so as to fill up the contact hole openings. Plugs 70, and an anode contact plug 11 for the SBD portion are formed by removing the unneeded portions of the tungsten layer by CMP. Further, an aluminum-based wiring layer M1 serving as a first-layer wiring is formed as a film by sputtering. The aluminum-based wiring layer M1 is patterned by typical lithography. Thereafter, the resist pattern which is no more needed is removed.

Figure 76:
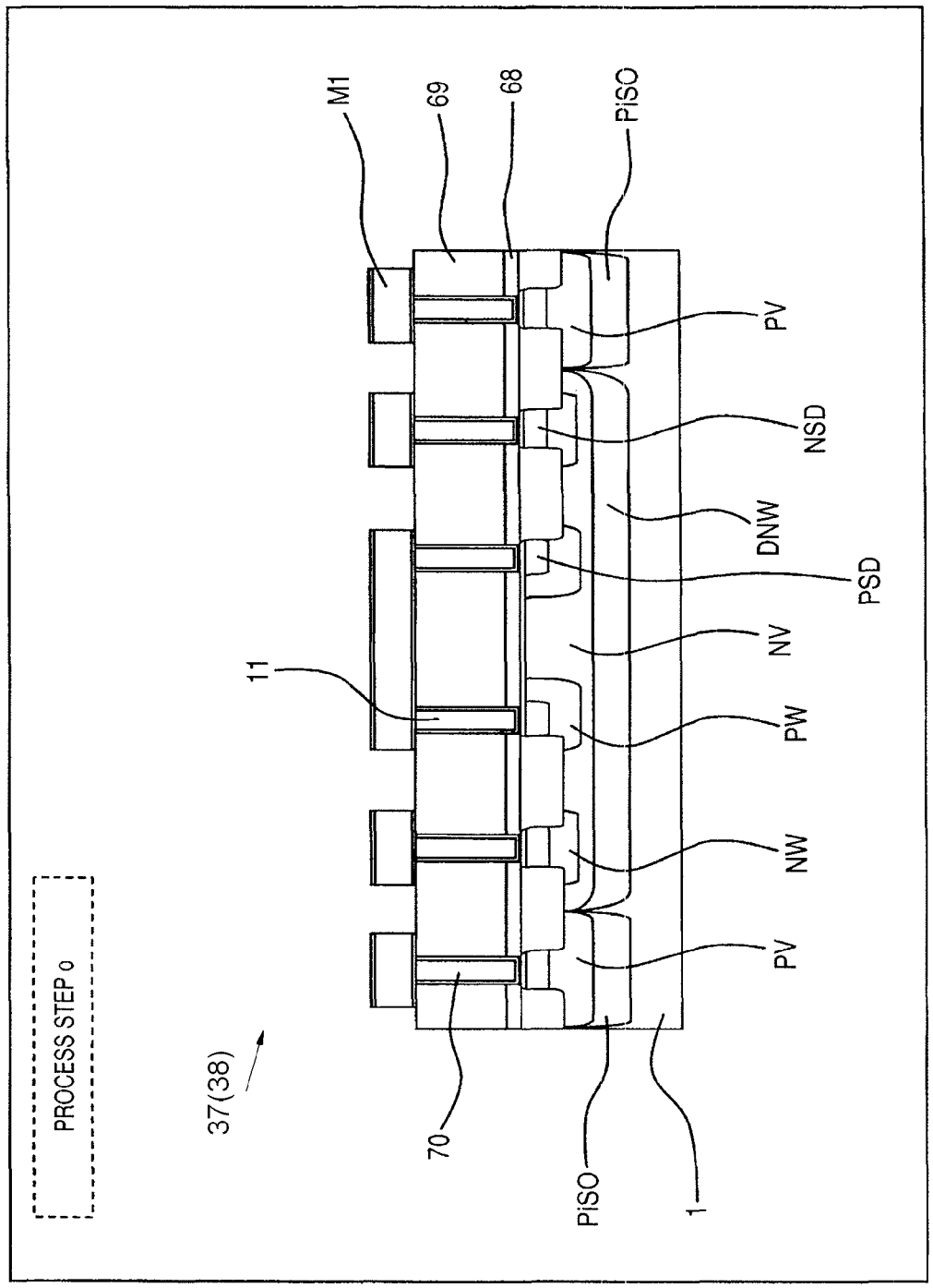
FIG. 76 is a device cross-sectional view (process step o) illustrating the process flow in the method of manufacturing the semiconductor integrated circuit device according to the embodiment of the present invention which is related to the SBD portion (device structure 2)
Figure 86:
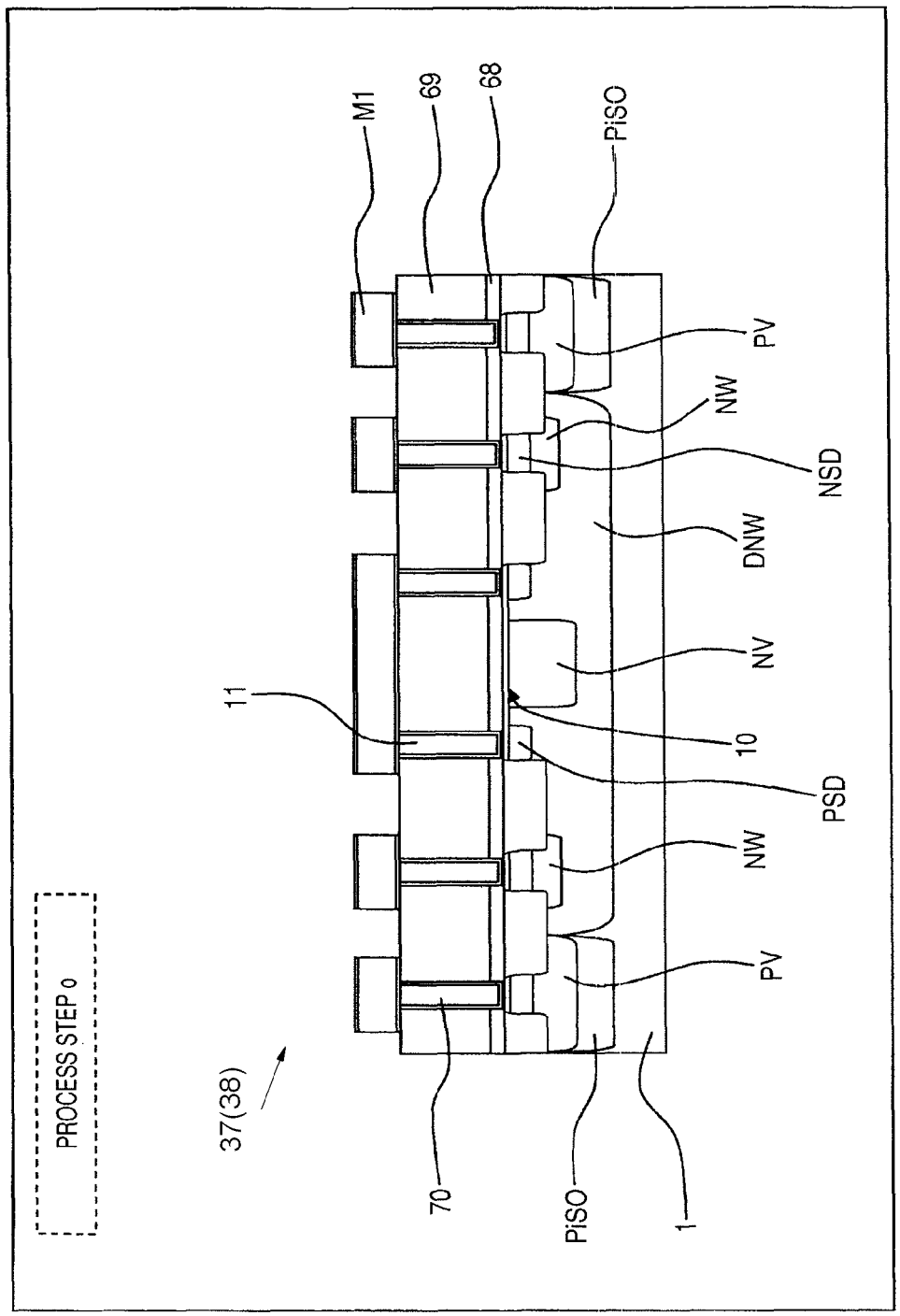
FIG. 86 is a device cross-sectional view (process step o) illustrating the process flow in the method of manufacturing the semiconductor integrated circuit device according to the embodiment of the present invention which is related to the SBD portion (device structure 3)

The respective SBD portions (device structures 2 and 3) shown in FIGS. 76 and 86 are the same as the SBD portion (device structure 1) so that the description thereof will not be repeated.

(15) Step p (Lower-Layer Wiring)

Figure 36:
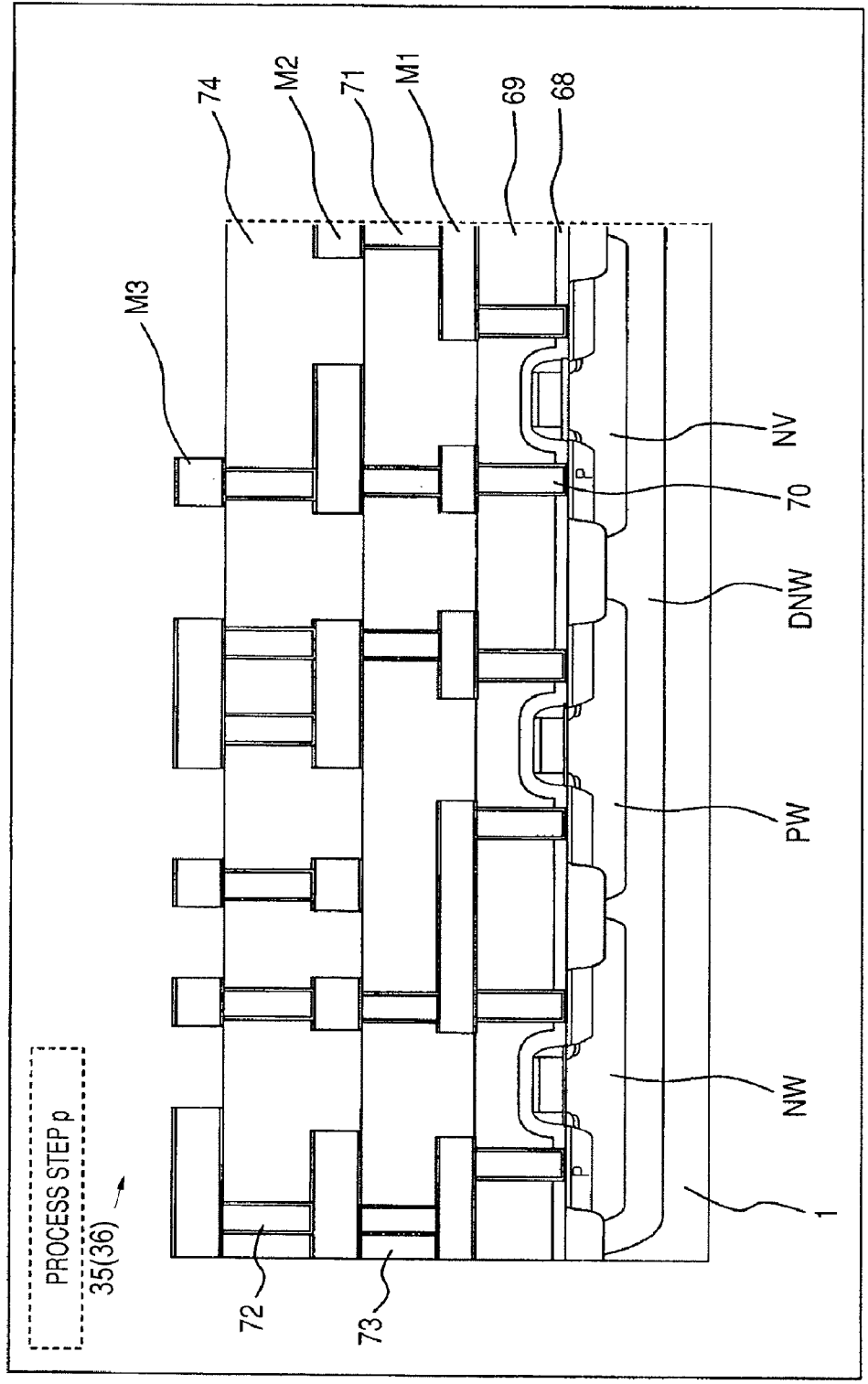
FIG. 36 is a device cross-sectional view (process step P) illustrating the process flow in the method of manufacturing the semiconductor integrated circuit device according to the embodiment of the present invention which is related to the low-breakdown-voltage portion and the intermediate-breakdown-voltage portion.

FIG. 36 is a device cross-sectional view (process step p) illustrating the process flow in the method of manufacturing the semiconductor integrated circuit device according to the embodiment of the present invention which is related to the low-breakdown-voltage portion and the intermediate-breakdown-voltage portion.

As shown in FIG. 36, an interlayer insulating film 73 (with a final thickness of about 500 nm) is deposited, and planarized appropriately to form tungsten plugs 71 and a second-layer wiring M2 in the same manner as described previously. The structure and main thickness of the second-layer wiring M2 are substantially the same as those of the first-layer wiring M1, but the thickness of an aluminum alloy layer is about 350 nm. Thereafter, an interlayer insulating film 74 (with a final thickness of about 500 nm) is deposited in exactly the same manner as the interlayer insulating film 73, and planarized appropriately to form tungsten plugs 72 and a third-layer wiring M3 in the same manner as described previously.

Figure 50:
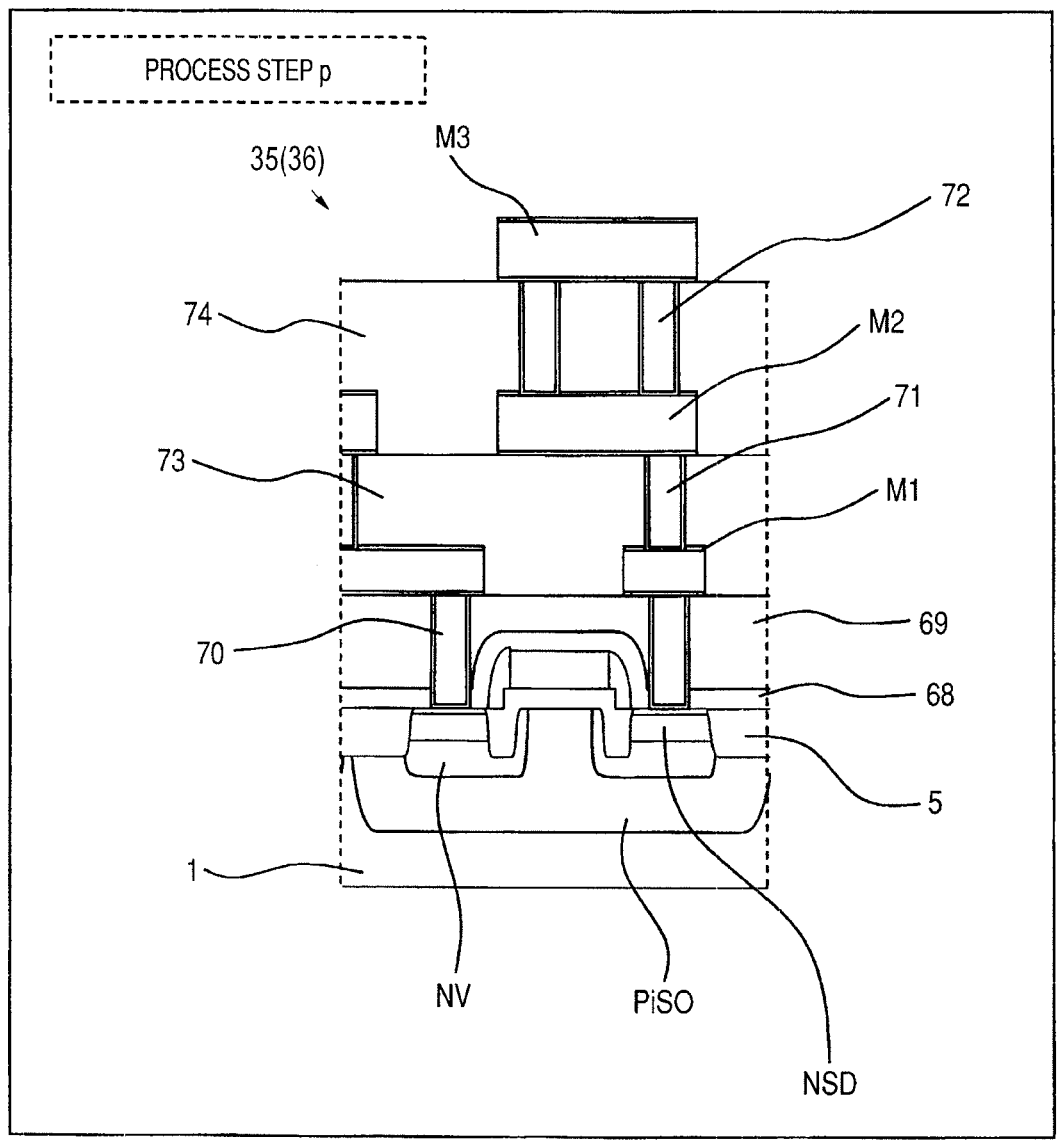
FIG. 50 is a device cross-sectional view (process step p) illustrating the process flow in the method of manufacturing the semiconductor integrated circuit device according to the embodiment of the present invention which is related to the high-breakdown-voltage portion.

Next, the high-breakdown-voltage portion will be described. FIG. 50 is a device cross-sectional view (process step p) illustrating the process flow in the method of manufacturing the semiconductor integrated circuit device according to the embodiment of the present invention which is related to the high-breakdown-voltage portion.

As shown in FIG. 50, at the same time as the aluminum-based wiring layers M2 and M3 are formed for the low-breakdown-voltage portion and the intermediate-breakdown-voltage portion, the aluminum-based wiring layers M2 and M3 are formed also for the high-breakdown-voltage portion.

As for the subsequent process performed with respect to each of the SBD portions (device structures 1 to 3), it is basically the same as the process performed with respect to each of the CMOS FET portions with varying breakdown voltages so that the description thereof will not be repeated.

(16) Step q (Upper-Layer Wiring)

Figure 37:
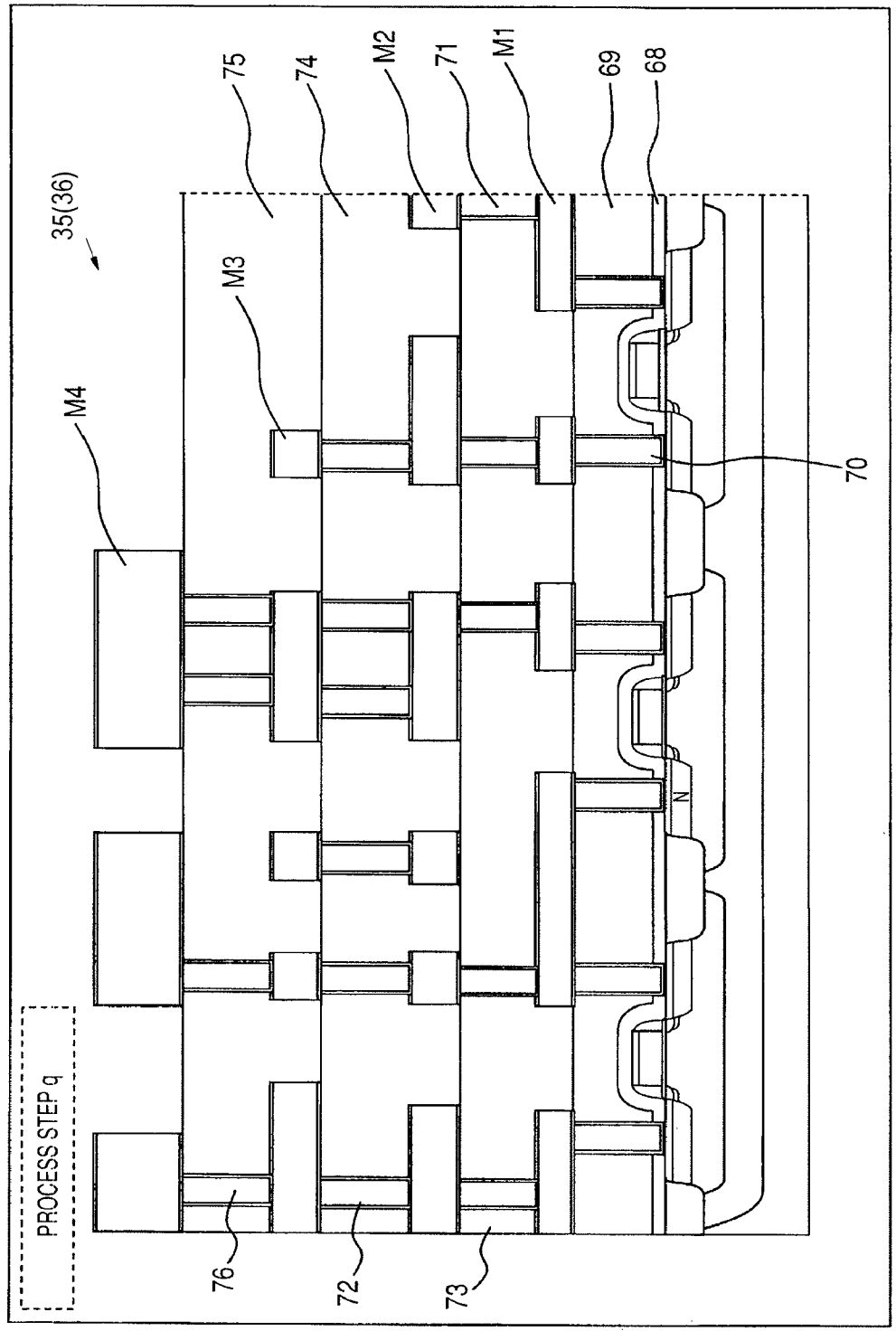
FIG. 37 is a device cross-sectional view (process step q) illustrating the process flow in the method of manufacturing the semiconductor integrated circuit device according to the embodiment of the present invention which is related to the low-breakdown-voltage portion and the intermediate-breakdown-voltage portion.

FIG. 37 is a device cross-sectional view (process step q) illustrating the process flow in the method of manufacturing the semiconductor integrated circuit device according to the embodiment of the present invention which is related to the low-breakdown-voltage portion and the intermediate-breakdown-voltage portion.

As shown in FIG. 37, an interlayer insulating film 75 (with a final thickness of about 500 nm) is deposited, and planarized appropriately to form tungsten plugs 76 and a fourth-layer wiring M4 (a multilayer structure made of aluminum-alloy/ TiN containing, e.g., Ti/TiN/Al deposited upwardly in this order as main components, and copper or another additive in a proportion of not more than several percents, in which the thicknesses of the individual layers are, e.g., 10 nm/30 nm/1000 nm/70 nm) in the same manner as described previously.

Figure 51:
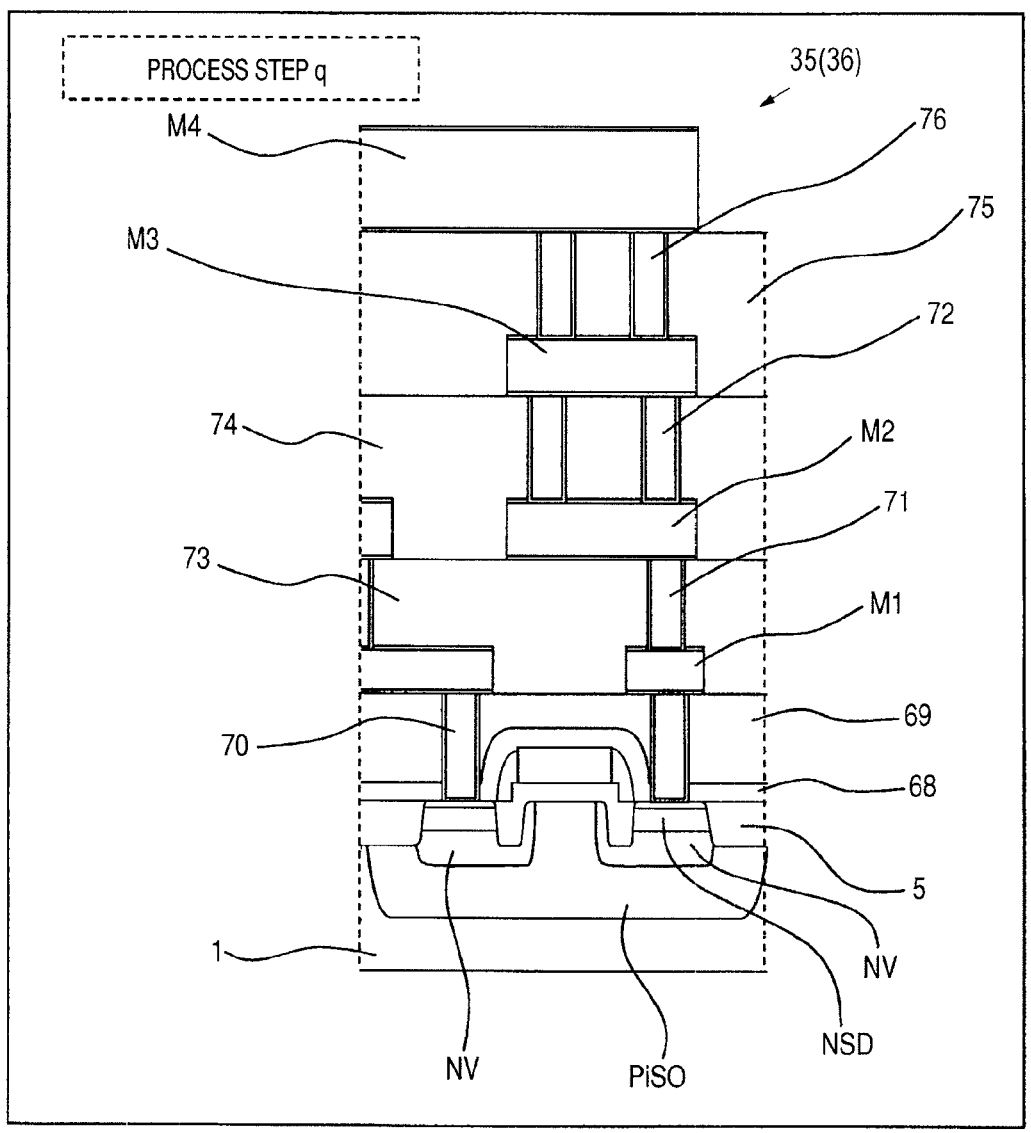
FIG. 51 is a device cross-sectional view (process step q) illustrating the process flow in the method of manufacturing the semiconductor integrated circuit device according to the embodiment of the present invention which is related to the high-breakdown-voltage portion.

Next, the high-breakdown-voltage portion will be described. FIG. 51 is a device cross-sectional view (process step q) illustrating the process flow in the method of manufacturing the semiconductor integrated circuit device according to the embodiment of the present invention which is related to the high-breakdown-voltage portion.

As shown in FIG. 51, at the same time as the formation of the aluminum-based wiring layer M4 for each of the low-breakdown-voltage portion and the intermediate-breakdown-voltage portion, the aluminum-based wiring layer M4 is formed also for the high-breakdown-voltage portion.

(17) Step r (Formation of Bump Pads)

Figure 38:
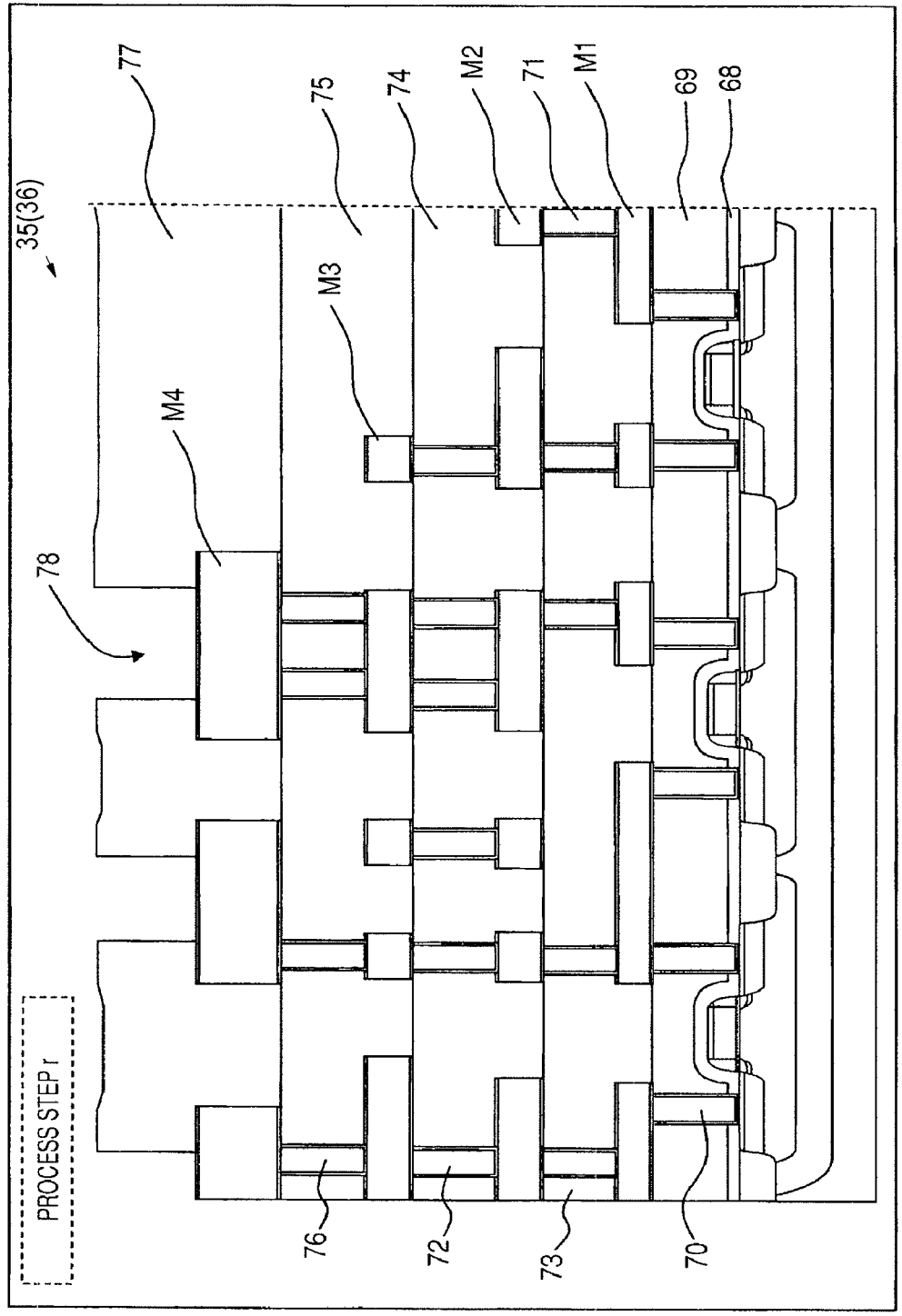
FIG. 38 is a device cross-sectional view (process step r) illustrating the process flow in the method of manufacturing the semiconductor integrated circuit device according to the embodiment of the present invention which is related to the low-breakdown-voltage portion and the intermediate-breakdown-voltage portion.

FIG. 38 is a device cross-sectional view (process step r) illustrating the process flow in the method of manufacturing the semiconductor integrated circuit device according to the embodiment of the present invention which is related to the low-breakdown-voltage portion and the intermediate-breakdown-voltage portion.

As shown in FIG. 38, a final passivation film 77 is deposited. Finally, bump pad openings 78 are formed. The upper layer TiN film of the fourth-layer wiring M4 which is exposed in the openings is removed as necessary.

Figure 52:
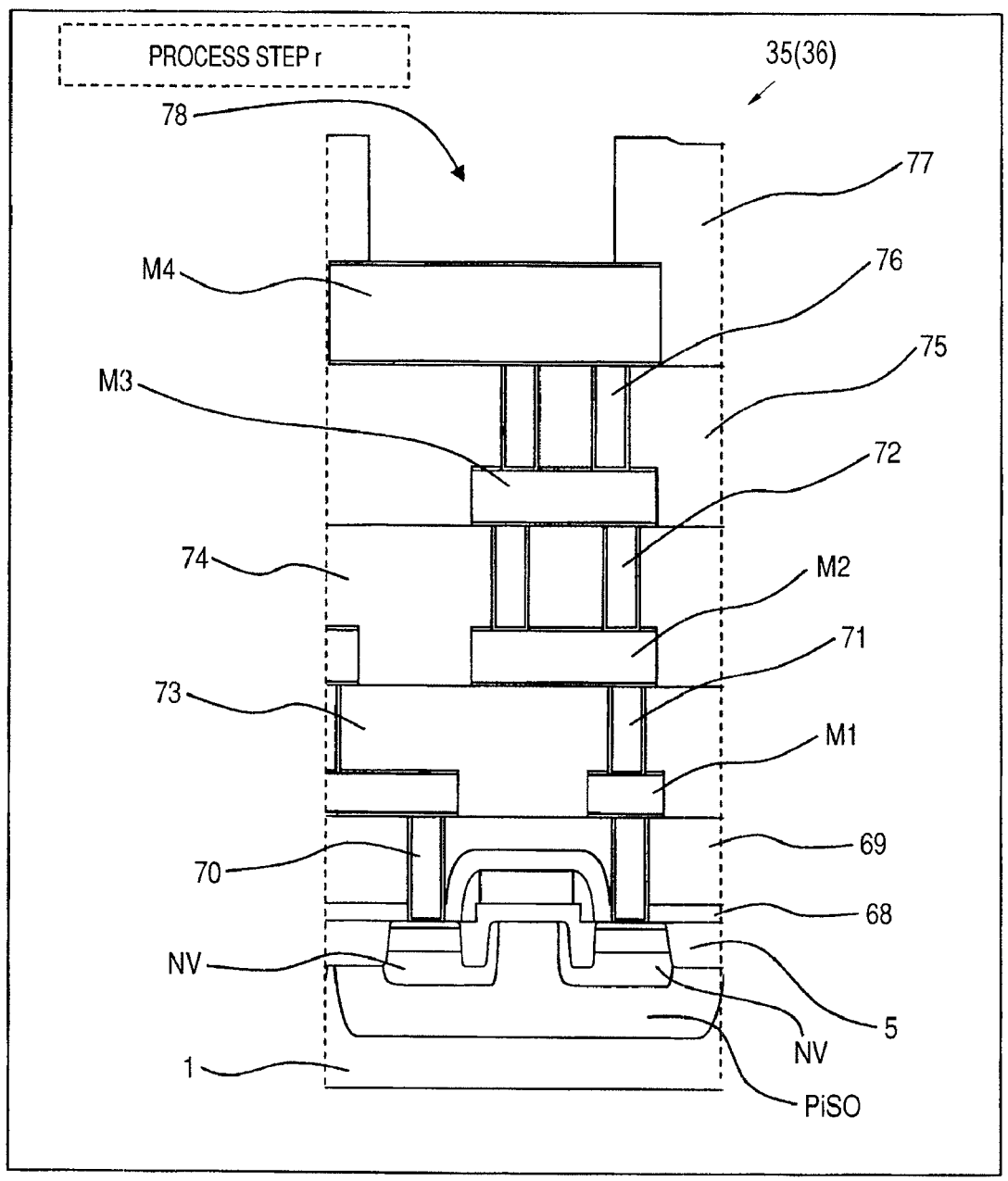
FIG. 52 is a device cross-sectional view (process step r) illustrating the process flow in the method of manufacturing the semiconductor integrated circuit device according to the embodiment of the present invention which is related to the high-breakdown-voltage portion.

Next, the high-breakdown-voltage portion will be described. FIG. 52 is a device cross-sectional view (process step r) illustrating the process flow in the method of manufacturing the semiconductor integrated circuit device according to the embodiment of the present invention which is related to the high-breakdown-voltage portion.

As shown in FIG. 52, the deposition of the final passivation film 77, and the formation of the bump pad openings 78 are also performed for the high-breakdown-voltage portion. Thereafter, bump electrodes made of a conductive film of gold or the like are formed over the fourth-layer wiring M4 in the bump pad openings 78, though they are not particularly depicted.

5. Summary

Although the invention achieved by the present inventors has thus been described specifically based on the embodiments thereof, the present invention is not limited thereto. It will be understood that various changes and modifications can be made in the invention without departing from the gist thereof.

For example, in the foregoing embodiments, the description has been centered around the specific example in which the Schottky junction is formed between the N-type surface of the P-type silicon-based substrate (or another substrate such as an epitaxial substrate or a SOI substrate) and a metal silicide (also including a metal and an alloy). However, it will be easily appreciated that the invention disclosed in the present invention is not limited thereto, and is also applicable to a structure in which the P-type conductivity and the N-type conductivity are interchanged (it is generally considered that imparting the N-type conductivity to the semiconductor side provides more excellent electric characteristics). The semiconductor integrated circuit device may also be formed on an N-type silicon-based substrate or another semiconductor substrate (including a substrate semiconductor layer over an insulating film substrate), not on the P-type silicon-based substrate.

In the embodiment described above, the process and the device each using the cobalt silicide have been described specifically. However, it will be easily appreciated that the present invention is not limited thereto, and is also applicable to a process and a device each using nickel silicide, titanium silicide, or another silicide.

What is claimed is:

1. A semiconductor integrated circuit device comprising:
   (a) a semiconductor substrate having a first principal surface and a second principal surface;
   (b) a CMOS integrated circuit portion provided in a first region of the first principal surface of the semiconductor substrate; and
   (c) a Schottky barrier diode portion provided in a second region of the first principal surface of the semiconductor substrate,
   wherein the Schottky barrier diode portion comprises:
   (c1) a first N-type semiconductor region provided in the first principal surface in the second region;
   (c2) a first field insulating film region having an opening and provided in the first principal surface in the first N-type semiconductor region;
   (c3) a P-type guard ring region provided in the first principal surface in the opening of the first field insulating film region so as to be in contact with and along an inner periphery of the first field insulating film region;
   (c4) a Schottky junction cathode portion in which the first N-type semiconductor region is exposed at the first principal surface within the P-type guard ring region;
   (c5) a silicide film provided over the first principal surface over the opening of the first field insulating film region; and
   (c6) an anode contact electrode provided over the silicide film over the opening of the first field insulating film region,
   wherein the anode contact electrode is provided primarily over the P-type guard ring region, and
   wherein the first principal surface of an outer peripheral portion of the first field insulating film region is such that the first N-type semiconductor region of the Schottky barrier diode portion is electrically isolated from the CMOS integrated circuit portion by a ring-shaped P-type isolation region.

2. A semiconductor integrated circuit device according to claim 1, wherein the first principal surface of the outer peripheral portion of the first field insulating film region is surrounded by a ring-shaped P-type isolation contact region having a concentration higher than that of the P-type isolation region.

3. A semiconductor integrated circuit device according to claim 1, wherein the anode contact electrode is not provided over the Schottky junction cathode portion.

4. A semiconductor integrated circuit device according to claim 1, wherein the P-type guard ring region has an entire outer peripheral portion thereof in contact with the inner periphery of the first field insulating film region.

5. A semiconductor integrated circuit device according to claim 1, wherein the anode contact electrode is divided into a dotted configuration to form an anode contact electrode row.

6. A semiconductor integrated circuit device according to claim 1, wherein the anode contact electrode is formed immediately after an upper surface of the silicide film is sputter etched.

7. A semiconductor integrated circuit device according to claim 1, wherein the anode contact electrode is divided into a dotted configuration to form an anode contact electrode row, and a distance between the anode contact electrode row and an inner periphery of the P-type guard ring region is set larger than a distance between the anode contact electrode row and an outer periphery of the P-type guard ring region.

8. A semiconductor integrated circuit device according to claim 1, wherein the semiconductor substrate is a P-type silicon-based substrate.

9. A semiconductor integrated circuit device according to claim 1, wherein an N-type cathode contact region having a concentration higher than that of the first N-type semiconductor region is provided in an opening different from the opening of the first field insulating film region.

10. A semiconductor integrated circuit device according to claim 1, wherein a thickness of the silicide film at a portion where the anode contact electrode is not provided ranges from 20 nm to 30 nm.

11. A semiconductor integrated circuit device according to claim 1, which is an LCD driver.

* * * * *